(12) United States Patent
Ishibashi

(10) Patent No.: US 11,837,477 B2
(45) Date of Patent: Dec. 5, 2023

(54) WASHING DEVICE AND WASHING METHOD

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

(\*) Notice: Subject to any disclaimer, the term of this patent is extended or adjusted under 35 U.S.C. 154(b) by 0 days.

(21) Appl. No.: 17/325,037

(22) Filed: May 19, 2021

(65) Prior Publication Data

US 2021/0272820 A1    Sep. 2, 2021

Related U.S. Application Data

(60) Continuation of application No. 16/189,896, filed on Nov. 13, 2018, now Pat. No. 11,164,758, which is a division of application No. 14/675,567, filed on Mar. 31, 2015, now Pat. No. 10,170,344.

(30) Foreign Application Priority Data

Apr. 1, 2014   (JP) .................................. 2014-075712
Mar. 4, 2015   (JP) .................................. 2015-042868

(51) Int. Cl.
H01L 21/67     (2006.01)
B08B 1/00      (2006.01)
B08B 3/02      (2006.01)

(52) U.S. Cl.
CPC ........ *H01L 21/67051* (2013.01); *B08B 1/006* (2013.01); *B08B 3/024* (2013.01); *H01L 21/67046* (2013.01)

(58) Field of Classification Search
None
See application file for complete search history.

(56) References Cited

U.S. PATENT DOCUMENTS

| 4,027,686 | A | 6/1977 | Shortes et al. |
|---|---|---|---|
| 6,106,635 | A | 8/2000 | Hamada et al. |
| 6,643,882 | B1 | 11/2003 | Sotozaki et al. |
| 2002/0007840 | A1 | 1/2002 | Atoh |
| 2002/0029789 | A1 | 3/2002 | Egashira et al. |

(Continued)

FOREIGN PATENT DOCUMENTS

| CN | 1267904 A | 9/2000 |
|---|---|---|
| CN | 1577760 A | 2/2005 |

(Continued)

OTHER PUBLICATIONS

Google Patents translation of CN 101877305 (Year: 2022).*

(Continued)

*Primary Examiner* — Eric W Golightly
(74) *Attorney, Agent, or Firm* — BakerHostetler

(57) ABSTRACT

A substrate washing device includes a roll washing member, a single tube nozzle and spray nozzle. The roll washing member linearly extends over the entire length of the diameter of the substrate and comes into slide-contact with the surface of the substrate. The single tube nozzle discharges washing liquid onto a roll winding side of the roll washing member so that the first washing liquid lands in the front center of the substrate. The spray nozzle sprays a second washing liquid in a fan shape toward a second area when the roll winding side area is divided into two areas.

4 Claims, 41 Drawing Sheets

(56) References Cited

U.S. PATENT DOCUMENTS

| | | |
|---|---|---|
| 2003/0015216 A1 | 1/2003 | Nicolosi et al. |
| 2003/0079764 A1 | 5/2003 | Hirose et al. |
| 2003/0098040 A1 | 5/2003 | Nam et al. |
| 2003/0178047 A1 | 9/2003 | Hirae |
| 2003/0192570 A1 | 10/2003 | Thakur et al. |
| 2004/0053508 A1 | 3/2004 | Yamasaki et al. |
| 2005/0158671 A1 | 7/2005 | Shimizu et al. |
| 2005/0252526 A1 | 11/2005 | Ogawa et al. |
| 2007/0044823 A1 | 3/2007 | Yamamoto et al. |
| 2007/0137672 A1 | 6/2007 | Sasaki et al. |
| 2007/0175501 A1 | 8/2007 | Amai et al. |
| 2007/0226925 A1 | 10/2007 | Hiraoka et al. |
| 2008/0006302 A1 | 1/2008 | Araki et al. |
| 2008/0173327 A1 | 7/2008 | Miyagi |
| 2008/0178917 A1 | 7/2008 | Miyagi et al. |
| 2008/0200100 A1 | 8/2008 | Takahashi et al. |
| 2008/0251101 A1 | 10/2008 | Ohno et al. |
| 2008/0251107 A1 | 10/2008 | Osada et al. |
| 2009/0084409 A1 | 4/2009 | Okura et al. |
| 2010/0136884 A1 | 6/2010 | Oh et al. |
| 2011/0048471 A1 | 3/2011 | Kikuchi |
| 2012/0284936 A1 | 11/2012 | Liu et al. |
| 2012/0325274 A1 | 12/2012 | Kai et al. |
| 2013/0152971 A1 | 6/2013 | Kato |
| 2013/0255728 A1 | 10/2013 | Noh |
| 2013/0312790 A1* | 11/2013 | Ishibashi ............ H01L 21/0265 134/6 |
| 2014/0041685 A1 | 2/2014 | Kaneko et al. |
| 2014/0182634 A1 | 7/2014 | Ishibashi |

FOREIGN PATENT DOCUMENTS

| | | | |
|---|---|---|---|
| CN | 1622281 A | 6/2005 | |
| CN | 1697138 A | 11/2005 | |
| CN | 1947227 A * | 4/2007 | ............ B08B 3/02 |
| CN | 1965395 A | 5/2007 | |
| CN | 101045230 A | 10/2007 | |
| CN | 101101858 A | 1/2008 | |
| CN | 101161355 A | 4/2008 | |
| CN | 101207015 A | 6/2008 | |
| CN | 101236890 A | 8/2008 | |
| CN | 101745865 A | 6/2010 | |
| CN | 101877305 A | 11/2010 | |
| CN | 102013389 A | 4/2011 | |
| CN | 102319686 A | 1/2012 | |
| CN | 202275804 U | 6/2012 | |
| CN | 102773240 A | 11/2012 | |
| CN | 102842522 A | 12/2012 | |
| CN | 103165495 A | 6/2013 | |
| CN | 103357607 A | 10/2013 | |
| CN | 103418558 A | 12/2013 | |
| CN | 103567169 A | 2/2014 | |
| CN | 103687265 A | 3/2014 | |
| EP | 1739730 A1 | 1/2007 | |
| JP | H 04-287922 A | 10/1992 | |
| JP | H08-150380 A | 6/1996 | |
| JP | H09-148295 A | 6/1997 | |
| JP | H10-163144 A | 6/1998 | |
| JP | 11-047665 A | 2/1999 | |
| JP | H11-102885 A | 4/1999 | |
| JP | 2000-084811 A | 3/2000 | |
| JP | 2001-007069 A | 1/2001 | |
| JP | 2001-054765 A | 2/2001 | |
| JP | 2001-203182 A | 7/2001 | |
| JP | 2001-319912 A | 11/2001 | |
| JP | 2002-151455 A | 5/2002 | |
| JP | 2002-313772 A | 10/2002 | |
| JP | 2003-092283 A | 3/2003 | |
| JP | 2003-109936 A | 4/2003 | |
| JP | 2003-203892 A | 7/2003 | |
| JP | 2003-275696 A | 9/2003 | |
| JP | 2004-335671 A | 11/2004 | |
| JP | 2005-221929 A | 8/2005 | |
| JP | 2005-223149 A | 8/2005 | |
| JP | 2006-269517 A | 10/2006 | |
| JP | 2006-278957 A | 10/2006 | |
| JP | 2007-173277 A | 7/2007 | |
| JP | 2007-194367 A | 8/2007 | |
| JP | 2008-177541 A | 7/2008 | |
| JP | 2008-311481 A | 12/2008 | |
| JP | 2010-040943 A | 2/2010 | |
| JP | 2011-066322 A | 3/2011 | |
| JP | 2013-162044 A | 8/2013 | |
| JP | 2013-207303 A | 10/2013 | |
| JP | 2014-003273 A | 1/2014 | |
| KR | 2003-0036087 A | 5/2003 | |
| KR | 2007-0026056 A | 3/2007 | |
| KR | 2008-0012626 A | 2/2008 | |
| TW | 513760 B | 12/2002 | |
| TW | 201424936 A | 7/2014 | |

OTHER PUBLICATIONS

Singapore Patent Application No. 10201502035R; Written Opinion Search Report; dated Nov. 2, 2017; 11 pages.

Japan Patent Application No. 2015-042868; Reasons for Refusal; dated Sep. 11, 2018; 9 pages.

China Patent Application No. 201510151490.X; Office Action; dated Jun. 21, 2018; 22 pages.

Japan Patent Application No. 2015-042868; Reasons for Refusal; dated Mar. 26, 2019; 13 pages.

Japan Patent Application No. 2018-206420; Notice of Reasons for Refusal; dated Jul. 30, 2019; 10 pages.

China Patent Application No. 201510151490.X; Office Action; dated Sep. 7, 2019; 32 pages.

Japan Patent Application No. 2018-206420; Notice of Reasons for Refusal; dated Mar. 31, 2020; 8 pages.

Miyachi et al.; "Particle Analysis and Cleaning Efficiency in Spray Cleaning—Comparison between Two-Fluid Spray and High Pressure Metro Jet (HPMJ) in Their Cleaning Efficiency"; Asahi Sunac Corporation; 2008; p. 199-200 (contains English Translation).

China Patent Application No. 201811309797.8; Office Action; dated Jan. 22, 2021; 13 pages.

Korean Patent Application No. 10-2015-0045204; Reason for Refusal; dated Feb. 22, 2021; 13 pages.

* cited by examiner

WASHING DEVICE AND WASHING METHOD

CROSS-REFERENCE TO RELATED APPLICATIONS

This application is a continuation of U.S. application Ser. No. 16/189,896 filed Nov. 13, 2018, and issued as U.S. Pat. No. 11,164,758 on Nov. 2, 2021 which is a divisional of U.S. application Ser. No. 14/675,567 filed Mar. 31, 2015, and issued as U.S. Pat. No. 10,170,344 on Jan. 1, 2019 which claims the benefit of Japanese Priority Patent Applications JP 2014-075712 filed on Apr. 1, 2014 and JP2015-042868 filed on Mar. 4, 2015, the entire contents of which are incorporated herein by reference.

FIELD

The present technique relates to a washing device and a washing method which wash a substrate, while supplying a washing liquid to a surface of the substrate such as a rotating semiconductor wafer.

BACKGROUND AND SUMMARY

In a manufacturing process of a substrate such as a semiconductor wafer, a polishing step of polishing a film of a metal or the like formed on the substrate is included, and after the polishing step, washing for removing fine particles as polishing chips is performed. For example, in a damascene wiring forming step of forming a wiring by embedding a wiring groove formed inside an insulating film of the substrate surface with metal, excess metal of the substrate surface is polished and removed by chemical mechanical polishing (CMP) after forming the damascene wiring. Since particles (defect), such as residues of the slurry (slurry residues) or metal polishing chips used in the CMP, are present on the substrate surface after the CMP, it is necessary to remove these by washing.

When the residues remain on the substrate surface due to the insufficient washing of the substrate surface, there is a problem in terms of reliability, such as an occurrence of leakage from the remaining portion of the residues on the substrate surface, or the cause of adhesion failure. Therefore, it is necessary to wash the substrate surface, from which a metal film, a barrier film, an insulating film or the like is exposed, with high washing degree. In recent years, with the miniaturization of semiconductor devices, the diameter of particles to be removed has decreased, and the request for washing has also become strict.

As a washing method after the polishing in the CMP device, washing using a roll washing member, washing using a pencil washing member, washing using a two-fluid nozzle and the like have been known. In these types of washing, the substrate is rotated about its central axis, and a chemical liquid and a rinse liquid (hereinafter, the chemical liquid and the rinse liquid are collectively referred to as a "washing liquid") are supplied to the surface (upper surface) of the substrate. Moreover, in these types of washing, after the washing (chemical liquid washing) is performed by the action of the roll washing member, the pencil washing member and the two-fluid nozzle, at least the rinse liquid is supplied as a washing liquid, and the washing (rinsing washing) performed without the action of the roll washing member, the pencil washing member and the two-fluid nozzle is performed.

As the methods of supplying the washing liquid onto the surface of the substrate, a method of discharging a washing liquid from a single tube nozzle to land on the substrate surface, a method of spraying the atomized washing liquid from the spray nozzle to land on the substrate surface, a method of discharging the washing liquid from a porous tube nozzle (bar nozzle) to land on the substrate surface and the like are known. The washing liquid supplied to the surface of the substrate receives the centrifugal force due to rotation of the substrate to flow toward the outer circumference of the substrate. In addition, the flow of the washing liquid after landing on the substrate is affected not only by the centrifugal force, but by the inertia of the flow when there is a flow in the washing liquid in a direction parallel to the surface of the substrate prior to landing on the surface of the substrate, and when the surface of the substrate is inclined, the flow of the washing liquid is affected by gravity, and a contact angle between the washing liquid and the surface of the substrate also becomes a factor that determines the flow of the washing liquid.

Regardless of the chemical liquid washing or the rinsing washing, when there is a location at which the flow of washing liquid is small or a location at which the washing liquid stagnates in a part of the substrate, particles, such as slurry residues and metal polishing chips, still remain in the portion, and the washing becomes not sufficient. Thus, it is desirable that the washing liquid uniformly flow over the entire radius of the substrate.

With the miniaturization of the recent semiconductor devices, there have been increasing demands for the washing degree of the washing device. However, in the conventional washing device, the removal of the fine particles (for example, particles of 65 nm or less) is very difficult. In particular, when the diameter of the substrate becomes 450 mm in the future from 300 mm which is currently the mainstream, such insufficient washing becomes remarkable in a part of the substrate.

The problem of having difficulty in removing the fine particles will be described by way of an example of the case where the horizontal flat substrate is rotated to perform the rinsing washing of the substrate surface. In the rinsing washing which removes the residual particles and the residual chemical liquid, when landing the rinse liquid discharged from the single tube nozzle to the vicinity of the center of the substrate by adopting a method of discharging the rinse liquid from the single tube nozzle to land on the substrate surface, although relatively high washing degree can be obtained in the vicinity of the center, particles may remain outside the vicinity of the center of the substrate. Meanwhile, when the rinse liquid discharged from the single tube nozzle is landed on the middle of the radius of the substrate, although a relatively high washing degree can be obtained at the liquid-landing position, particles remain at locations other than that position. That is, when supplying the rinse liquid using the single tube nozzle, although the rinsing washing is preferably performed at the periphery of the liquid-landing position, the rinsing effect due to liquid spread to other locations on the substrate is small.

Also, when the rinse liquid discharged from the single tube nozzle lands on the substrate surface at a high angle, if the substrate surface is a fragile surface such as a copper wiring or a low-k film, it is damaged by landing of the rinse liquid discharged from the single tube nozzle, thereby causing defects at the liquid-landing position (for example, near the center).

Meanwhile, in the method of spraying the atomized washing liquid from a spray nozzle above the substrate outside to land on the substrate surface, and in the method of discharging the rinse liquid from the porous tube nozzle (bar nozzle) to land on the substrate surface, due to the discharge by the flat rotation mechanism, the removal particle or the residual chemical liquid is discharged toward the substrate outer circumference by the centrifugal force. However, since the liquid-landing area is wide toward the outer circumference from the center, the landed rinse liquid in the liquid-landing area interferes with the movement toward the outer circumference due to the centrifugal force of the removal particles or the residual chemical liquid, and pushes them back to the inside.

Also, in the central portion, since the washing liquid quickly moves toward the outer circumference by the centrifugal force, the rinsing efficiency is lower as compared to the area in which the washing liquid spreads by rotation other than the vicinity of the center. In addition, in the area liquid-landing by the spray nozzle or the porous tube nozzle, a quantity of air with which the rinse liquid comes into contact before landing increases, the oxygen concentration of the rinse liquid (for example, ultrapure water) originally supplied into the CMP device from the factory at the low oxygen concentration (for example, 10 ppb) increases (for example, 4.0 ppm=4000 ppb), thereby oxidizing the copper on the surface of the substrate.

The above-mentioned problems may similarly occur in the chemical liquid washing, without being limited to the rinsing washing as described in the above-described example.

It is desirable to improve a washing degree by causing a washing liquid to flow over the entire radius of the substrate in a washing device which washes a substrate, while supplying the washing liquid to the surface of the substrate such as a rotating semiconductor wafer.

A washing device of one embodiment includes: a substrate rotation mechanism which holds a substrate and rotates the substrate about a central axis of the substrate as a rotary axis; and a first single tube nozzle which discharges a first washing liquid toward an upper surface of the substrate held by the substrate rotation mechanism, wherein a first single tube nozzle discharges a first washing liquid so that the first washing liquid lands in front of the center of the substrate and the landed first washing liquid flows on the upper surface of the substrate toward the center of the substrate, and the device has a configuration in which a liquid flow on the upper surface of the substrate after landing of the first washing liquid discharged from the first single tube nozzle passes through the center of the substrate.

A washing device of another aspect includes a substrate rotation mechanism which holds a substrate and rotates the substrate about a central axis of the substrate as a rotary axis, and a spray nozzle which sprays a second washing liquid in a fan shape toward an upper surface of the substrate held by the substrate rotation mechanism, wherein the device has a configuration in which a maximum spraying quantity direction in which an spraying quantity is maximized in the spray nozzle is shifted close to the center of the substrate from the spray center.

A washing device of still another aspect includes a substrate rotation mechanism which holds a substrate and rotates the substrate about a central axis of the substrate as a rotary axis; a first single tube nozzle which discharges a first washing liquid toward an upper surface of the substrate held by the substrate rotation mechanism; and a spray nozzle which sprays a second washing liquid toward the upper surface of the substrate held by the substrate rotation mechanism, wherein the device has a configuration in which discharging of the first washing liquid by the first single tube nozzle and spraying of the second washing liquid by the spray nozzle are simultaneously performed.

A washing method of one embodiment is a washing method of rotating a substrate about a central axis of the substrate as a rotary axis and discharging a first washing liquid toward an upper surface of the substrate, wherein the method has a configuration in which the first washing liquid lands in front of the substrate, and the liquid flow on the upper surface of the substrate after landing passes through the center of the substrate.

DETAILED DESCRIPTION OF NON-LIMITING EXAMPLE EMBODIMENTS

Figure 1:
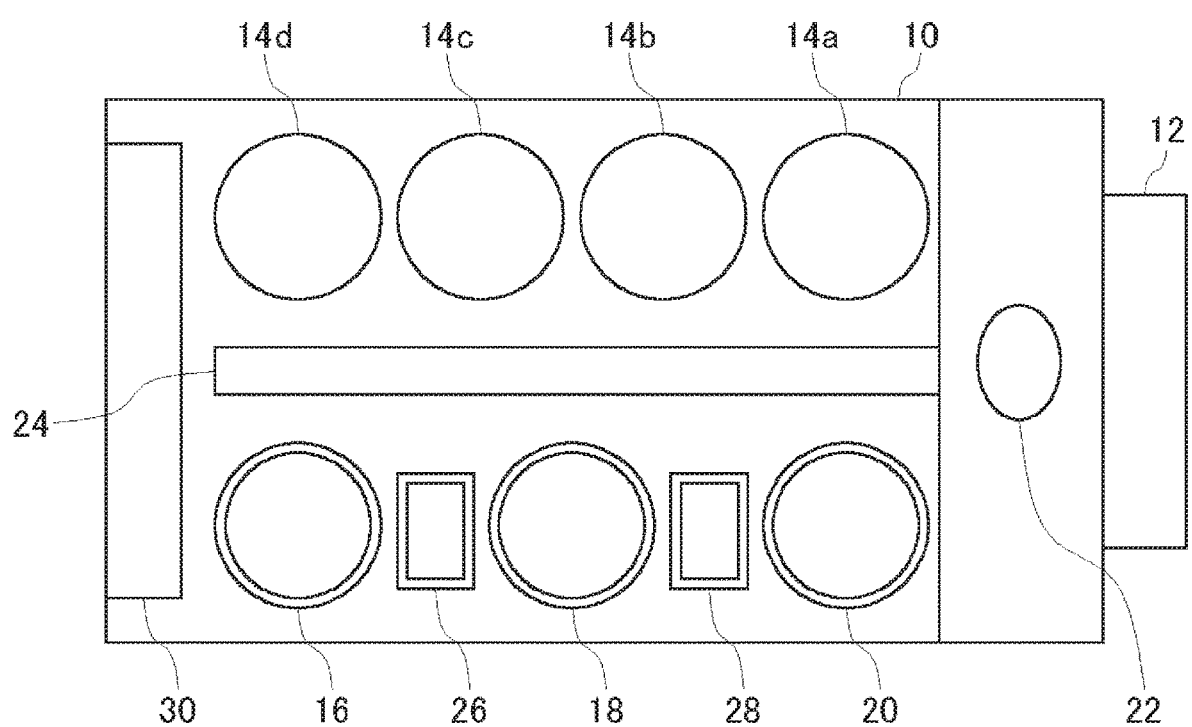
FIG. 1 is a plan view illustrating an overall configuration of a substrate processing apparatus equipped with a washing device in an embodiment.

A washing device of an embodiment will be described below. Embodiments described below merely illustrate examples of a case of carrying out the present technique and is not intended to limit the present technique to a specific configuration which will be described below. In carrying out the present technique, a specific configuration according to the embodiments may be appropriately employed.

A washing device of one embodiment includes: a substrate rotation mechanism which holds a substrate and rotates the substrate about a central axis of the substrate as a rotary axis; and a first single tube nozzle which discharges a first washing liquid toward an upper surface of the substrate held by the substrate rotation mechanism, wherein a first single tube nozzle discharges a first washing liquid so that the first washing liquid lands in front of the center of the substrate and the landed first washing liquid flows on the upper surface of the substrate toward the center of the substrate, and the device has a configuration in which a liquid flow on the upper surface of the substrate after landing of the first washing liquid discharged from the first single tube nozzle passes through the center of the substrate. With this configuration, in the central portion of the substrate, the washing liquid flows by the inertial force of flow of the washing liquid discharged from the first single tube nozzle in the horizontal direction to the substrate, and the washing liquid flows toward the outer circumference of the substrate by a centrifugal force due to rotation of the substrate on the outer side of the central portion of the substrate. Thus, it is possible to allow the washing liquid to flow over the entire radius of the substrate.

In the above-described washing device, an incident angle of a discharge direction of the first single tube nozzle with respect to the upper surface of the substrate may be 450 or less. With this configuration, it is possible to sufficiently obtain the inertial force of the flow of the washing liquid discharged from the first single tube nozzle in the horizontal direction to the substrate.

In the above-described washing device, a distance from a liquid-landing position of the first washing liquid to the substrate to the center of the substrate may be smaller than one-third of a radius of the substrate. With this configuration, it is possible to allow the liquid flow on the upper surface of the substrate after liquid-landing to reliably pass through the center of the substrate.

The above-described washing device may further include a spray nozzle which sprays a second washing liquid toward the upper surface of the substrate held by the substrate rotation mechanism, and the discharging of the first washing liquid by the first single tube nozzle and the spraying of the second washing liquid by the spray nozzle may be performed simultaneously. With this configuration, it is possible to allow the washing liquid to more reliably flow over the entire radius of the substrate.

In the above-described washing device, the liquid-landing position of the second washing liquid may be on an upstream side of a rotational direction of the substrate from the liquid-landing position of the first washing liquid. With this configuration, the liquid-landing position of the washing liquid by the spray nozzle is located on the downstream of the first washing liquid which passed through the center of the substrate, the first washing liquid is discharged from the outer circumference of the substrate by the centrifugal force, and at a position at which the first washing liquid decreases, it is possible to supply the second washing liquid by the spray nozzle.

In the above-described washing device, a maximum spraying quantity direction in which a spraying quantity in the spray nozzle is maximized may be shifted closer to the center of the substrate from the spray center. With this configuration, it is possible to supply much more second washing liquid to the vicinity of the center of the substrate by the spray nozzle.

In the above-described washing device, the spray nozzle may spray the second washing liquid over substantially the entire length of the radius of the substrate, and the maximum spraying quantity direction may be directed toward the center of the substrate or the vicinity of the center. With this configuration, the flow of the second washing liquid toward the center the substrate due to spraying collides with the flow of the second washing liquid in the central portion of the substrate toward the outer circumference of the substrate due to the centrifugal force. Thus, stagnation of the second washing liquid in the central portion of the substrate is prevented or reduced, and the second washing liquid flows toward the outer circumference from the center of the substrate.

The above-described washing device may further include a second single tube nozzle which discharges a third washing liquid toward the upper surface of the substrate held by the substrate rotation mechanism, wherein the second single tube nozzle may discharge the third washing liquid so that the third washing liquid lands beyond the center of the substrate and flows toward the outer circumference of the substrate from the liquid-landing position, a distance from the liquid-landing position of the third washing liquid to the center of the substrate may be greater than a distance from the liquid-landing position of the first washing liquid to the center of the substrate, and the liquid-landing position of the third washing liquid may be located on the downstream side in the rotational direction of the substrate from the liquid-landing position of the first washing liquid. With this configuration, it is possible to supply the third washing liquid onto the substrate by the second single tube nozzle so as not to interfere with the flow of the first washing liquid on the surface of the substrate.

The above-described washing device may further include a roll washing member which linearly extends over substantially the entire length of the diameter of the substrate and comes into slide-contact with the upper surface of the substrate, while rotating about a central axis parallel to the substrate, and the first single tube nozzle may land the first washing liquid against the roll winding side area of the roll washing member. With this configuration, it is possible to allow the washing liquid required for the roll washing to flow over the entire radius of the substrate.

In the above-described washing device, an angle formed between a discharge direction of the first single tube nozzle and an extension direction of the roll washing member may be 90°±300 in a plan view. With this configuration, since the first washing liquid gets into the bottom of the roll washing member to enter the roll scraping side area and is supplied to the counter washing area by the rotation of the substrate, it is possible to improve the washing properties by the washing liquid of the counter supply area.

The above-described washing device may further include a nozzle which directly supplies a fourth washing liquid to the surface of the roll washing member located on a roll scraping side area of the roll washing member. With this configuration, since the fourth washing liquid is directly supplied to the roll washing member, the roll washing member slides with the substrate in the washing area in a state of impregnating the fourth washing liquid, and thus, it is possible to improve washing properties using the washing liquid.

The above-described washing device may further include a pencil washing member which is supported on a leading end portion of the arm, rotates about a central axis perpendicular to the substrate, and moves toward the outer circumference from the center of the substrate by the rotation of the arm, while coming into slide-contact with the upper surface of the substrate. The first single tube nozzle may land the first washing liquid on the upstream side in the rotational direction of the substrate from the movement trajectory of the pencil washing member. With this configuration, it is possible to allow the washing liquid required for the pencil washing to flow over the entire radius of the substrate.

The above-described washing device may further include a pencil washing member or a two-fluid jet nozzle which is supported on the leading end portion of the arm, and moves toward the outer circumference from the center of the substrate by the rotation of the arm, and an on-arm washing liquid supply nozzle which is provided in the arm to supply the washing liquid to the upper surface of the substrate in the vicinity of the pencil washing member or the two-fluid jet nozzle. With this configuration, it is possible to supply the fresh washing liquid to the washing location.

In the above-described washing device, the on-arm washing liquid supply nozzle may be inclined to supply the washing liquid toward the washing location of the substrate by the pencil washing member or the two-fluid jet nozzle. With this configuration, the washing liquid flows in the direction toward the washing location, and it is possible to supply the washing liquid to the washing location.

In the above-described washing device, when the pencil washing member is supported on the leading end portion of the arm, the on-arm washing liquid supply nozzle may be provided on the upstream side in the rotational direction of the substrate with respect to the pencil washing member. With this configuration, the washing liquid supplied to the upper surface of the substrate is carried by the rotation of the substrate, and is supplied to the washing location at which the substrate and the pencil washing member come into slide-contact with each other.

In the above-described washing device, when the two-fluid jet nozzle is supported at the leading end portion of the arm, the on-arm washing liquid supply nozzle may be provided on the downstream side in the rotational direction of the substrate with respect to the two-fluid jet nozzle. With this configuration, since the washing liquid supplied to the upper surface of the substrate is conveyed in a direction away from the washing location at which the jet flow from the two-fluid jet nozzle collides with the upper surface of the substrate by the rotation of the substrate, the washing liquid does not form a thick layer at the washing location, and it is possible to reduce a decrease in washing force due to the cushion effect.

In the above-described washing device, the on-arm washing liquid supply nozzle may be provided at a position closer to the center of the substrate than the washing location of the substrate by the pencil washing member or the two-fluid jet nozzle. With this configuration, the washing liquid supplied from the on-arm washing liquid supply nozzle flows toward the washing location or the vicinity of the washing location by the centrifugal force due to rotation of the substrate, then smoothly flows toward the outside in the radial direction of the substrate, and is discharged from the outer edge of the substrate.

A washing device of another aspect of the invention includes a substrate rotation mechanism which holds a substrate and rotates the substrate about a central axis of the substrate as a rotary axis, and a spray nozzle which sprays a second washing liquid in a fan shape toward an upper surface of the substrate held by the substrate rotation mechanism, wherein the device has a configuration in which a maximum spraying quantity direction in which an spraying quantity is maximized in the spray nozzle is shifted close to the center of the substrate from the spray center. With this configuration, it is possible to supply much more the second washing liquid to the vicinity of the substrate by the spray nozzle, and since the second washing liquid flows toward the outer circumference of the substrate by the centrifugal force of the substrate on the outer side of the central portion of the substrate, it is possible to allow the second washing liquid to flow to the outer circumferential portion from the central portion of the substrate.

A washing device of still another aspect includes a substrate rotation mechanism which holds a substrate and rotates the substrate about a central axis of the substrate as a rotary axis; a first single tube nozzle which discharges a first washing liquid toward an upper surface of the substrate held by the substrate rotation mechanism; and a spray nozzle which sprays a second washing liquid toward the upper surface of the substrate held by the substrate rotation mechanism, wherein the device has a configuration in which discharging of the first washing liquid by the first single tube nozzle and spraying of the second washing liquid by the spray nozzle are simultaneously performed. With this configuration, since the discharging of the washing liquid by the first single tube nozzle and the spraying of the washing liquid by the spray nozzle are simultaneously performed, it is possible to improve the fluidity of the washing liquid over the entire radius of the substrate and to achieve a high washing degree.

A washing method of one embodiment is a washing method of rotating a substrate about a central axis of the substrate as a rotary axis and discharging a first washing liquid toward an upper surface of the substrate, wherein the method has a configuration in which the first washing liquid lands in front of the substrate, and the liquid flow on the upper surface of the substrate after landing passes through the center of the substrate. With this configuration, in the central portion of the substrate, the washing liquid flows by the inertial force of flow of the washing liquid discharged from the first single tube nozzle in a direction that is horizontal to the substrate, and on the outer side of the central portion of the substrate, the washing liquid flows toward the outer circumference of the substrate by a centrifugal force due to rotation of the substrate. Accordingly, it is possible to allow the washing liquid to flow over the entire radius of the substrate.

FIG. 1 is a plan view illustrating an overall configuration of a substrate processing apparatus equipped with a washing device according to an embodiment. As illustrated in FIG. 1, the substrate processing apparatus includes an approximately spherical housing 10, and a load port 12 on which a substrate cassette configured to stock a substrate, such as a large number of semiconductor wafers, is mounted. The load port 12 is disposed adjacent to the housing 10. An open cassette, a standard manufacturing interface (SMIF) pod or a front opening unified pod (FOUP) can be mounted on the load port 12. The SMIF pod and the FOUP are air-tight containers that can maintain an environment isolated from an external space by storing the substrate cassette inside thereof and covering it with a partition.

A plurality of (four in this example) polishing units 14a to 14d, a first washing unit 16 and a second washing unit 18 which wash the polished substrate, and a drying unit 20 which dries the washed substrate are housed inside the housing 10. The polishing units 14a to 14d are arranged along a longitudinal direction of the substrate processing apparatus, and the washing units 16 and 18 and the drying unit 20 are also arranged along the longitudinal direction of the substrate processing apparatus.

A first conveying robot 22 is disposed in a region, which is surrounded by the load port 12, and the polishing unit 14a and the drying unit 20 located on the load port 12 side, and a conveying unit 24 is disposed parallel to the polishing units 14a to 14d. The first conveying robot 22 receives the substrate before polishing from the load port 12 and delivers the substrate to the conveying unit 24, and at the same time, conveys the substrate received from the drying unit 20 after drying and delivers the substrate between the polishing units 14a to 14d.

A second conveying robot 26 configured to deliver the substrate between first washing unit 16 and the second washing unit 18 is disposed between the units 16 and 18, and a third conveying unit 28 configured to deliver the substrate between second washing unit 18 and the drying unit 20 is disposed between the units 18 and 20. Furthermore, a control unit 30 is disposed inside the housing 10 to control the movement of each device of the substrate processing apparatus.

In this example, as the first washing unit 16, a roll washing device is used which brings the roll washing member linearly extending over substantially the entire length of the diameter of the substrate into contact with the substrate in the presence of the washing liquid, and scrubs and washes the substrate surface while rotating about the central axis parallel to the substrate. As the second washing unit 18, a pencil washing device is used which brings a lower end contact surface of a cylindrical pencil washing member extending in the vertical direction into contact with the substrate in the presence of the washing liquid, and moves the pencil washing member in one direction while rotating, thereby scrubbing and washing the substrate surface. Also, as the drying unit 20, a spin drying unit is used which ejects an IPA vapor from a moving spray nozzle toward the horizontally rotating substrate to dry the substrate, and rotates the substrate at a high speed to dry the substrate by the centrifugal force.

In addition, in this example, although the roll washing device is used as the first washing unit 16, as the first washing unit 16, the same pencil washing device as the second washing unit 18 may be used, or a two-fluid jet washing device which washes the substrate surface by the two-fluid jet may be used. In this example, although the pencil washing device is used as the second washing unit 18, the same roll washing device as the first washing unit 16 may be used as the second washing unit 18, or a two-fluid jet washing device which washes the substrate surface by the two-fluid jet may be used. The washing device of the embodiment is also applicable to both the first washing unit 16 and the second washing unit 18, and is also applicable to the roll washing device, the pencil washing device, and the two-fluid jet washing device.

Hereinafter, specific application examples will be described as the embodiment of the washing device. First, as the first to fourth embodiments, the application of the present technique in the rinsing washing of the first washing unit 16 or the second washing unit 18 will be described. At the time of rinsing washing, since the roll washing member of the first washing unit 16 and the pencil washing member of the second washing unit do not act, they are completely removed from the upper part of the substrate. This is because the situation is prevented in which particles and the chemical liquid adhering to a member such as the roll washing member and the pencil washing member may fall onto the substrate during rinsing washing to contaminate the substrate.

A substrate W is held by a substrate rotation mechanism (not illustrated) so that the surface faces upward. When the substrate rotation mechanism rotates while holding the substrate W, the substrate W rotates about its central axis (axis perpendicular to the surface of the substrate W through a center O) as a rotary axis.

First Embodiment

Figure 2:
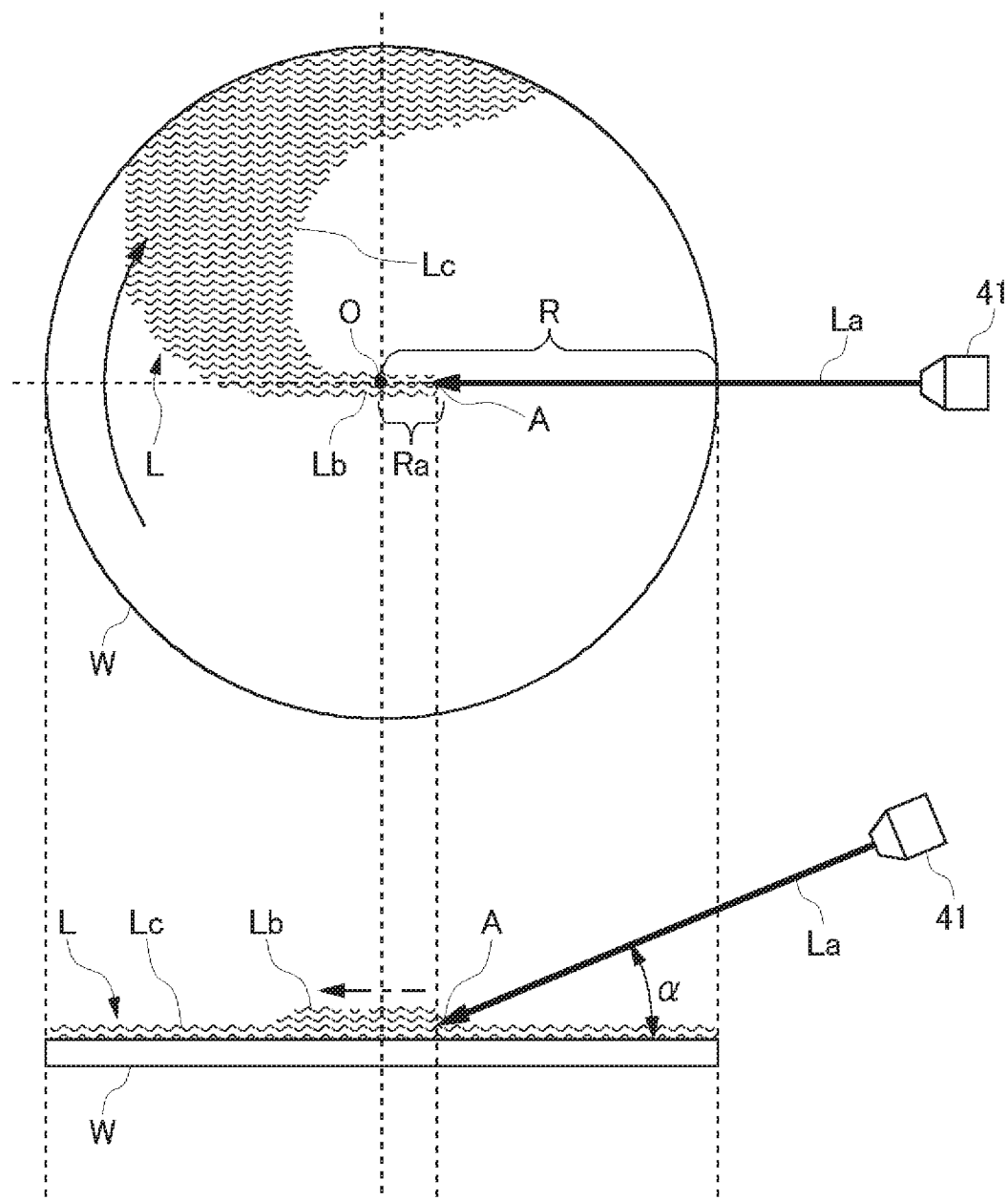
FIG. 2 is a plan and front view illustrating a positional relation between a substrate and a single tube nozzle in a washing device of a first embodiment.

FIG. 2 view (a) is a plan view illustrating the positional relation between the substrate and the single tube nozzle in the washing device of the first embodiment, and FIG. 2 view (b) is a front view of FIG. 2 view (a). FIG. 2 illustrates a washing liquid supply to the flat substrate surface by the single tube nozzle. A single tube nozzle 41 as the washing liquid supply nozzle discharges a rinse liquid L toward a surface (upper surface) of a substrate W from the outside of the upper space of the substrate W, that is, above the substrate W. That is, the single tube nozzle 41 supplies the rinse liquid L to the surface of the substrate W obliquely from the upper part. The rinse liquid L may be ultrapure water (DIW) and may be functional water such as hydrogen water.

A position, a discharge direction, a bore diameter and a flow speed of the single tube nozzle 41 are designed so that the rinse liquid L discharged from the single tube nozzle 41 satisfies the following conditions. First, as illustrated in FIG. 2 view (a), a liquid-landing position A of the rinse liquid discharged from the single tube nozzle 41 to the surface of the substrate W becomes a position away from the center O of the substrate W by a distance Ra rather than the center O of the substrate W. An orientation of the single tube nozzle 41 is determined so that the center O of the substrate W is present on a line connecting the single tube nozzle 41 with the liquid-landing position A in a plan view. That is, the single tube nozzle 41 discharges the rinse liquid L toward the center O of the substrate W in a plan view, but the liquid-landing position A is located at a front position from the center O of the substrate W by a distance Ra.

As illustrated in FIG. 2 view (b), in the front view, an angle α (incident angle) between a liquid flow La until discharging from the single tube nozzle 41 and landing on the surface of the substrate W and the surface of the substrate W is set to approximately 30°. The incident angle α is not limited to 30°, but is preferably 450 or less. In this way, since the single tube nozzle 41 supplies the rinse liquid to the surface of the substrate W obliquely from the upper part, the liquid flow La of the rinse liquid L flows along a planar direction of the substrate W, and specifically, flows in a direction toward the center O of the substrate W to land on the surface of the substrate W. Then, the rinse liquid L also flows in the direction toward the center O of the substrate W after landing, by the inertia of the flow of the liquid flow La in the direction toward the center O of the substrate W.

Since the substrate W rotates as described above, the rinse liquid L landing on the surface of the substrate W is subjected to a centrifugal force due to the rotation to flow toward the outside of the substrate W. However, as illustrated in FIG. 2, in this embodiment, since the liquid flow lands in the vicinity of the center O of the substrate W, the large centrifugal force does not act at a position close to the center O. Further, since there is already a flow directed toward the center O before landing, by the inertia, the rinse liquid L forms a liquid bundle (liquid line) Lb which linearly advances in the direction that matches the supply direction of the single tube nozzle 41 in a plan view, and flows through the surface of the substrate W. As a result, the rinse liquid L landing on the surface of the substrate W passes through the center O of the substrate W. When the rinse liquid L passes through the center O of the substrate W, since the inertial force of the single tube nozzle 41 in the supply direction is gradually weakened and the centrifugal force increases toward the outer circumference, the rinse liquid becomes a liquid flow Lc flowing toward the outer circumference while drawing a curve in the rotational direction of the substrate so that the width gradually widens toward the outer circumference, and finally it is discharged from the outer circumference of the substrate W.

The behavior of the rinse liquid L on the surface of the substrate W as described above depends on the surface characteristics (hydrophilicity and hydrophobicity) and the rotational speed (magnitude of the centrifugal force) of the substrate W, in addition to the position of the single tube nozzle 41, the discharge direction, the bore diameter, the flow speed (bore diameter x flow speed is flow rate), and the liquid-landing position. As the liquid-landing position is away from the center O of the substrate W, it is desirable that the ingredients of the liquid flow La parallel to the surface of the substrate W be great, and for this reason, it is desirable to reduce the incident angle α. Also, when the rotational speed of the substrate W is too fast, since the inertial force loses to the centrifugal force in the liquid flow Lb and the liquid flow Lb does not pass through the center O of the substrate, it is not desirable to excessively rotate the substrate W at a high speed, and it is desirable to set the rotational speed to 1500 rpm, and more desirably, to 1000 rpm or less.

Also, when the surface of the substrate W is hydrophobic, it is desirable to get the liquid-landing position close to the center O (reduce Ra) to reduce the incident angle. Hydrophilicity of the surface of the substrate W is set so that the contact angle becomes 0 to 70°. Also, when the diameter of the single tube nozzle 41 is 1 to 5 mm, the flow rate is set to 500 to 2000 ml/min, and when the bore diameter of the single tube nozzle 41 is 5 to 10 mm, the flow rate is set to 2000 ml/min or more. Further, if the distance Ra from the center O of the substrate W to the liquid-landing position A is too large, since it is necessary to increase the flow speed so that the liquid flow after landing passes through the center O of the substrate W by the inertial force as described above, it is desirable to set the distance to one third or less of the radius R.

As described above, according to the washing device of this embodiment, although the rinse liquid L is supplied onto the surface of the substrate W from the single tube nozzle 41, the rinse liquid is not discharged to the center O of the substrate W from the upper part of the substrate W at a large incident angle (for example, 90°), the rinse liquid is discharged so as to land on the front of the center O toward the direction of the center O in a plan view from the obliquely upward direction at a relatively low incident angle, and the landed rinse liquid L flows to pass through the center O of the substrate W. Accordingly, the rapid liquid substitution is performed even at the center O of the substrate W having the small centrifugal force, and the rinse liquid L is prevented from stagnating in the central portion of the substrate W. Further, even when the surface of the substrate W is a layer of a soft material such as copper, it is possible to reduce the damage to the surface as compared to the case where the incident angle is large.

Second Embodiment

Figure 3:
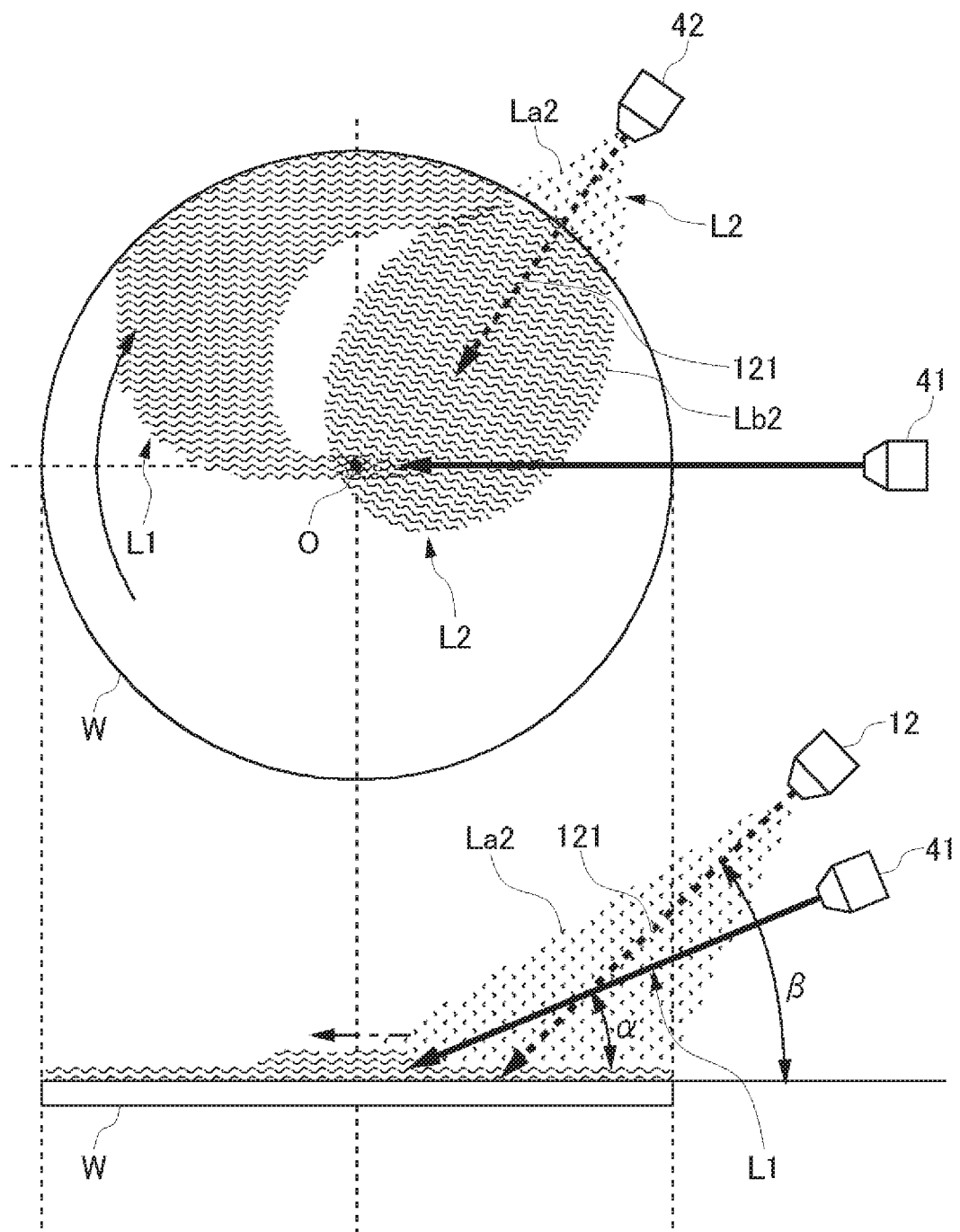
FIG. 3 is a plan and front view illustrating a positional relation between a substrate and a single tube nozzle in a washing device of a second embodiment.

FIG. 3 view (a) is a plan view illustrating the positional relation between the substrate and the single tube nozzle and the spray nozzle in the washing device of the second embodiment, and FIG. 3 view (b) is a front view of FIG. 3 view (a). FIG. 3 illustrates the washing liquid supply to the flat substrate surface by the single tube nozzle and the spray nozzle. The single tube nozzle 41 as the washing liquid supply nozzle is configured similarly to the first embodiment. In this embodiment, a spray nozzle 42 as a washing liquid supply nozzle is also added to the first embodiment. The discharging of the rinse liquid L1 by the single tube nozzle 41 and the spraying of the rinse liquid L2 by the spray nozzle 42 are simultaneously performed.

As illustrated in FIG. 3 view (b), the spray nozzle 42 sprays the rinse liquid L2 toward the surface (upper surface) of the substrate W from the outside of the upper space of the substrate W above the substrate W. That is, the spray nozzle 42 supplies the rinse liquid L2 to the surface of the substrate W obliquely from the upper part. Accordingly, the rinse liquid La2 sprayed from the spray nozzle 42 is sprayed to spread in a conical shape having a peak on the spray nozzle 42, and lands on the surface of the substrate W at an oval liquid-landing area Lb2.

The liquid-landing area Lb2 spreads from the outer circumference to the center O of the substrate W, and is located on the upstream side in the rotational direction of the substrate W from the liquid-landing position of the rinse liquid L1 discharged from the single tube nozzle 41. In addition, in this case, the upstream side/downstream side of the substrate W in the rotational direction on the basis of a certain reference position refer to positions up to the 180° rotation in the reverse direction/forward direction of the rotational direction of the substrate W from the reference position, and in the case of the example of FIG. 3, since the liquid-landing position of the rinse liquid L1 as a reference position is located on the right side of the center O of the substrate W, an upper half of the substrate W of FIG. 3 view (a) is an upstream side as viewed from the liquid-landing position of the rinse liquid L1 as the reference position, and a lower half of the substrate W of FIG. 3 view (a) is a downstream side as viewed from the liquid-landing position of the rinse liquid L1 as the reference position.

As illustrated in FIG. 3 view (a), a spray direction (direction of a center line of the conical rinse liquid La2 sprayed from the spray nozzle 42 prior to landing on the substrate W) 121 of the spray nozzle 42 is generally directed to the center O of the substrate W in a plan view. As illustrated in FIG. 3 view (b), an angle (incident angle) β formed between the spray direction 121 and the surface of the substrate W in a front view is greater than the incident angle α of the single tube nozzle 41 and is approximately 45°. Since the sprayed particles of the rinse liquid La2 are very small and light, when the incident angle to the surface of the substrate W rotating at a high speed is low, the rinse liquid La2 is repelled on the surface of the substrate W or in the vicinity of the surface, and the liquid-landing rate is lowered and the supply efficiency decreases. Accordingly, the spray direction 121 is desirably large and may be 90°.

As in this embodiment, it is experimentally clear that, in the rinsing washing of the washing device, when the supply of the rinse liquid L1 by the single tube nozzle 41 and the supply of the rinse liquid L2 by the spray nozzle 42 are simultaneously performed, the washing degree is improved. That is, the washing degree is improved, by promoting the flow of the rinse liquid even in both the central portion and the peripheral portion of the surface of the substrate W, by the action of the rinse liquid L1 by the single tube nozzle 41 described in the first embodiment in the central portion of the substrate W, and by the action of the rinse liquid L2 by the spray nozzle 42 in the outer circumferential portion from the central portion of the substrate W. Thus, the liquid-landing area La2 of the spray nozzle 42 does not need to necessarily reach the center O of the substrate W. In addition, the spray nozzle 42 may spray the rinse liquid in a fan shape, without being limited to spraying of the rinse liquid in a conical shape.

Third Embodiment

Figure 4:
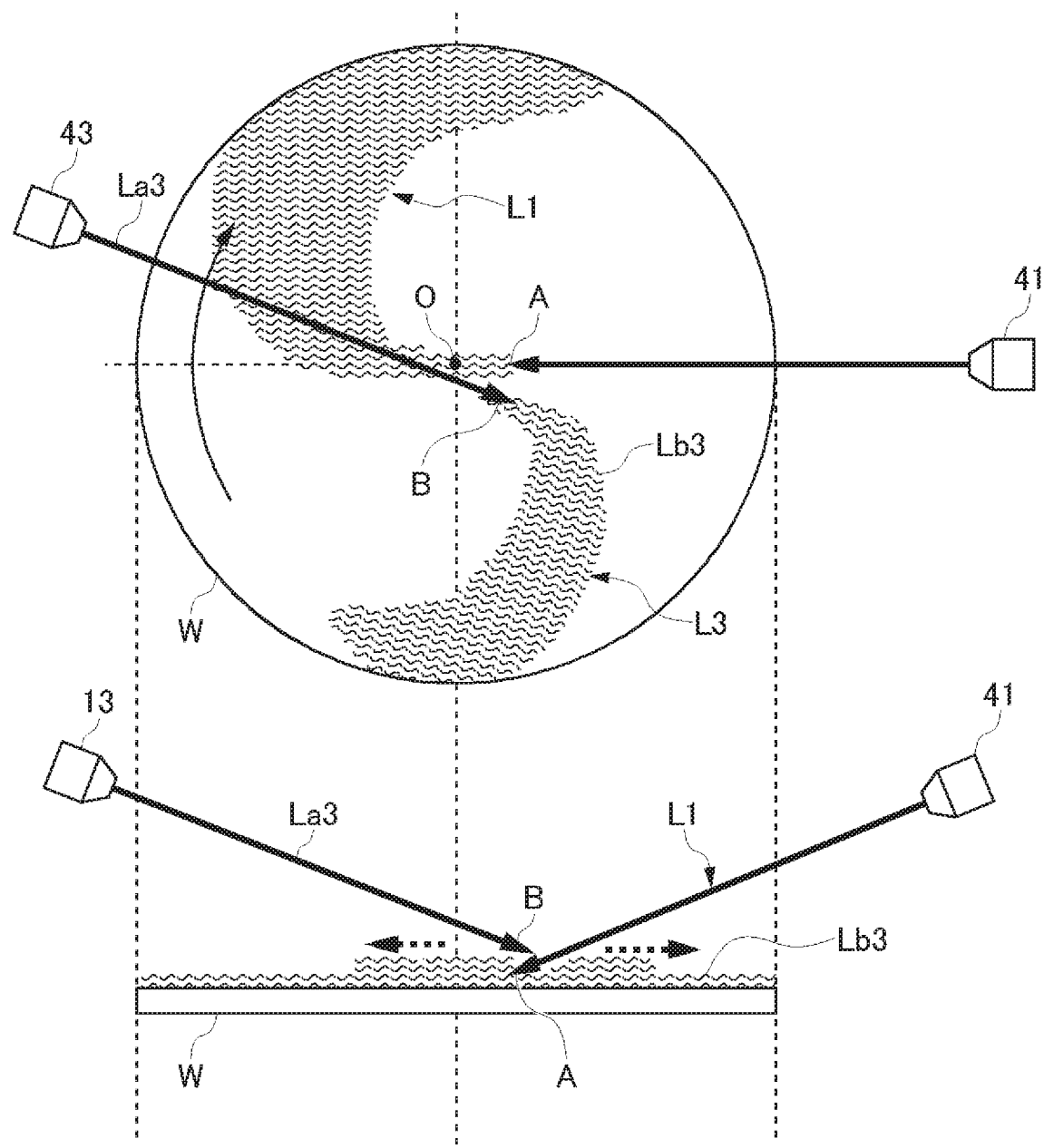
FIG. 4 is a plan and front view illustrating a positional relation between a substrate and two single tube nozzles in a washing device of a third embodiment.

FIG. 4 view (a) is a plan view illustrating the positional relation between the substrate and the two single tube nozzles in a washing device of a third embodiment, and FIG. 4 view (b) is a front view of FIG. 4 view (a). FIG. 4 illustrates a washing liquid supply to the flat substrate surface by the two single tube nozzles. The first single tube nozzle 41 is configured similarly to the first embodiment. In the present embodiment, a second single tube nozzle 43 is further added to the first embodiment. The discharging of the rinse liquid L1 by the single tube nozzle 41 and the discharging of the rinse liquid L3 by the single tube nozzle 43 are simultaneously performed. As illustrated in FIG. 4B, the single tube nozzle 43 discharges the rinse liquid L3 toward the surface (upper surface) of the substrate W from the outside of the upper space of the substrate W above the substrate W. That is, the single tube nozzle 43 supplies the rinse liquid L3 to the surface of the substrate W obliquely from the upper part.

A position, a discharge direction, a bore diameter and a flow speed of the single tube nozzle 43 are designed so that the rinse liquid L3 discharged from the single tube nozzle 43 satisfies the following conditions. As illustrated in FIG. 4 view (a), the single tube nozzle 43 is provided on the opposite side of the center of the substrate W with respect to the single tube nozzle 41 in a plan view. A liquid-landing position B of the rinse liquid discharged from the single tube nozzle 43 to the surface of the substrate W is set on the downstream side of the liquid-landing position A of the single tube nozzle 41. Thus, as illustrated in FIG. 4 view (a), the rinse liquid L3 discharged from the single tube nozzle 43 lands on the surface of the substrate W, and then, flows on surface of the substrate W to spread toward the outer circumference as the liquid flow Lb3 on the downstream side of the liquid-landing position A, without being mixed with the rinse liquid L1 of the single tube nozzle 41.

Figure 5:
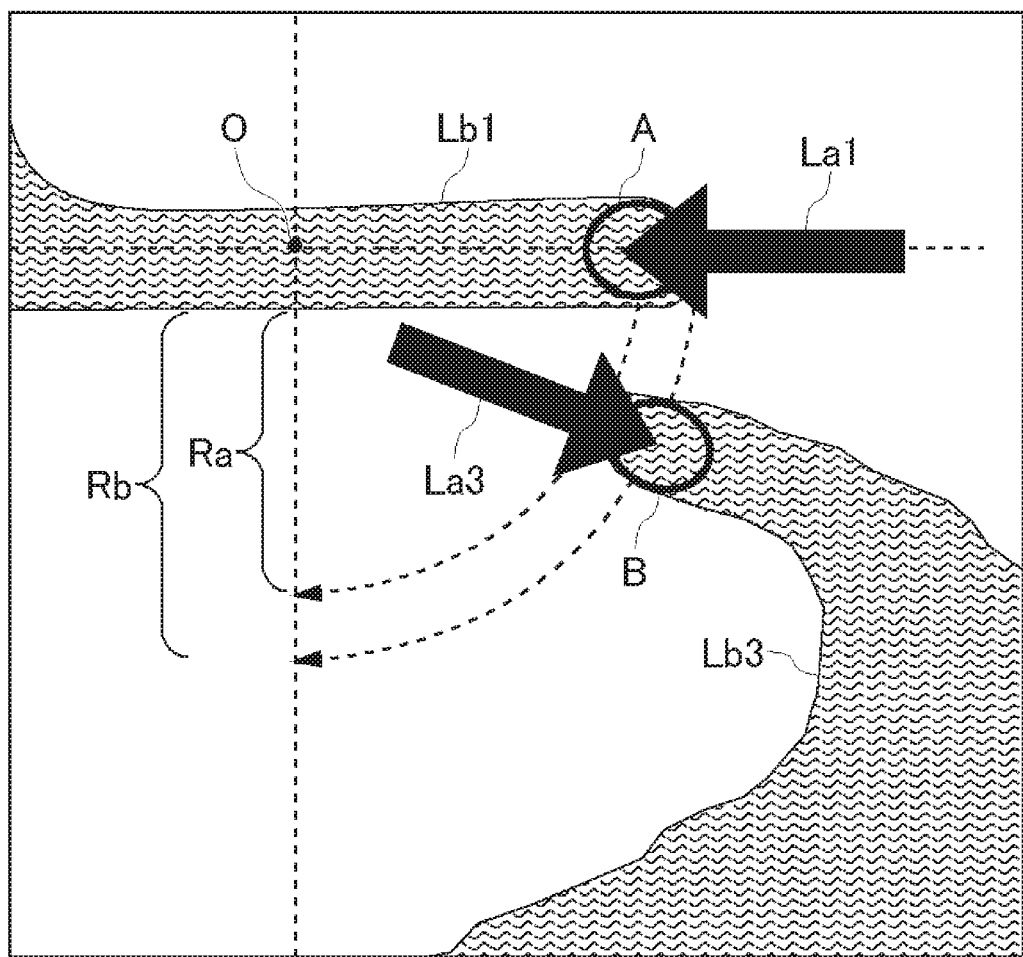
FIG. 5 is an enlarged view of a vicinity of a center of the substrate in FIG. 4.

FIG. 5 is an enlarged view of the vicinity of the center O of the substrate W in FIG. 4 view (a). As illustrated in FIGS. 4 view (a) and 5, the liquid-landing position B is at a position beyond the center O of the substrate W when viewed from the single tube nozzle 43, and becomes a position away from the center O of the substrate W by a distance Rb. The distance Rb of (the center of) the liquid-landing position B from the center O of the substrate W is set longer than the distance Ra of (the center of) the liquid-landing position A from the center O of the substrate W. However, when the distance Rb is long, since the range capable of being washed by the rinse liquid L3 from the single tube nozzle 43 is narrowed, the distance Rb is smaller than one quarter of the radius R of the substrate W.

In addition, it is not necessary that the rinse liquid L3 discharged from the single tube nozzle 43 linearly flows on the surface of the substrate W after landing. Thus, conditions such as the bore diameter and the flow speed of the rinse liquid L3 discharged from the single tube nozzle 43 may be set so that the rinse liquid L3 flows toward the outer circumference by the centrifugal force just after landing. However, from the viewpoint that when the incident angle is large, the surface of the substrate W is damaged, since it is the same as the case of the single tube nozzle 41, it is also desirable that the incident angle of the single tube nozzle 43 be small. In the example of FIG. 4, the incident angle of the single tube nozzle 43 is also approximately 30° in the same manner as the single tube nozzle 41.

As in this embodiment, it is experimentally clear that, when the supply of the rinse liquids L1 and L3 is simultaneously performed by the two single tube nozzle 41 and single tube nozzle 43 in the rinsing washing of the washing device, the washing degree is improved. That is, the washing degree is improved, by promoting the flow of the rinse liquid even in both the central portion and the peripheral portion of the surface of the substrate W, by the action of the rinse liquid L1 by the single tube nozzle 41 described in the first embodiment in the central portion of the substrate W, and by the action of the rinse liquid L3 by the single tube nozzle 43 in the peripheral portion from the central portion of the substrate W.

Fourth Embodiment

Figure 6:
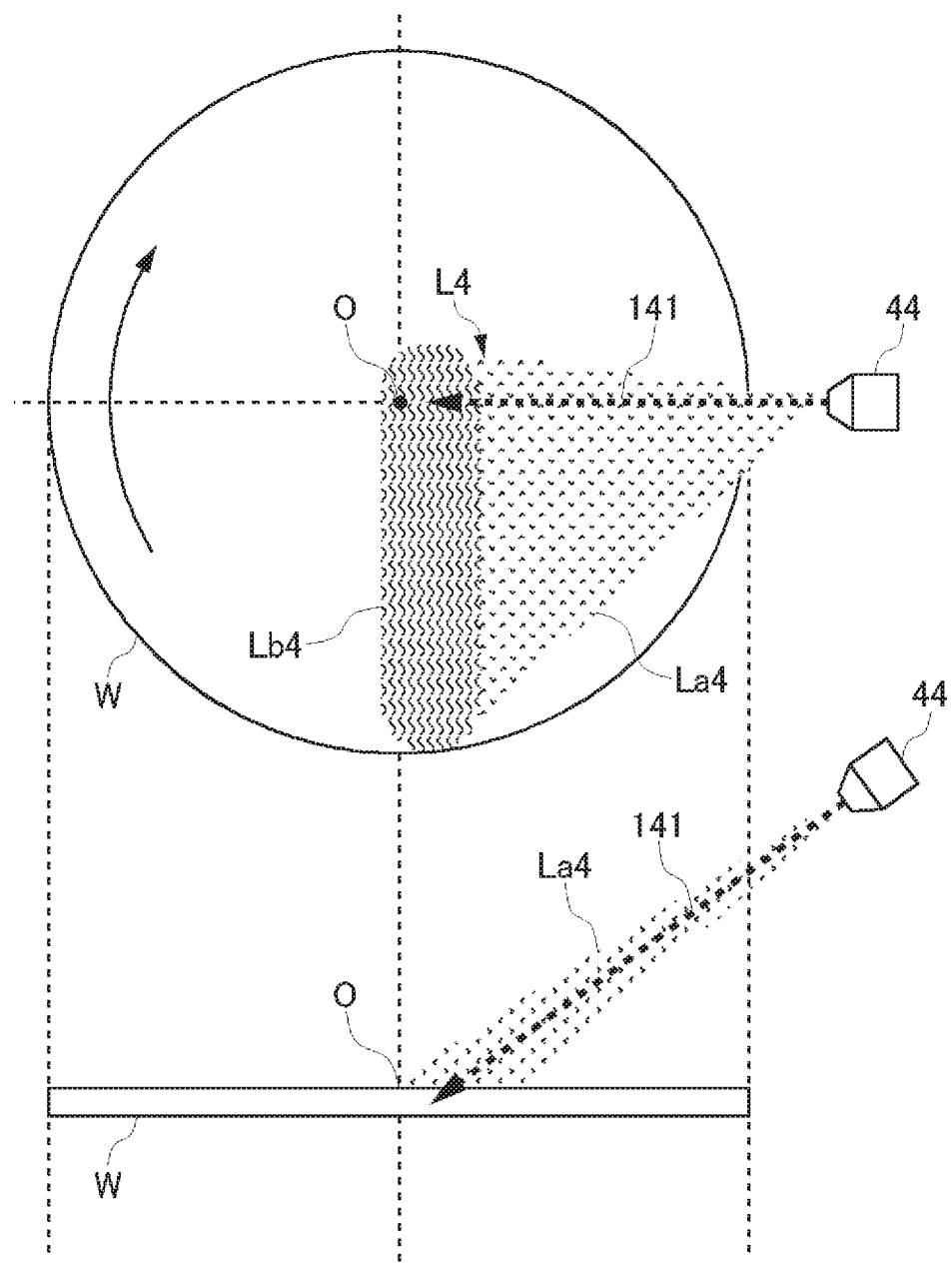
FIG. 6 is a plan and front view illustrating a positional relation between a substrate and a spray nozzle in a washing device of a fourth embodiment.

FIG. 6 view (a) is a plan view illustrating a positional relation between the substrate and the spray nozzle in a washing device of a fourth embodiment, and FIG. 6 view (b) is a front view of FIG. 6 view (a). FIG. 6 illustrates the washing liquid supply to the flat substrate surface by the spray nozzle. As illustrated in FIG. 6, the spray nozzles 44 sprays the rinse liquid L4 toward the surface (upper surface) of the substrate W from the outside of the upper space of the substrate W above the substrate W. That is, the spray nozzle 44 supplies the rinse liquid L4 to the surface of the substrate W obliquely from the upper part. While the rinse liquid La4 is sprayed from the spray nozzle 44 of the present embodiment to spread in a fan shape, the spray nozzle 44 is an asymmetric fan-shaped spray nozzle in which a direction, in which the flow rate (spraying quantity) in the sprayed rinse liquid La4 is maximized, is shifted from the center of the sprayed rinse liquid La4.

Figure 7:
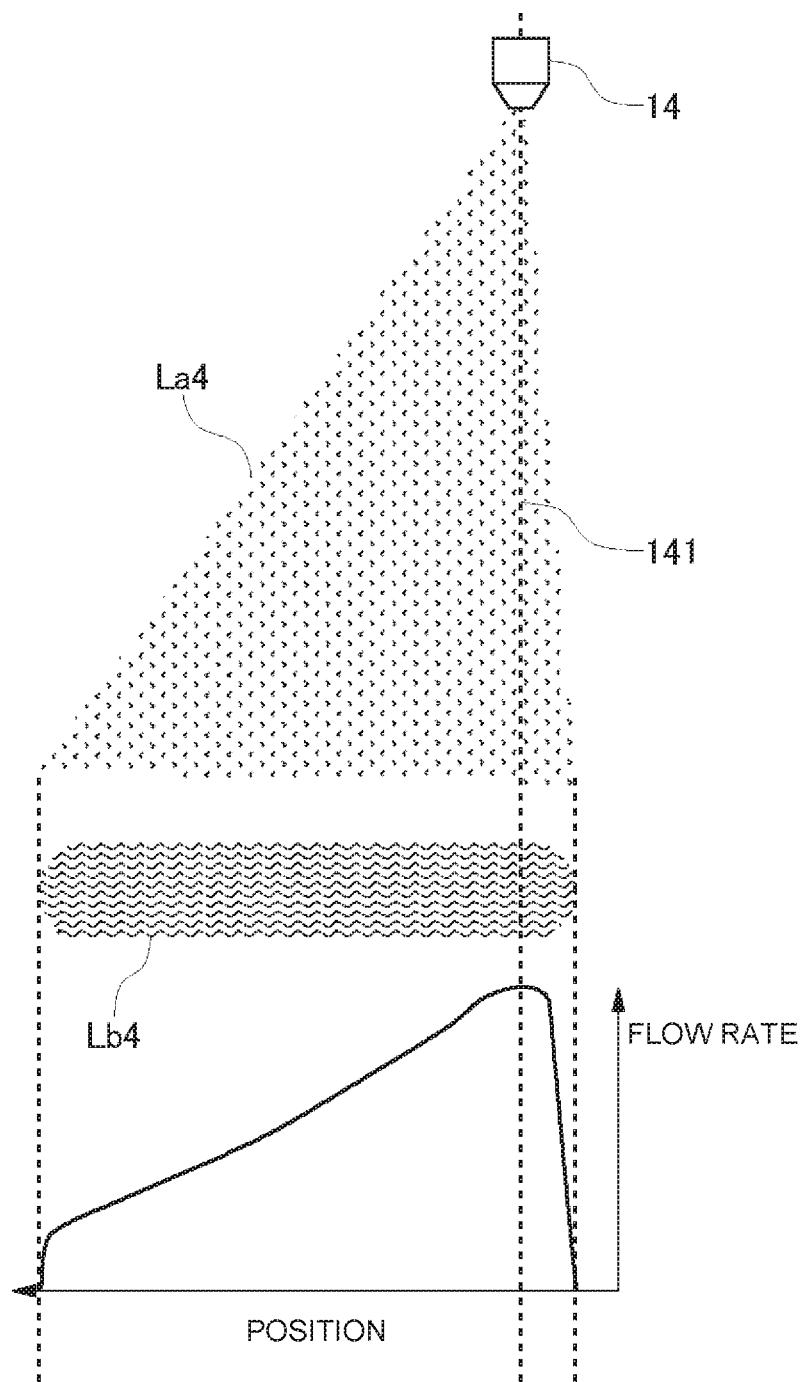
FIG. 7 is a diagram illustrating a relation between a position and a flow rate of a rinse liquid which spreads in a fan shape in a spray nozzle.

FIG. 7 is a diagram illustrating a relation between the position and the flow rate of the rinse liquid La4 which spreads in a fan shape in the spray nozzle 44. The normal spray nozzle 44 has a symmetrical distribution in which the flow rate at the center position of the rinse liquid spreading in a fan shape is greatest, and the flow rate decreases as it goes to both edges. However, as illustrated in FIG. 7, the rinse liquid L4 sprayed from the spray nozzle 44 of this embodiment has an unequal fan distribution in which the flow rate is maximized at the edge of the rinse liquid La4 spreading in a fan shape, and the flow rate decreases as it goes to the edge of the opposite side.

In this embodiment, the position and the angle of the spray nozzle 44 are set so that the direction (maximum spraying quantity direction) 141 of the maximum flow rate is near a direction toward the center O of the substrate W in a plan view, and the liquid-landing area Lb4 reaches the outer circumference from the center of the substrate W. Specifically, the maximum spraying quantity direction 141 is directed to the center O of the substrate W in a plan view. Further, as illustrated in FIG. 6 view (a), the center O of the substrate W is included in the liquid-landing area Lb4. As a result, in the liquid-landing area Lb4, the flow rate (liquid-landing quantity) is greatest at the center O of the substrate W, and as it goes to the edge of the substrate W, the flow rate (liquid-landing quantity) decreases. In addition, in FIG. 6, the rinse liquid L4 after landing on the surface of the substrate W is not illustrated.

If the maximum spraying quantity direction 141 is directed to the center O of the substrate W in a plan view but the liquid-landing area Lb4 is too far away from the center O of the substrate W, as described in the background art, the rinse liquid L4 trying to flow toward the center O of the substrate W by the inertial force after landing collides with the rinse liquid L4 trying to flow to the outer circumference by the centrifugal force from the vicinity of the center O of the substrate W, and the fluidity of the rinse liquid L4 is lowered at this portion. In contrast, the spray nozzle 44 of this embodiment sprays the rinse liquid so that the maximum spraying quantity direction 141 is not only directed to the center O of the substrate W in a plan view, but as described above, with respect to the surface of the substrate W obliquely from the upper part, the center O of the substrate W is included in the liquid-landing area Lb4. Thus, the rinse liquid L4 landing near the center O of the substrate W flows in a direction away from the center O by the inertial force as it is, and flows toward the outer circumference by the centrifugal force after being away from the center O. Accordingly, the collision of the rinse liquid L4 as described above does not occur, and the fluidity is not also lowered.

Figure 8:
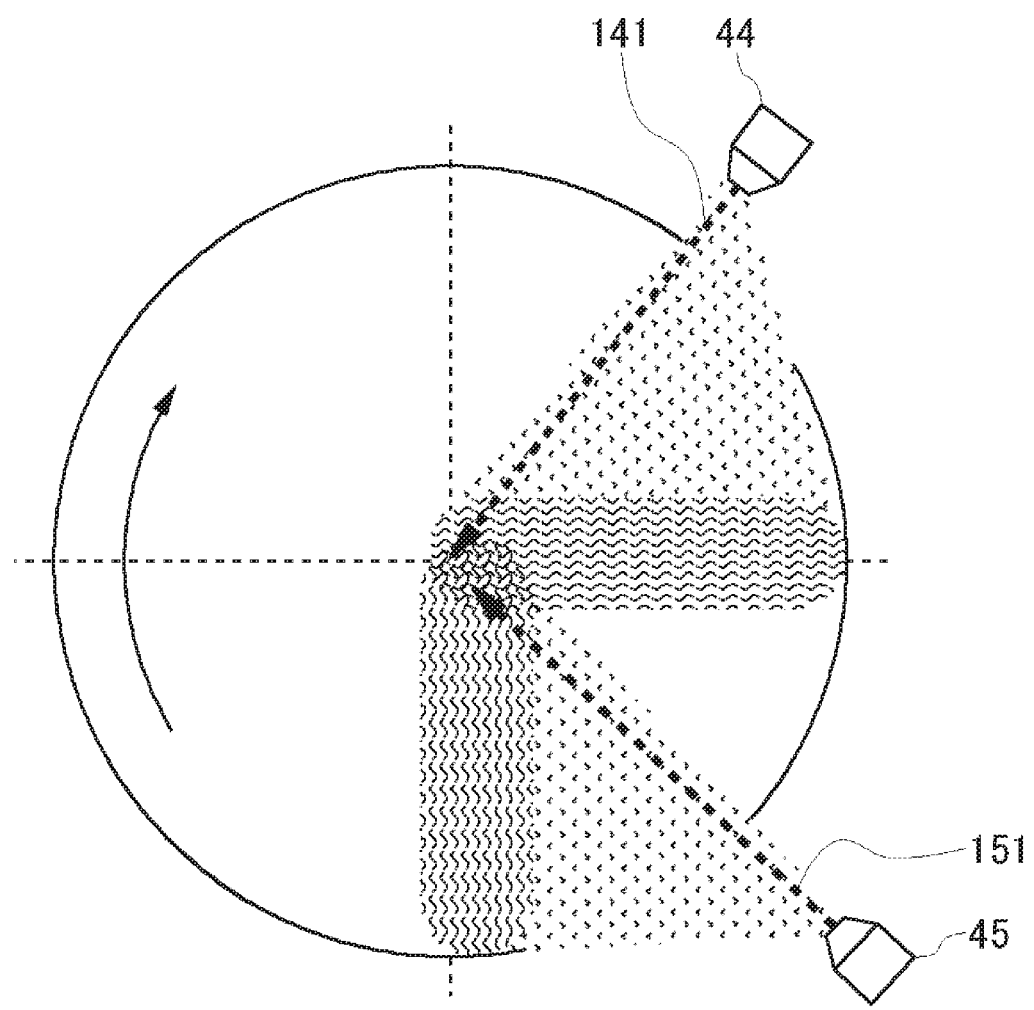
FIG. 8 is a plan view illustrating a positional relation between the substrate and the spray nozzle in the washing device in a modified example of the fourth embodiment.

FIG. 8 is a plan view illustrating a positional relation between the substrate and the spray nozzle in a washing device in a modified example of the fourth embodiment. In this example, two asymmetric fan-shaped spray nozzles are provided as described above. That is, the washing device is provided with a spray nozzle 45 of the same configuration in addition to the spray nozzle 44, and the two spray nozzles 44 and 15 are simultaneously used. The two spray nozzles 44 and 15 are set so that the maximum spraying quantity directions 141 and 151 are about 90° in a plan view. Even in this modified example, each of the spray nozzles 44 and 15 may act similarly to the spray nozzle 44 of FIG. 6 to be able to achieve the same effect as described above. Further, the angle between the maximum spraying quantity directions 141 and 151 of the spray nozzles 44 and 15 is not limited to 90°.

In addition, in the first to fourth embodiments, the embodiments have been described as an example of the case of supplying the rinse liquid in the rinsing washing. However, in the first embodiment, the second embodiment, the fourth embodiment and its modified example, it is also possible to apply the supply of the washing liquid to the chemical liquid washing such as the roll washing or the pencil washing. That is, even when at least the chemical liquid is supplied to the substrate (rinse liquid may also be simultaneously supplied), and at the same time, the substrate is scrubbed and washed using a roll washing member and a pencil washing member, the chemical liquid (and rinse liquid) may also be supplied as described in the first embodiment, the second embodiment, the fourth embodiment and its modified example.

Hereinafter, as fifth to seventh embodiments, an example of applying the present technique to the roll washing device will be described, but prior to the description of each embodiment, a general configuration of the roll washing device will be described.

Figure 9:
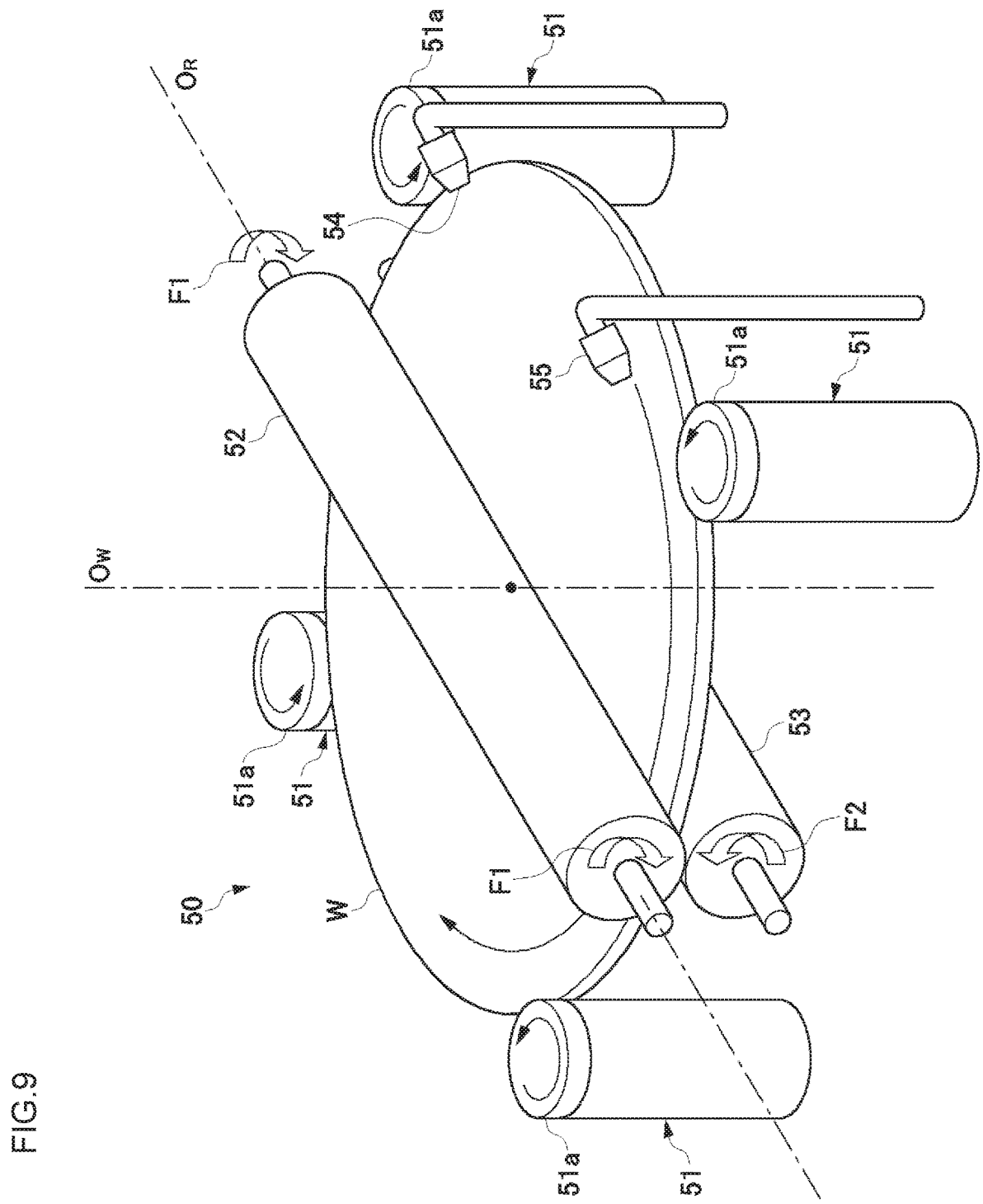
FIG. 9 is a perspective view illustrating an outline of a roll washing device according to an embodiment.

FIG. 9 is a perspective view illustrating an outline of the roll washing device according to an embodiment. As illustrated in FIG. 9, the roll washing device 50 includes, as a substrate rotation mechanism, a plurality of (four in FIG. 9) horizontally movable spindles 51 which supports the circumferential portion of the substrate W with the surface facing upward and horizontally rotates the substrate W, an upper roll washing member (roll sponge) 52 which is rotatably supported on a roll holder (not illustrated), and a lower roll washing member (roll sponge) 53 which is rotatably supported on a roll holder (not illustrated). The upper roll washing member 52 and the lower roll washing member 53 have a cylindrical shape, extend in an elongated shape, and are made up of, for example, a PVA. In addition, the upper roll washing member 52 is freely movable up and down with respect to the surface of the substrate W by the roll holder, and the lower roll washing member 53 is freely movable up and down with respect to the back surface of the substrate W by the roll holder.

The upper roll washing member 52 rotates by a drive mechanism (not illustrated) as indicated by an arrow F1, and the lower roll washing member 53 rotates by a drive mechanism (not illustrated) as indicated by an arrow F2. Two washing liquid supply nozzles 54 and 55 are disposed which are located above the substrate W rotated by being supported by the spindle 51 to supply a washing liquid onto the surface of the substrate W. The washing liquid supply nozzle 54 is a nozzle which supplies the rinse liquid (for example, ultrapure water) to the surface of the substrate W, and the washing liquid supply nozzle 55 is a nozzle which supplies a chemical liquid to the surface of the substrate W.

The roll washing device 50 horizontally rotates the substrate W, by positioning the peripheral portion of the substrate W within a fitting groove formed on an outer circumferential side surface of a frame 51a provided on the upper part of the spindle 51, and by rotating (turning) the frame 51a while being pressed inward. In this example, two frames 51a of the four frames 51a give a rotational force to the substrate W, and other two frames 51a have the function of bearing which receives the rotation of the substrate W. In addition, a rotational force may be given to the substrate W by connecting all the frames 51a to the drive mechanism.

In a state where the substrate W is horizontally rotated in this way, while supplying the rinse liquid to the surface of the substrate W from the washing liquid supply nozzle 54, and supplying a chemical liquid to the surface of the substrate W from the washing liquid supply nozzle 55, the upper roll washing member 52 is lowered while being rotated to come into contact with the surface of the rotating substrate W. As a result, in the presence of the washing liquid (rinse liquid and chemical liquid), the surface of the substrate W is scrubbed and washed by the upper roll washing member 52. The length of the upper roll washing member 52 is set to be slightly longer than the diameter of the substrate W. Moreover, the upper roll washing member 52 is disposed so that its central axis (rotary axis) $O_R$ is substantially orthogonal to the central axis (the rotary center) $O_W$ of the substrate W and so as to extend over the entire length of the diameter of the substrate W. Thus, the entire surface of the substrate W is simultaneously washed.

Hereinafter, the fifth to seventh embodiments will be described, but these embodiments are different from one another in the configuration of the washing liquid supply nozzle.

Fifth Embodiment

Figure 10:
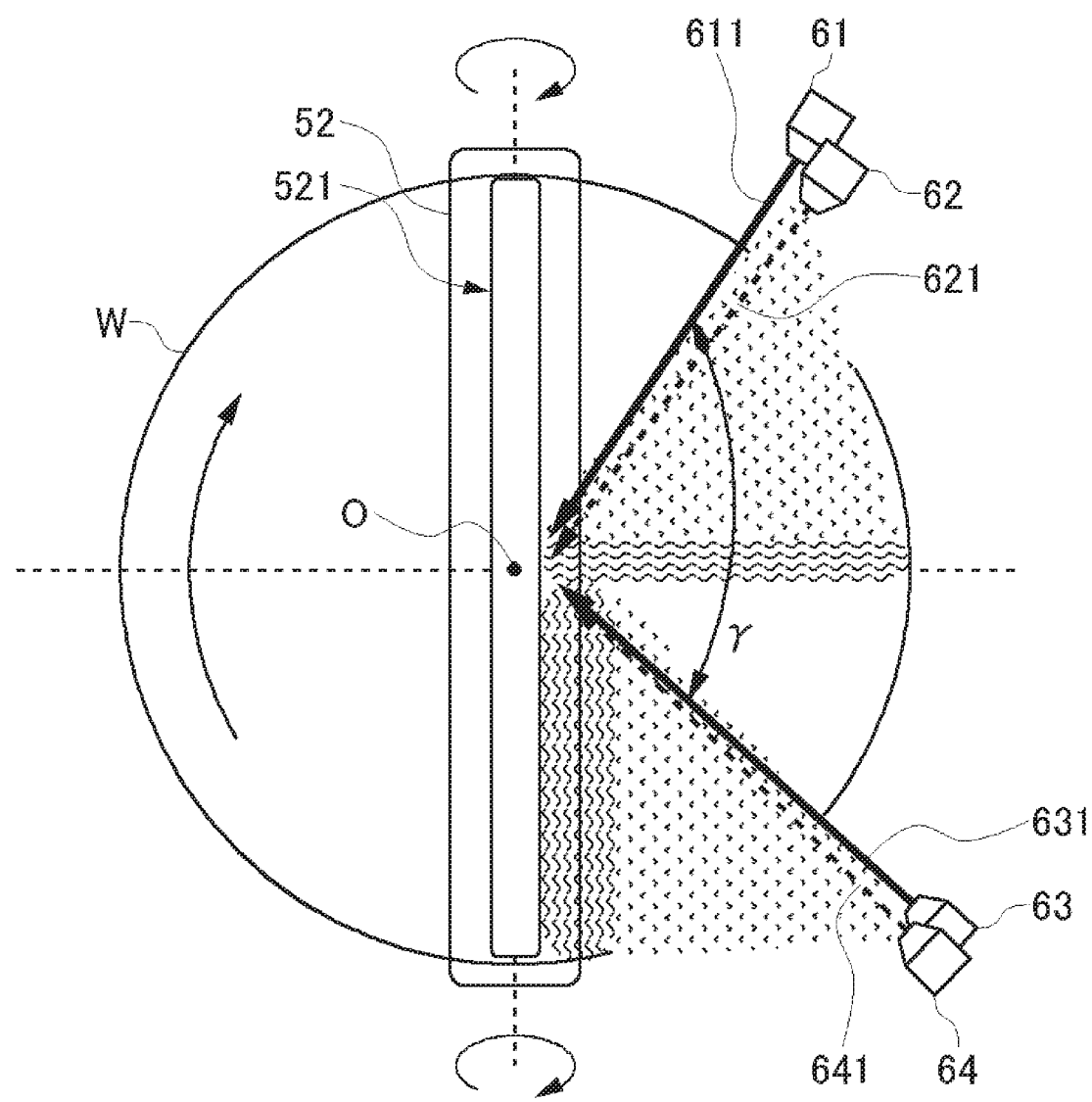
FIG. 10 is a plan view of a washing device according to a fifth embodiment.

FIG. 10 is a plan view of a washing device according to a fifth embodiment. In FIG. 10, the spindle is not illustrated. The washing device includes a single tube nozzle 61 which discharges the rinse liquid as the washing liquid, and a single tube nozzle 63 which discharges the chemical liquid as the washing liquid. The single tube nozzles 61 and 63 discharge the washing liquid toward the surface (the upper face) of the substrate W from the outside of the upper space of the substrate W above the substrate W. That is, the single tube nozzles 61 and 63 supply the washing liquid to the surface of the substrate W obliquely from the upper part. The rinse liquid may be ultrapure water (DIW) and may be functional water such as hydrogen water. Solution (acidic chemical liquid or weak alkaline chemical liquid) other than electrolytic liquid (liquid in the vicinity of pH 7) is used as the chemical liquid. For example, organic acids such as citric acid or oxalic acid are used as the acidic chemical liquid, and for example, organic alkali is used as the weak alkaline chemical liquid.

The positions, the discharge directions, the bore diameters and the flow speed of the single tube nozzles 61 and 63 are set under the same conditions as described for the single tube nozzle 41 in the first embodiment, respectively. In addition, the washing liquid is discharged from the single tube nozzles 61 and 63 so as to land in front of the washing area (scrubbing area) 521 in which the upper roll washing member 52 and the substrate W are in contact with each other. Both the single tube nozzles 61 and 63 supply the washing liquid to a roll winding side area (right half area of the substrate W illustrated in FIG. 10) of the substrate W which will be described below. An angle γ between the discharge directions 611 and 631 of the single tube nozzles 61 and 63 is approximately 90° in a plan view, but the angle γ is not limited to 90°.

The washing device is further provided with a spray nozzle 62 which sprays a rinse liquid as a washing liquid, and a spray nozzle 64 which sprays a chemical liquid as a washing liquid. The spray nozzles 62 and 64 also supply the washing liquid to roll winding side area of the substrate W. Although the spray nozzles 62 and 64 are approximately at the same positions as the single tube nozzles 61 and 63 in a plan view respectively, in a manner similar to that illustrated in FIG. 3(b), the incident angle of the spray nozzles 62 and 64 is greater than the incident angle of the single tube nozzles 61 and 63, and the spray nozzles 62 and 64 spray the washing liquid from the further upper part.

Both the spray nozzles 62 and 64 are asymmetric fan-shaped spray nozzles as described in the fourth embodiment, and the positions, the injection directions thereof or the like are the same as those of the spray nozzles 44 and 45 described in the modified example (FIG. 8) of the fourth embodiment. That is, the maximum spraying quantity directions 621 and 641 are directed to the center O of the substrate W in a plan view. The angle between the maximum spraying quantity directions 621 and 641 is also, but not limited to, approximately 90°. The liquid-landing areas of the spray nozzles 62 and 64 extend from the washing area 521 near the center O of the substrate W to the outer circumference of the substrate W.

The single tube nozzle 61 and the spray nozzle 62, which supply the rinse liquid, supply the washing liquid to the upstream side in the rotational direction of the substrate W than the single tube nozzle 63 and the spray nozzle 64 which supply a chemical liquid. By supplying both the rinse liquid and the chemical liquid to the roll winding side area of the substrate W, on the surface of the substrate W which moves to the lower half area of the washing area 521, there is a state in which the chemical liquid and the rinse liquid are mixed with each other.

Sixth Embodiment

Figure 11:
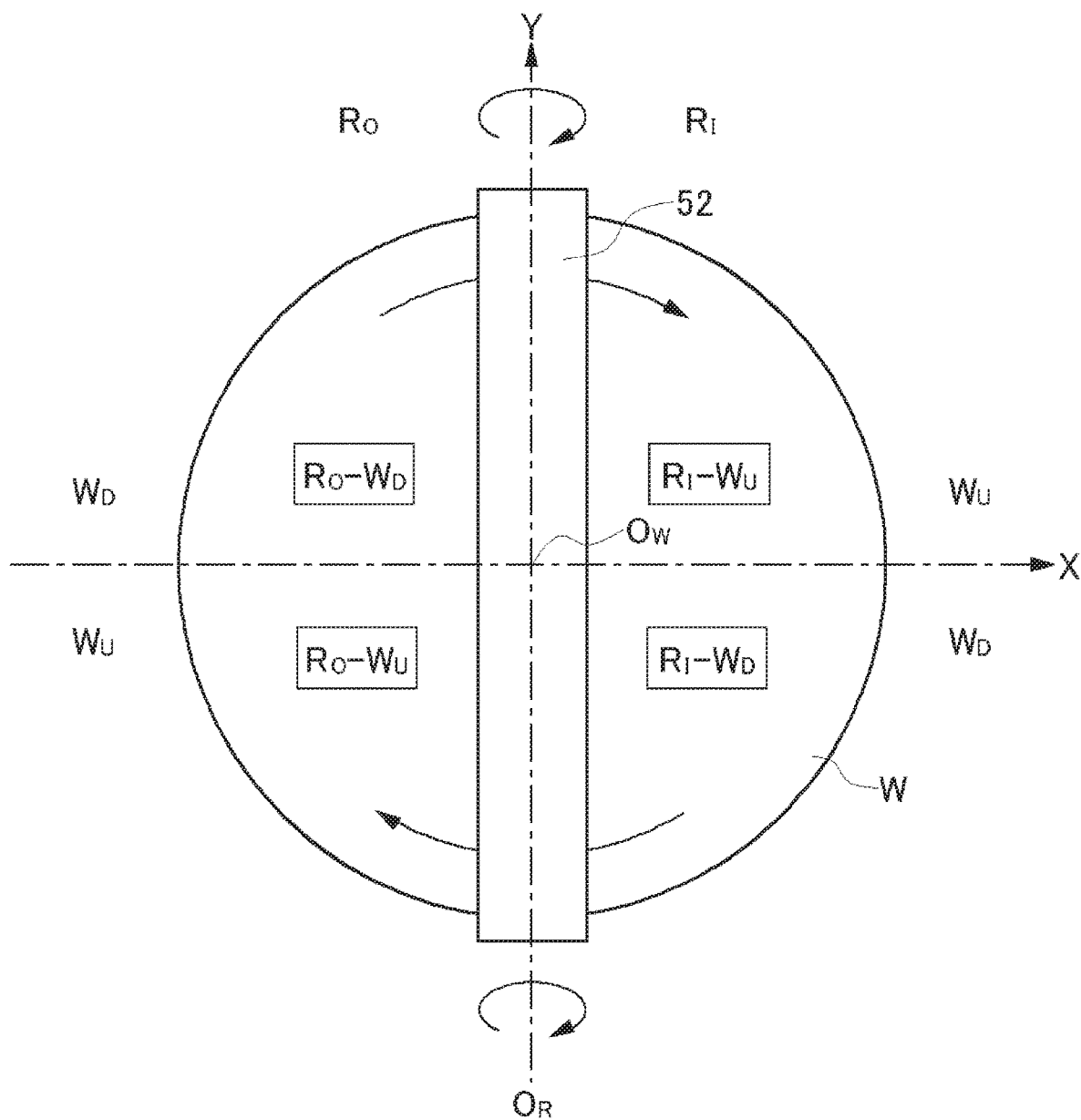
FIG. 11 is a plan view illustrating each area on the substrate.

Prior to the description of the sixth embodiment, the conventional problems solved by a washing device of a sixth embodiment will be described. FIG. 11 is a plan view illustrating each area on the substrate. As illustrated in FIG. 11, through the rotary center $O_W$ of the substrate W, a straight line orthogonal to the rotary axis $O_R$ of the upper roll washing member 52 is set to an X-axis, and a straight line along the rotary axis $O_R$ of the upper roll washing member 52 is set to a Y-axis. The upper roll washing member 52 rotates (turns) in a clockwise direction in a front view, and the substrate W rotates in a clockwise direction in a plan view.

The surface of the substrate W is divided into two areas $R_I$ and $R_O$ on the left and right sides across the upper roll washing member 52, that is, across the Y-axis. In FIG. 11 in which the upper roll washing member 52 rotates in the clockwise direction, a right one side area is defined as a roll winding side area $R_I$, and a left one side area is defined as a roll scraping side area $R_O$. That is, the roll winding side area $R_I$ is a one side area (right side in FIG. 11) in which the washing liquid is caught by the rotation of the upper roll washing member 52, and the roll scraping side area $R_O$ is a one side area (left side in FIG. 11) in which the washing liquid is scraped out by the rotation of the upper roll washing member 52.

Furthermore, each of the roll winding side area $R_I$ and the roll scraping side area $R_O$ is divided into an upstream area $W_U$ and a downstream area $W_D$ with respect to the rotational direction of the substrate W by the X-axis as a boundary. In the roll winding side area $R_I$, the upstream area $W_I$ above the X-axis is defined as a roll winding upstream area $R_I\text{-}W_U$, and the downstream area $W_D$ below the X-axis is defined as a roll winding downstream area $R_I\text{-}W_D$. Similarly, in the roll scraping side area $R_O$, the upstream area $W_U$ below the X-axis is defined as a roll scraping upstream area $R_O\text{-}W_U$, and the downstream area $W_D$ above the X-axis is defined as a roll scraping downstream area $R_O\text{-}W_D$.

Figure 12:
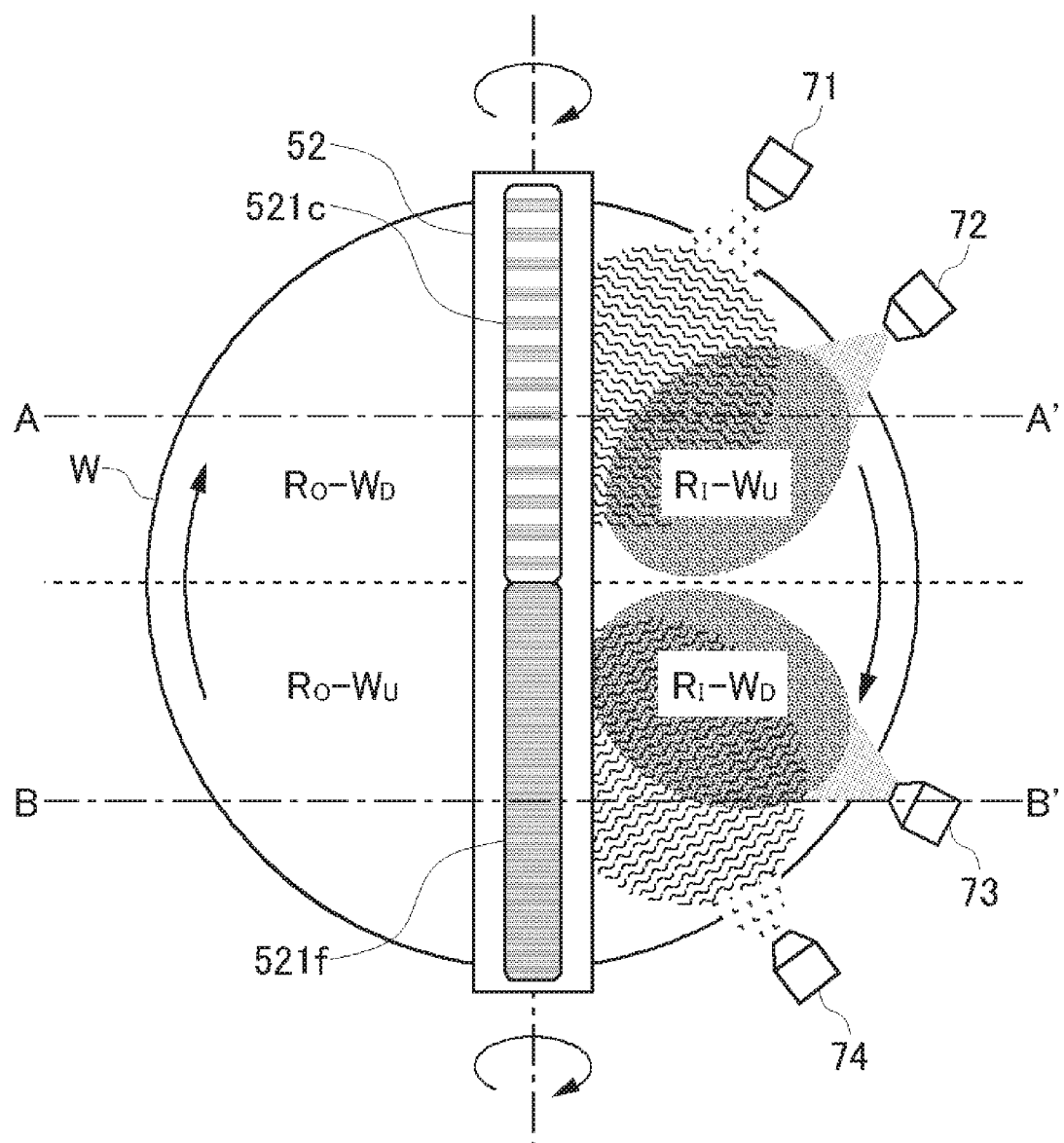
FIG. 12 is a plan view of a conventional roll washing device.
Figure 13:
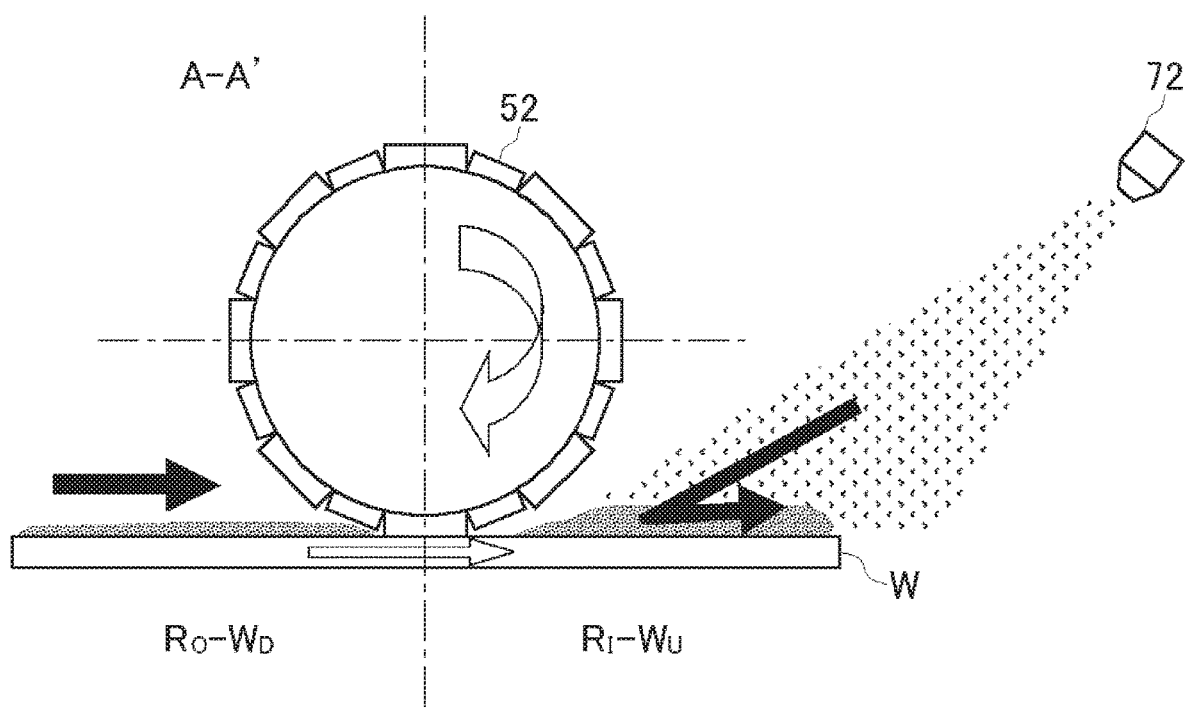
FIG. 13 is a cross-sectional view taken from a line A-A' of FIG. 12.
Figure 14:
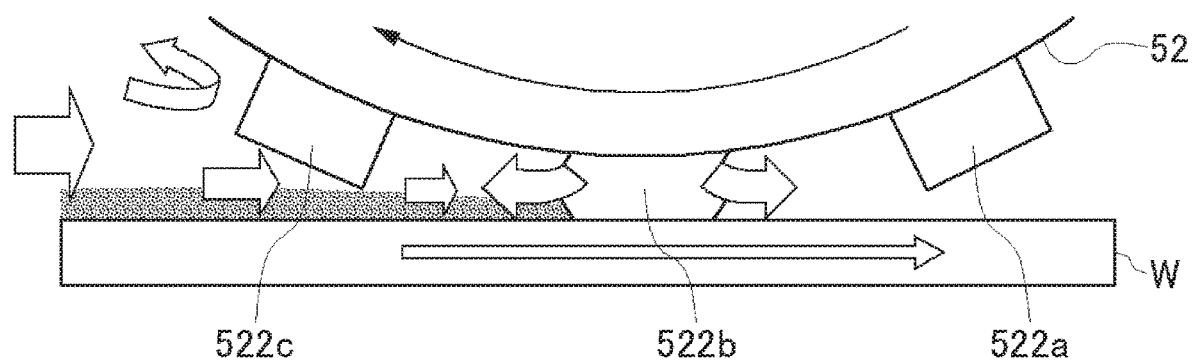
FIG. 14 is a partially enlarged view of FIG. 13.
Figure 15:
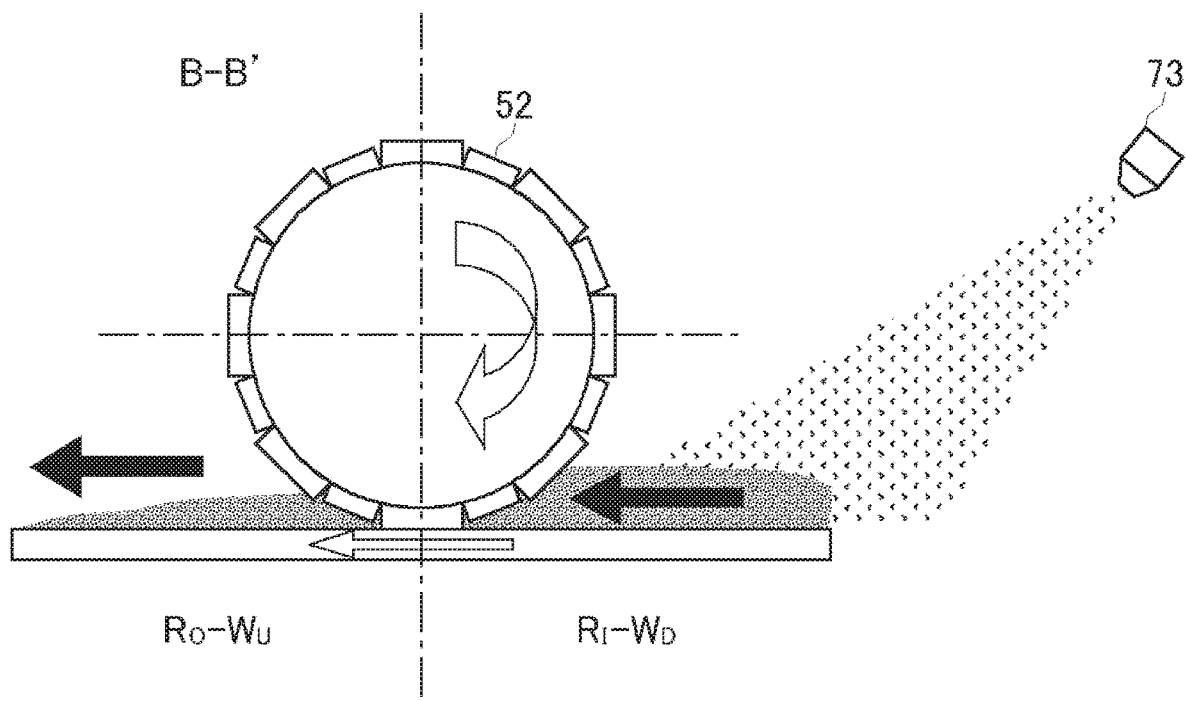
FIG. 15 is a cross-sectional view taken from a line B-B' of FIG. 12.

FIG. 12 is a plan view of a conventional roll washing device, FIG. 13 is a cross-sectional view taken from a line A-A' of FIG. 12, FIG. 14 is a partially enlarged view of FIG. 13, and FIG. 15 is a cross-sectional view taken from a line B-B' of FIG. 12. In FIGS. 13 and 14, the spray nozzles 71 and 74 are not illustrated. As illustrated in FIG. 12, the roll washing device includes four spray nozzles 71 to 74. All the spray nozzles 71 to 74 are nozzles which spray a washing liquid in a conical shape.

Also, all the spray nozzles 71 to 74 supply the washing liquid to the roll winding side area of the substrate W. The spray nozzles 71 and 74 spray the rinse liquid as the washing liquid, the spray nozzles 72 and 73 spray the chemical liquid as the washing liquid. The liquid-landing areas of the rinse liquid sprayed from the spray nozzles 71 and 74 reach the upper roll washing member 52, and a part of the rinse liquid is directly sprayed to the upper roll washing member 52.

As illustrated in FIGS. 12 and 13, in the counter washing area 521*c*, since the movement directions of the upper roll washing member 52 and the substrate W are opposite to each other, the relative movement speed (sliding movement speed) of both increases. Therefore, the physical washing characteristics of the counter washing area 521*c* are enhanced.

Meanwhile, the chemical liquid of the roll scraping downstream area $R_O\text{-}W_D$ as a non-liquid supply side area is a chemical liquid which is used for scrubbing and washing using the upper roll washing member 52 in a lower forward washing area 521*f* of the washing area 521 before half-rotation, and since most of the chemical liquid used for scrubbing and washing using the upper roll washing member 52 in the forward washing area 521*f* is discharged to the outer circumference of the substrate W, the chemical liquid is very small in the counter washing area 521*c*. In addition, in the roll winding upstream area $R_I\text{-}W_U$ as a liquid supply side area, the washing liquid supplied to the vicinity of the counter washing area 521*c* is conveyed in a direction in which the counter washing area 521*c* moves away by the rotation of the substrate W and is not supplied to the counter washing area 521*c*.

In addition, although a plurality of small protrusions is formed on the surface of the upper roll washing member 52 (in FIG. 14, only three protrusions 522*a* to 522*c* are illustrated), as described above, a protrusion 522*a* of the roll winding side area $R_I$ side of the upper roll washing member 52 is directly supplied with the rinse liquid and is immersed with the rinse liquid, or is supplied with the rinse liquid from the inside of the upper roll washing member 52 and is immersed with the rinse liquid. When the protrusion 522*a* immersed with the rinse liquid reaches the counter washing area 521*c* by the rotation of the upper roll washing member 52, similarly to the protrusion 522*b*, the protrusion 522*a* is crushed by the substrate W, and the immersed rinse liquid leaks to the roll winding side area $R_I$ and the roll scraping side area $R_O$.

Then, a small quantity of washing liquid, which is conveyed by the rotation of the substrate W from the roll scraping downstream area $R_O\text{-}W_D$ and tries to get into the counter washing area 521*c*, is also pushed out by the leaked rinse liquid and is less likely to be supplied to the counter washing area 521*c*. Therefore, a sufficient quantity of fresh washing liquid is not supplied to the counter washing area 521*c*, and the chemical liquid washing characteristics are lowered.

Meanwhile, as illustrated in FIG. 15, in the forward washing area 521*f*, since the movement directions of the upper roll washing member 52 and the substrate W are the forward direction, the relative movement speed (sliding movement speed) of both decreases. Therefore, the physical washing characteristics of the forward washing area 521*f* are lowered. Meanwhile, in the roll winding downstream area $R_I\text{-}W_D$ as the liquid supply side area, the fresh washing liquid is sufficiently supplied to the vicinity of the forward washing area 521*f* by the spray nozzle 73, and the washing liquid supplied to the vicinity of the forward washing area 521*f* is supplied to the forward washing area 521*f* by rotation of the substrate W. Therefore, the chemical liquid washing characteristics of the forward washing area 521*f* are enhanced.

As described above, in the conventional roll washing device, the counter washing area 521*c* have the high physical washing characteristics and the low chemical liquid washing characteristics, and the forward washing area 521*f* has the high chemical liquid washing characteristics and the low physical washing characteristics. Therefore, the present embodiment is intended to improve the chemical liquid washing characteristics of the counter washing area 521*c*.

Figure 16:
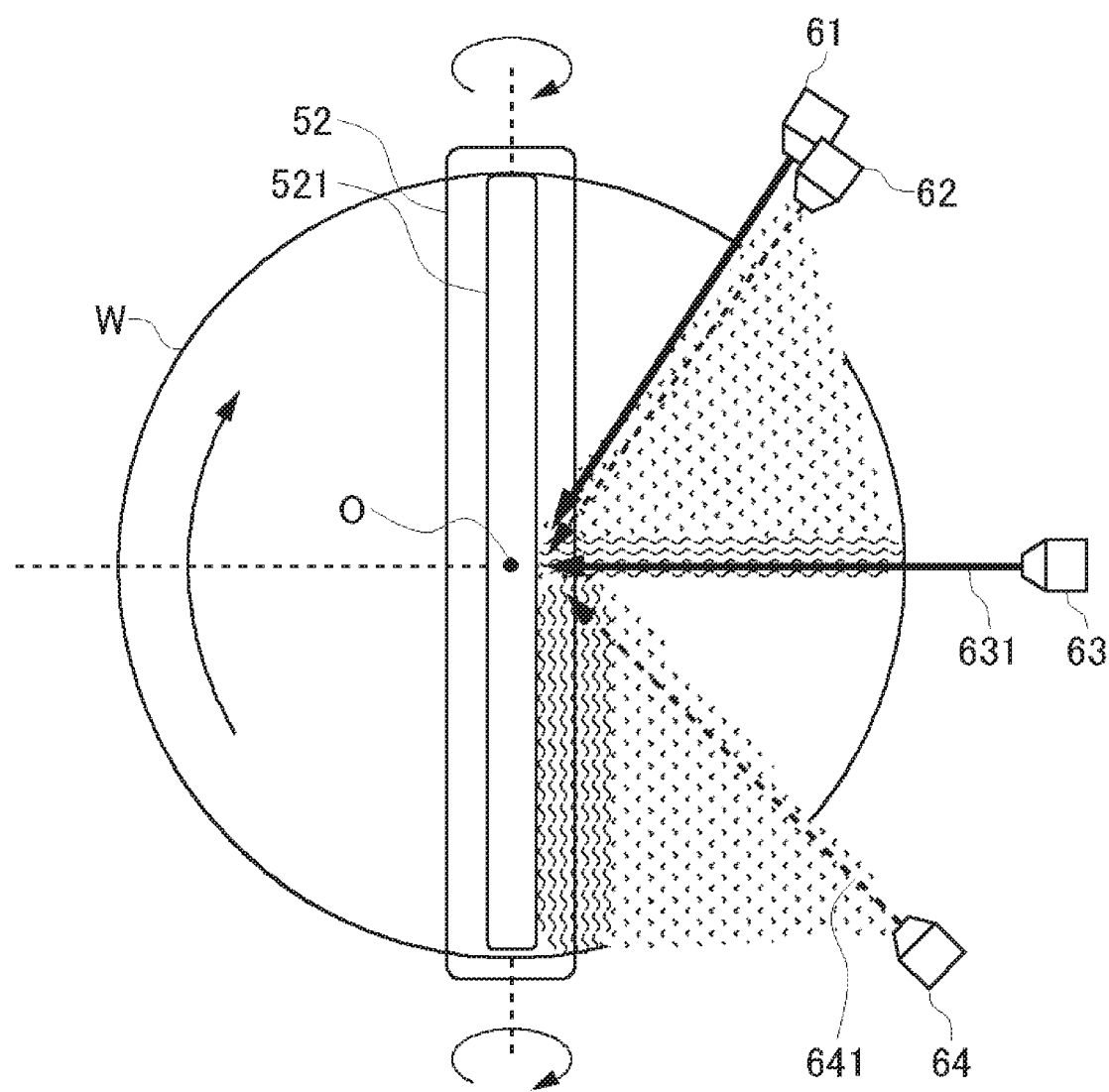
FIG. 16 is a plan view illustrating a washing device in a sixth embodiment.

FIG. 16 is a plan view illustrating a washing device in the sixth embodiment. In this embodiment, only an arrangement of a single tube nozzle 63 is different from the fifth embodiment, and other configurations are the same as those of the fifth embodiment. The single tube nozzle 63 for discharging the chemical liquid supplies the chemical liquid to the roll winding side area of the substrate W similarly to the fifth embodiment, but an angle formed between the discharge direction 631 of the single tube nozzle 63 and the extension direction (the rotary axis) of the upper roll washing member 52 is 90° in a plan view. The angle is not limited to 90°, and is preferably in the range of 90±30°. That is, in this embodiment, the discharge direction of the single tube nozzle 63 for discharging the chemical liquid and the maximum spraying quantity direction 641 of the spray nozzle 64 for spraying the chemical liquid are not substantially in the same direction in a plan view.

Figure 17:
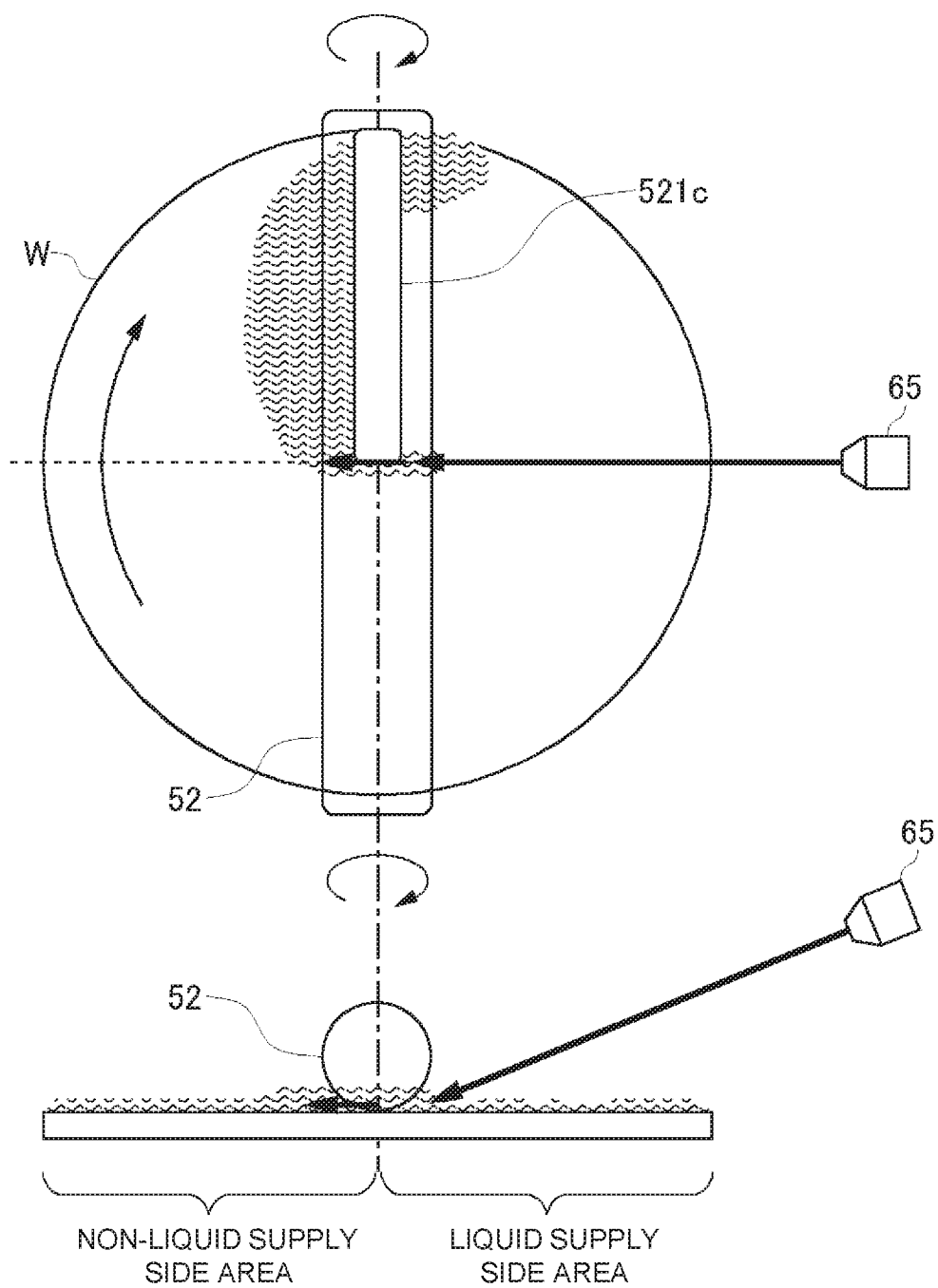
FIG. 17 is a plan and front view illustrating a behavior of a chemical liquid discharged from a single tube nozzle on a surface of a substrate in a sixth embodiment.

FIG. 17 view (a) is a plan view illustrating a behavior of the chemical liquid discharged from the single tube nozzle 63 on the surface of the substrate W in the present embodiment, and FIG. 17 view (b) is a front view of FIG. 17 view (a). As illustrated in FIG. 17, the roll winding side area $R_I$ of the substrate W is a liquid supply side area to which the washing liquid is supplied by the single tube nozzles 61 and 63, and the spray nozzles 62 and 64, and the roll scraping side area $R_O$ of the substrate W is a non-liquid supply side area to which the washing liquid is not supplied.

The single tube nozzle 63 supplies the chemical liquid so as to land with respect to the surface of the substrate W in the vicinity of the center O of the substrate W at a relatively low incident angle. Since the chemical liquid-landing on the surface of the substrate W has a flow to a direction parallel to the surface of the substrate W, and the centrifugal force is also weak in the vicinity of the center O of the substrate W, the chemical liquid passes through the bottom of the upper roll washing member 52 and enters the non-liquid supply side area, and thereafter, the chemical liquid is supplied to the counter washing area 521c from the non-liquid supply side area by the rotation of the substrate W. Thus, a sufficient quantity of fresh chemical liquid is supplied to the counter washing area 521c which has not been conventionally supplied with a sufficient quantity of fresh (uncontaminated) chemical liquid. To achieve such an entry of the chemical liquid, as described above, the angle formed between the discharge direction 631 of the single tube nozzle 63 and the extension direction (rotary axis) of the upper roll washing member 52 is most preferably 90°, but it is desirable to be within range of at least 90°±30°.

Seventh Embodiment

Figure 18:
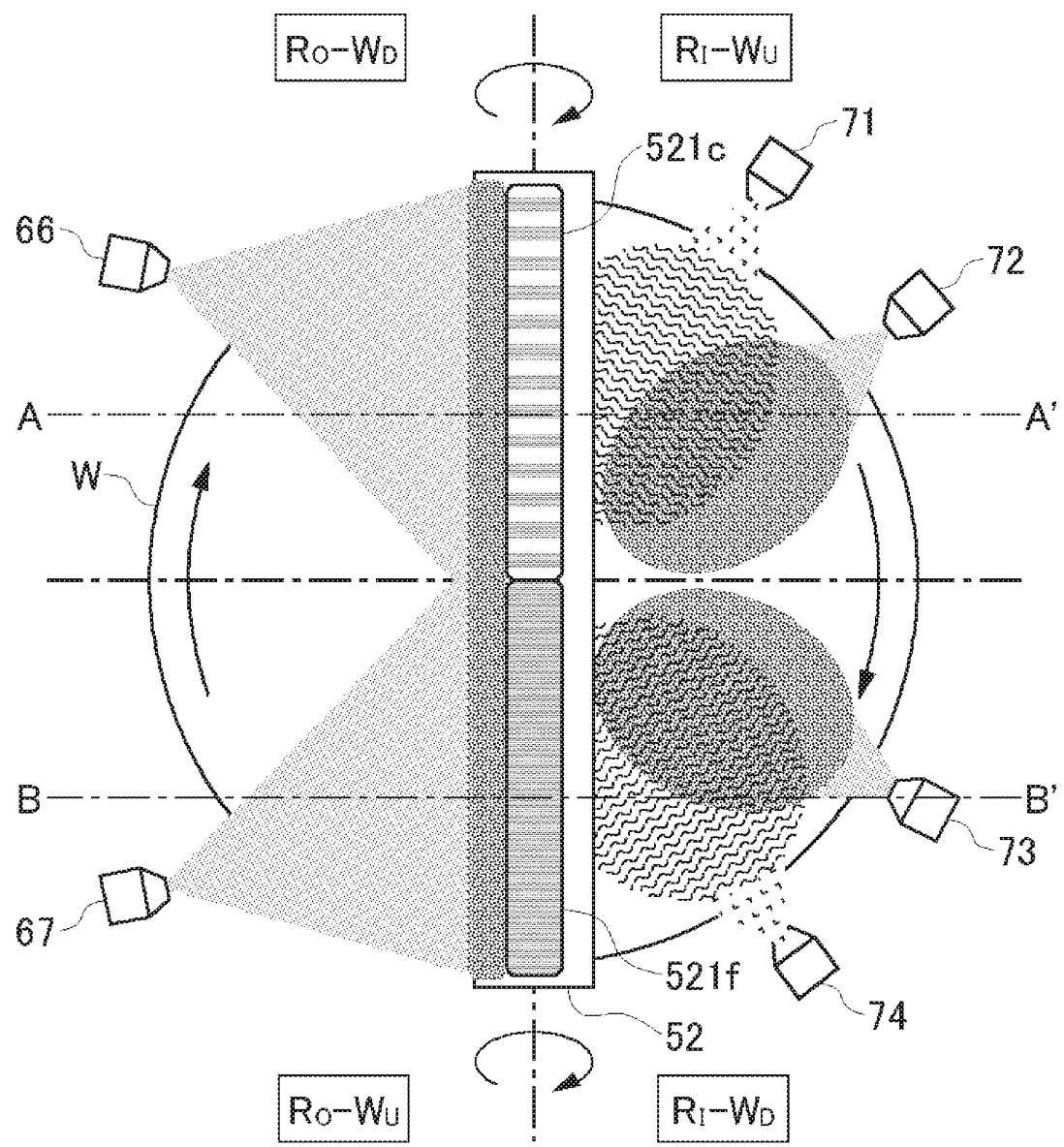
FIG. 18 is a plane view of a roll washing device in a seventh embodiment.
Figure 19:
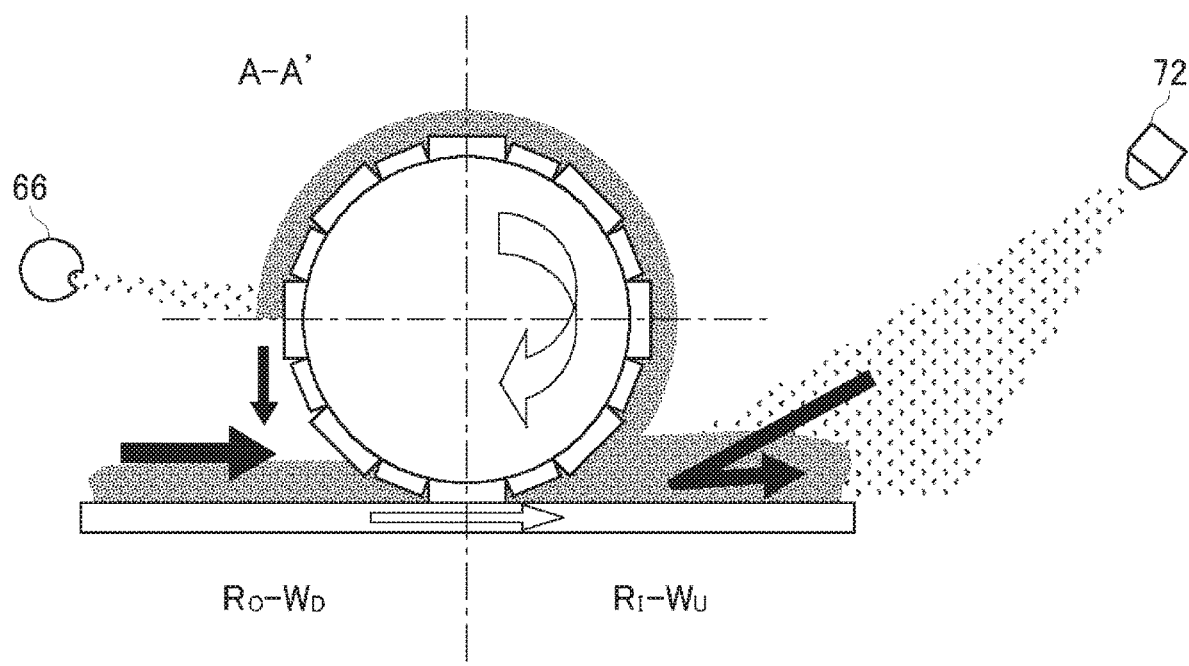
FIG. 19 is a cross-sectional view taken from a line A-A' of FIG. 18.
Figure 20:
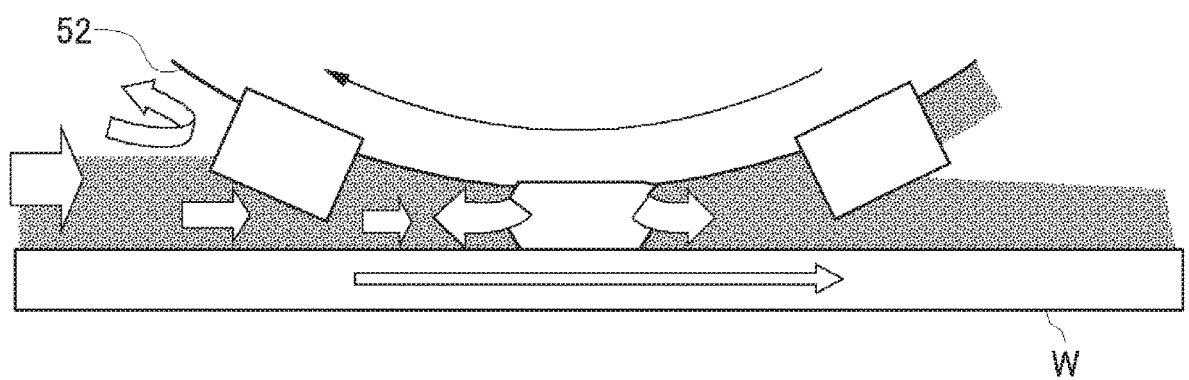
FIG. 20 is a partially enlarged view of FIG. 19.
Figure 21:
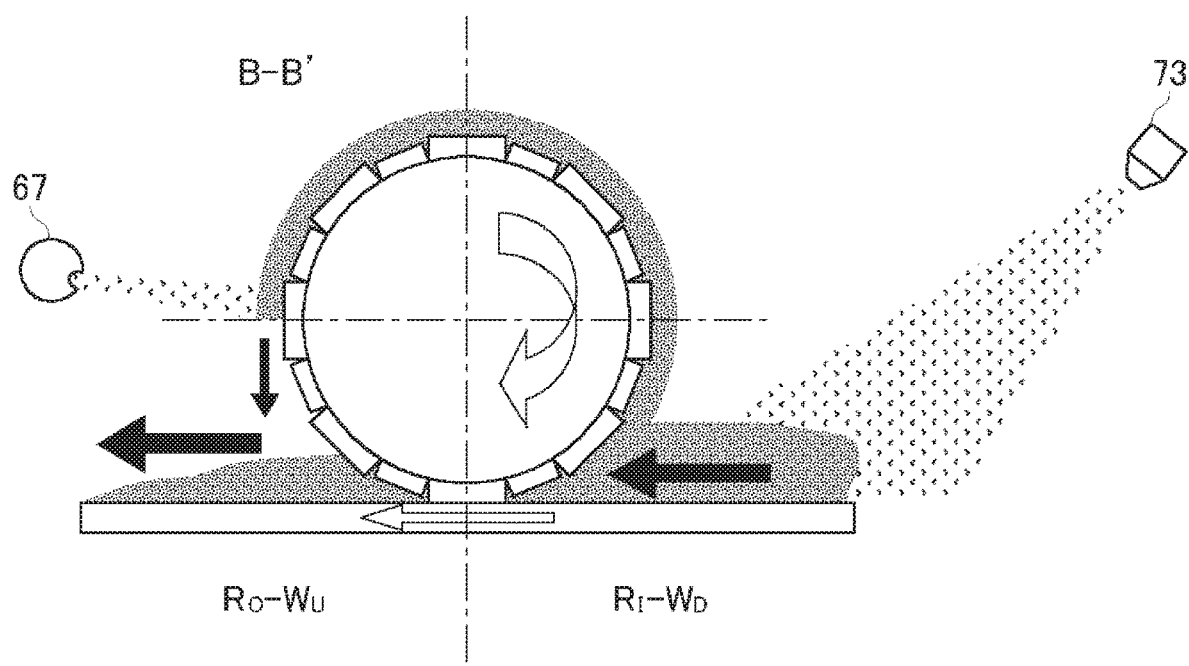
FIG. 21 is a cross-sectional view taken from a line B-B' of FIG. 18.

A seventh embodiment is also intended to solve the same problems as the sixth embodiment. FIG. 18 is a plan view of a roll washing device according to a seventh embodiment, FIG. 19 is a cross-sectional view taken from a line A-A' of FIG. 18, FIG. 20 is a partially enlarged view of FIG. 19, and FIG. 21 is a cross-sectional view taken from a line B-B' of FIG. 18. As illustrated in FIG. 18, the roll washing device includes four spray nozzles 71 to 74. All the spray nozzles 71 to 74 are nozzles which spray a washing liquid in a conical shape. All the spray nozzles 71 to 74 supply the washing liquid to the roll winding side area of the substrate W. The spray nozzles 71 and 74 spray the rinse liquid as the washing liquid, and the spray nozzles 72 and 73 spray the chemical liquid as the washing liquid. The liquid-landing areas of the rinse liquid sprayed from the spray nozzles 71 and 74 reach the upper roll washing member 52, and a part of the rinse liquid is directly sprayed to the upper roll washing member 52. In addition, as the spray nozzles 71 to 74, instead of the nozzle which sprays the washing liquid in a conical shape, it is also possible to adopt a nozzle which sprays the rinse liquid in a fan shape and an asymmetric fan-shaped spray nozzle in which a direction of a maximum flow rate (spraying quantity) is shifted from the center of the sprayed rinse liquid.

The washing device of this embodiment further includes spray nozzles 66 and 67 which directly spray the chemical liquid to the roll scraping side of the upper roll washing member 52 from the roll scraping side of the substrate W. The spray nozzles 66 and 67 are fan-shaped spray nozzles. As illustrated in FIG. 18, the spray nozzle 66 sprays the chemical liquid to the roll scraping side of the upper roll washing member 52 in the roll scraping downstream area $R_O\text{-}W_D$, and the spray nozzle 67 sprays the chemical liquid to the roll scraping side of the upper roll washing member 52 in the roll scraping upstream area $R_O\text{-}W_U$. As illustrated in FIGS. 19 and 21, each of the spray nozzles 66 and 67 sprays the chemical liquid to the middle stage position in the height direction of the upper roll washing member 52. In addition, the nozzle, which directly supplies the chemical liquid to the roll scraping side of the upper roll washing member 52, is not limited to the spray nozzle, and may be a porous nozzle or a slit nozzle.

As illustrated in FIG. 19, the chemical liquid supplied to the roll winding side upstream area $R_I\text{-}W_U$ from the spray nozzle 72 does not reach the counter washing area 521c by the rotation of the substrate W, and flows so as to be away from the counter washing area 521c.

Also, as described above, in the conventional washing device, the protrusions of the roll washing member 52 reaching the counter washing area 521c are immersed with the rinse liquid in advance, and since the protrusions are crushed by the counter washing area 521c and the immersed rinse liquid is discharged from the protrusions, the washing liquid from the roll scraping downstream area $R_O\text{-}W_D$ as a non-liquid supply area is hard to enter the counter washing area 521c.

According to the washing device of this embodiment, the protrusions crushed by the counter washing area 521c are released by rotation and have the bulging shapes, and thus, it enters a state of easily absorbing the liquid. Then, as illustrated in FIG. 19, the fresh chemical liquid is supplied to the protrusions of such a state by the spray nozzle 66, and the chemical liquid is immersed into the protrusions. By the rotation of the upper roll washing member 52, when the protrusions immersed with the chemical liquid reaches the counter washing area 521c, as illustrated in FIG. 20, the protrusions are crushed, and the fresh chemical liquid is supplied to the counter washing area 521c. Also, since the fresh chemical liquid supplied by the spray nozzle 66 is also retained between the plurality of protrusions of the upper roll washing member 52, the fresh chemical liquid is also supplied to the counter washing area 521c.

Furthermore, as illustrated in FIG. 19, in the chemical liquid sprayed toward the upper roll washing member 52 by the spray nozzle 66, the chemical liquid, which is not absorbed or retained by the upper roll washing member 52, drops on the surface of the substrate W therefrom. The dropped chemical liquid is transported to the counter washing area 521c by the rotation of the substrate W. Thus, even by the dropped chemical liquid, the fresh chemical liquid from the spray nozzle 66 is supplied to the counter washing area 521c.

As illustrated in FIG. 21, even in the forward washing area 521f, the chemical liquid sprayed from the spray nozzle 67 is directly sprayed to the role scraping side of the upper roll washing member 52, and the chemical liquid absorbed or retained in the upper roll washing member 52 is supplied to the forward washing area 521f from the roll winding side by the rotation of the upper roll washing member 52. Meanwhile, the chemical liquid, which is sprayed from the spray nozzle 67 but drops on the surface of the substrate W without being absorbed or retained in the upper roll washing member 52, is transported to the counter washing area 521c by the rotation of the substrate W.

As described above, according to the washing device of this embodiment, it is possible to supply a sufficient quantity of fresh chemical liquid to the counter washing area 521c and to improve the chemical liquid washing characteristics of the counter washing area 521c.

In the seventh embodiment, although the chemical liquid is directly supplied to the upper roll washing member 52 by the spray nozzle 66, the embodiment is not limited to this, and the chemical liquid may be directly supplied to the upper roll washing member 52 by the porous nozzle or the slit nozzle.

Eighth Embodiment

Figure 22:
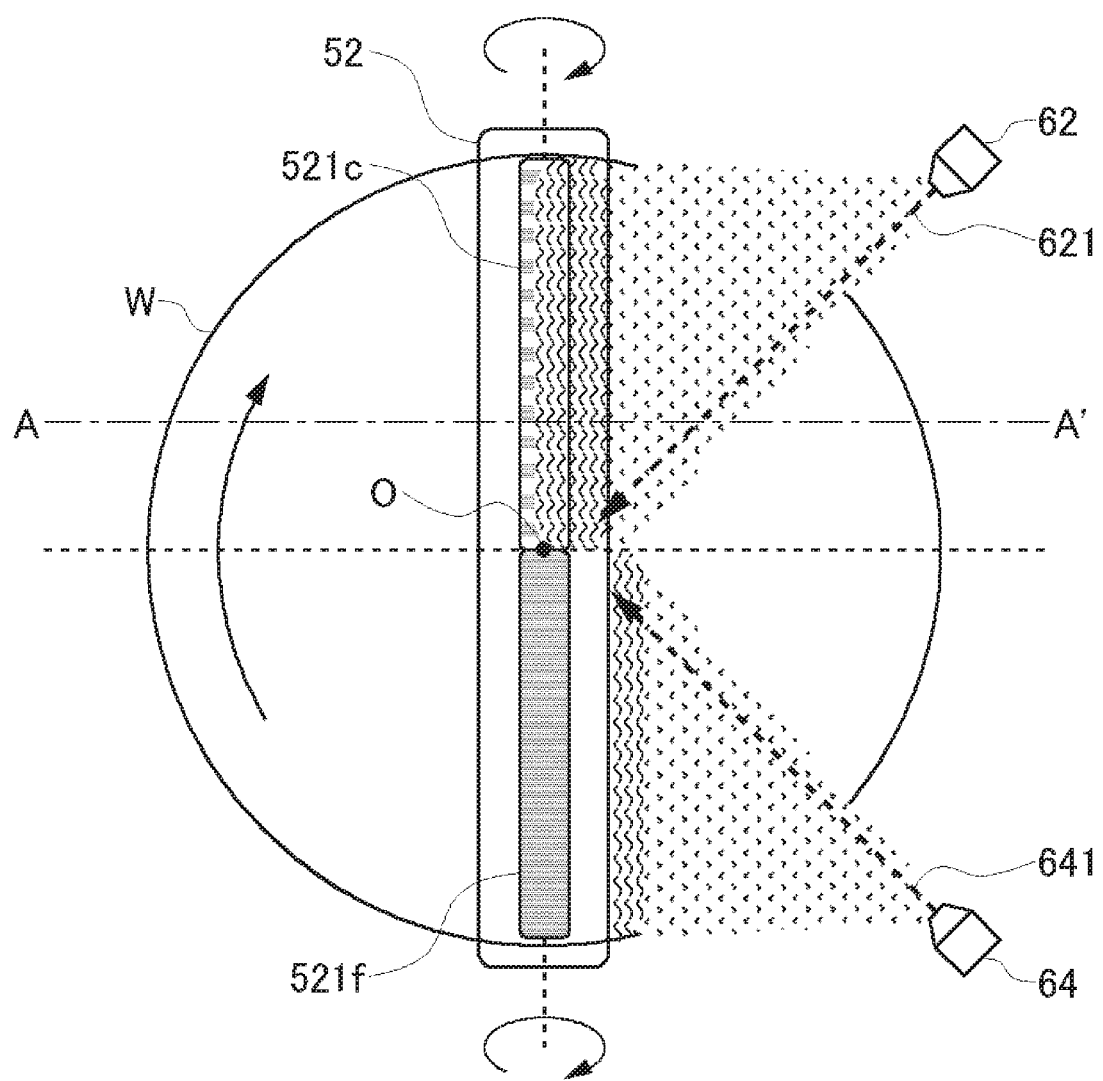
FIG. 22 is a plane view of a roll washing device in an eighth embodiment.
Figure 23:
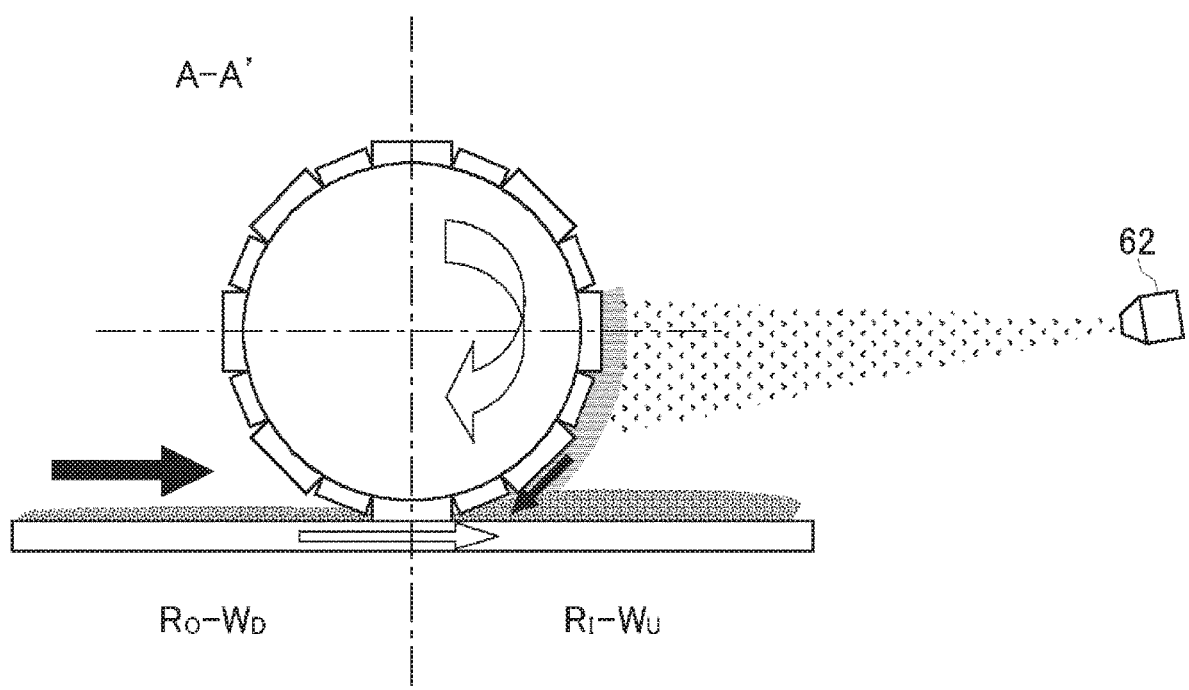
FIG. 23 is a cross-sectional view taken from a line A-A' of FIG. 22.

An eighth embodiment is also intended to solve the same problems as the seventh embodiment. FIG. 22 is a plan view of a roll washing device according to the eighth embodiment, and FIG. 23 is a cross-sectional view taken from a line A-A' of FIG. 22. As illustrated in FIG. 22, the roll washing device includes two spray nozzles 62 and 64. The spray nozzles 62 and 64 spray the chemical liquid to the roll winding side area of the substrate W. Both the spray nozzles 62 and 64 are asymmetric fan-shaped spray nozzles as described in the fourth embodiment. Both the maximum spraying quantity directions 621 and 641 are directed to the center O of the substrate W in a plan view. An angle between the maximum spraying quantity directions 621 and 641 is, but not limited to, approximately 90°.

A liquid-landing area of the spray nozzle 62 extends to the outer circumference of the substrate W from the center O of the substrate W along the counter washing area 521c. The liquid-landing area of the spray nozzle 64 extends to the outer circumference of the substrate W from the center O of the substrate W along the forward washing area 521f. Both the liquid-landing areas of the spray nozzles 62 and 64 overlap the upper roll washing member 52, that is, as illustrated in FIG. 23, at least a part or all of the chemical liquid sprayed from the spray nozzles 62 and 64 directly reaches the roll winding upstream side (right part) of the upper roll washing member 52.

Thus, even in this embodiment, by increasing the flow rate of the chemical liquid toward the center O of the substrate W using an asymmetric fan-shaped spray nozzle, the chemical liquid supplied to the vicinity of the center O of the substrate W flows in a direction away from the center O as it is by the inertial force, and flows toward the outer circumference by the centrifugal force after being away from the center O. Thus, the collision between the chemical liquid flowing toward the center O from the outside of the vicinity of the center O and the chemical liquid flowing toward the outer circumference from the vicinity of the center O by the centrifugal force does not occur, and the fluidity is not lowered.

Further, in this embodiment, since at least a part or all of the chemical liquid is directly sprayed to the roll winding upstream side of the upper roll washing member 52 from the spray nozzle 62, it is possible to sufficiently supply a fresh chemical liquid between the protrusions of the portion and to solve the problems described above with reference to FIG. 14.

Hereinafter, although an example of applying the present technique to the pencil washing device will be described as ninth and tenth embodiments, prior to the description of each embodiment, a general configuration of the pencil washing device will be described.

Figure 24:
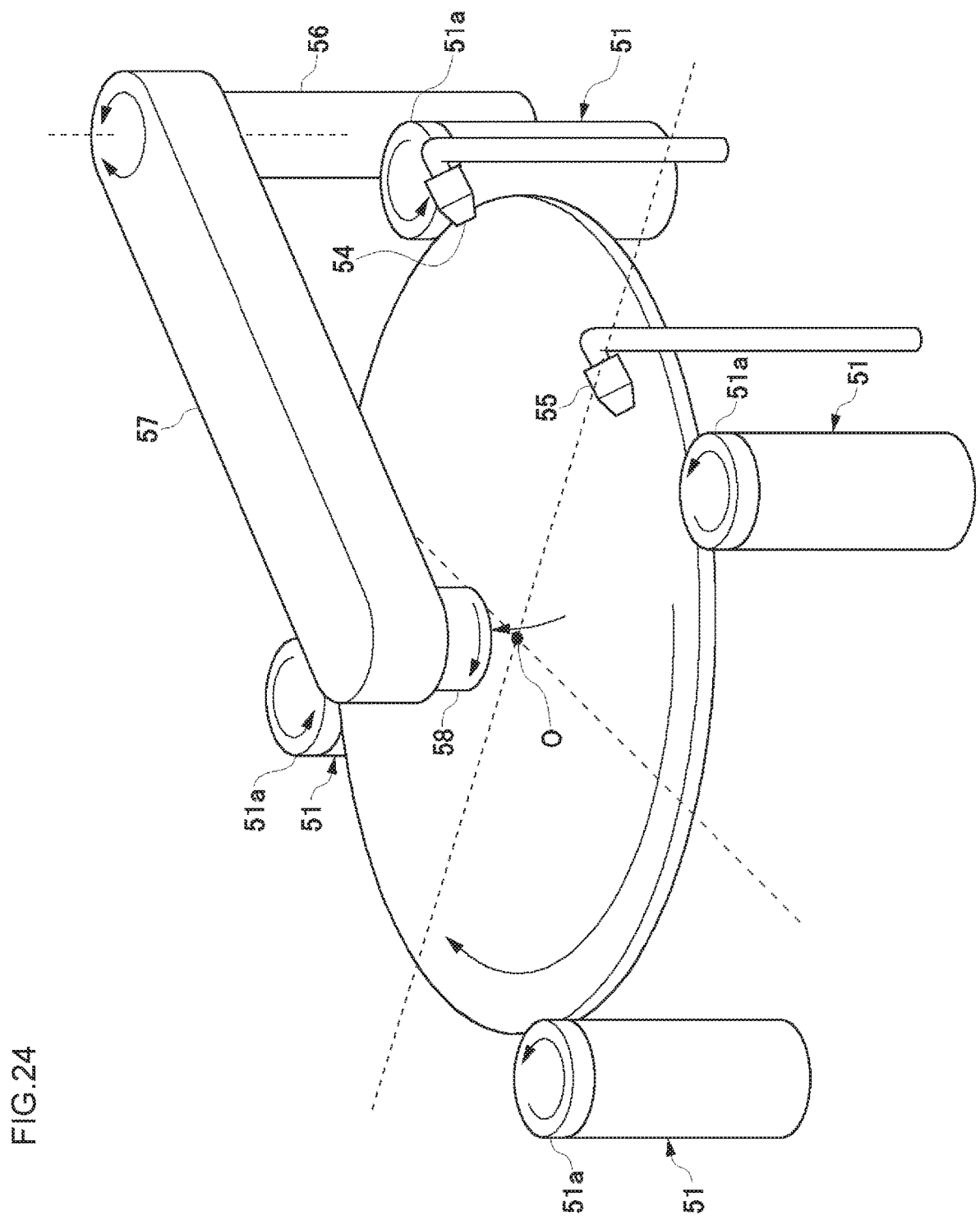
FIG. 24 is a perspective view illustrating an outline of a pencil washing device according to an embodiment.

FIG. 24 is a perspective view illustrating an outline of a pencil washing device according to an embodiment. As illustrated in FIG. 24, a pencil washing device 80 includes, as a substrate rotation mechanism, a plurality of (four in FIG. 24) same spindles 51 as the roll washing device 50 described using FIG. 9, a column 56 which is movable up and down and vertically extends, an arm 57 which is rotatably attached to a leading end of the column 56 at its one end and horizontally extends, and a cylindrical pencil washing member 58 (columnar sponge) which is rotatably attached to the lower surface of the other end of the arm 57. Also, the two washing liquid supply nozzles 54 and 55 are disposed which are positioned above the substrate W rotated by being supported by the spindle 51 to supply the washing liquid to the surface of the substrate W. The washing liquid supply nozzle 54 is a nozzle which supplies the rinse liquid (for example, ultrapure water) to the surface of the substrate W, and the washing liquid supply nozzle 55 is a nozzle which supplies the chemical liquid to the surface of the substrate W.

The pencil washing member 58 is held by a holding member (not illustrated), is rotatably provided on the lower surface of the leading end portion of the arm 57, and rotates (turns) about the central axis as a rotary axis by a drive mechanism (not illustrated). The rotary axis is an axis perpendicular to the substrate W. The pencil washing member 58 is made of, for example, PVA. When the arm 57 rotates about the column 56, the pencil washing member 58 attached to the leading end portion of the arm 57 moves over the substrate W while drawing an arc-shaped trajectory. Since the leading end portion of the arm 57 extends to the center O of the substrate W, the movement trajectory of the pencil washing member 58 passes through the center O of the substrate W. Furthermore, the pencil washing member 58 is moved to the outer circumference of the substrate W. Thus, the movement trajectory of the pencil washing member 58 due to the rotation of the arm 57 becomes a circular arc shape, a radius of which is the length of the arm 57, and its movement range is from the outer circumference of the substrate W to the point where it passes through the center O of the substrate W.

In a state of horizontally rotating the substrate W by the substrate rotation mechanism, while supplying the rinse liquid to the surface of the substrate W from the washing liquid supply nozzle 54, and supplying the chemical liquid to the surface of the substrate W from the washing liquid supply nozzle 55, the pencil washing member 58 is rotated (turned), the pencil washing member 58 is revolved by rotating the arm 57 to be brought into contact with the surface of the substrate W during rotation, and thus, in the presence of the washing liquid (rinse liquid and chemical liquid), the surface of the substrate W is scrubbed and washed by the pencil washing member 58.

Hereinafter, the ninth and tenth embodiments will be described, but each of the embodiments differs in the configuration of the washing liquid supply nozzle.

Ninth Embodiment

Figure 25:
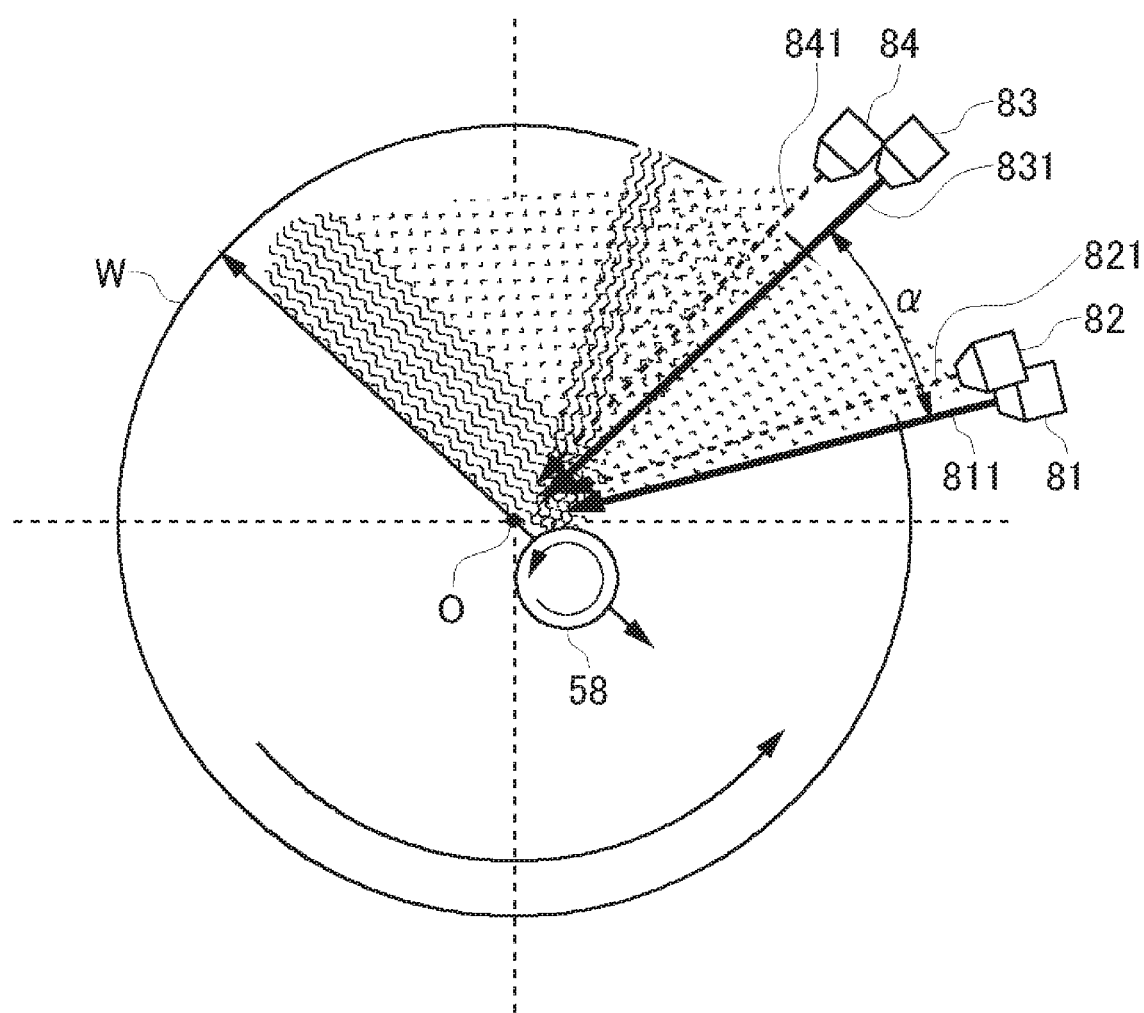
FIG. 25 is a plan view of a washing device in a ninth embodiment.

FIG. 25 is a plan view of a washing device in a ninth embodiment. In FIG. 25, the spindle 51, the column 56 and the arm 57 are not illustrated. Moreover, the movement trajectory of the pencil washing member 58 as described above has a circular arc shape which has the arm 57 as a radius, but when the arm 57 is sufficiently long, since the trajectory of the pencil washing member 58 can be regarded as a substantially linear shape, in FIG. 25, the movement trajectory of the pencil washing member 58 is illustrated by a straight line. In FIG. 25, the substrate W rotates in a counterclockwise direction.

The washing device includes a single tube nozzle 81 which discharges the rinse as a washing liquid, and a single tube nozzle 83 which discharges the chemical liquid as a washing liquid. The single tube nozzles 81 and 83 discharge the washing liquid toward the surface (upper surface) of the substrate W from the outside of the upper space of the substrate W above the substrate W. That is, the single tube nozzles 81 and 83 supply the washing liquid to the surface of the substrate W obliquely from the top. The rinse liquid may be ultrapure water (DIW), and may be functional water such as hydrogen water. Solution (acidic chemical liquid or weak alkaline chemical liquid) other than electrolytic liquid (liquid in the vicinity of pH 7) is used as the chemical liquid. Organic acids, for example, such as citric acid or oxalic acid are used as the acidic chemical liquid, and for example, organic alkali is used as the weak alkaline chemical liquid.

The positions, the discharge directions, the bore diameters and the flow speed of the single tube nozzles 81 and 83 are set under the same conditions as described for the single tube nozzle 41 in the first embodiment, respectively. In addition, the single tube nozzle 81 is set so that the discharge direction is directed to the center O of the substrate W in a plan view and the liquid-landing position becomes the front of the center O of the substrate W. However, both the single tube nozzles 81 and 83 supply the rinse liquid to the upstream side in the rotational direction of the substrate W from the movement trajectory of the pencil washing member 58. That is, the single tube nozzles 81 and 83 discharge the rinse liquid so that the liquid-landing position becomes the upstream side of the trajectory of the pencil washing member 58. An angle α between the discharge directions 811 and 831 of the single tube nozzles 81 and 83 is approximately 30° in a plan view, but the angle α is not limited to 30°.

The washing device is further provided with a spray nozzle 82 which sprays the rinse liquid as a washing liquid, and a spray nozzle 84 which sprays the chemical liquid as a washing liquid. These spray nozzles 82 and 84 also supply the chemical liquid to the upstream side in the rotational direction of the substrate W from the movement trajectory of the pencil washing member 58. Although the spray nozzles 82 and 84 are approximately at the same positions as those of the single tube nozzles 81 and 83 in a plan view, respectively, in a manner similar to that illustrated in FIG. 3(b), the incident angles of the spray nozzles 82 and 84 are greater than the incident angles of the single tube nozzles 81 and 83, and the spray nozzles 82 and 84 spray the washing liquid from the further upper part.

Both the spray nozzles 82 and 84 are asymmetric fan-shaped spray nozzles as described in the fourth embodiment, and the positions, the injection directions or the like are the same as those of the spray nozzles 44 and 45 described in the modified example (FIG. 8) of the fourth embodiment. That is, the maximum spraying quantity directions 821 and 841 are directed to the center O of the substrate W in a plan view. An angle between the maximum spraying quantity directions 821 and 841 is also approximately 30°. The liquid-landing areas of the spray nozzles 82 and 84 extend to the outer circumference of the substrate W from the washing area 521 near the center O of the substrate W.

The single tube nozzle 81 and the spray nozzle 82, which supply the rinse liquid, supply the washing liquid to the upstream side in the rotational direction of the substrate W than the single tube nozzle 83 and the spray nozzle 84 which supply the chemical liquid. In particular, the liquid-landing area of the spray nozzle 84 which sprays the chemical liquid becomes a position just before (upstream) of the movement trajectory along the movement trajectory of the pencil washing member 58. By supplying both the rinse liquid and the chemical liquid to the surface of the substrate W, on the surface of the substrate W that passes through the movement trajectory of the pencil washing member 58, there is a state where the chemical liquid and the rinse liquid are mixed with each other. In addition, on the downstream side in the rotational direction of the substrate W from the movement trajectory of the pencil washing member 58, the washing liquid which passed through the movement trajectory of the pencil washing member 58 is discharged from the outer circumference of the substrate W, by the centrifugal force due to the rotation of the substrate W.

According to the washing device of this embodiment, it is possible to supply a sufficient quantity of fresh washing liquid to the position at which scrubbing and washing are performed by the pencil washing member 58.

Tenth Embodiment

Figure 26:
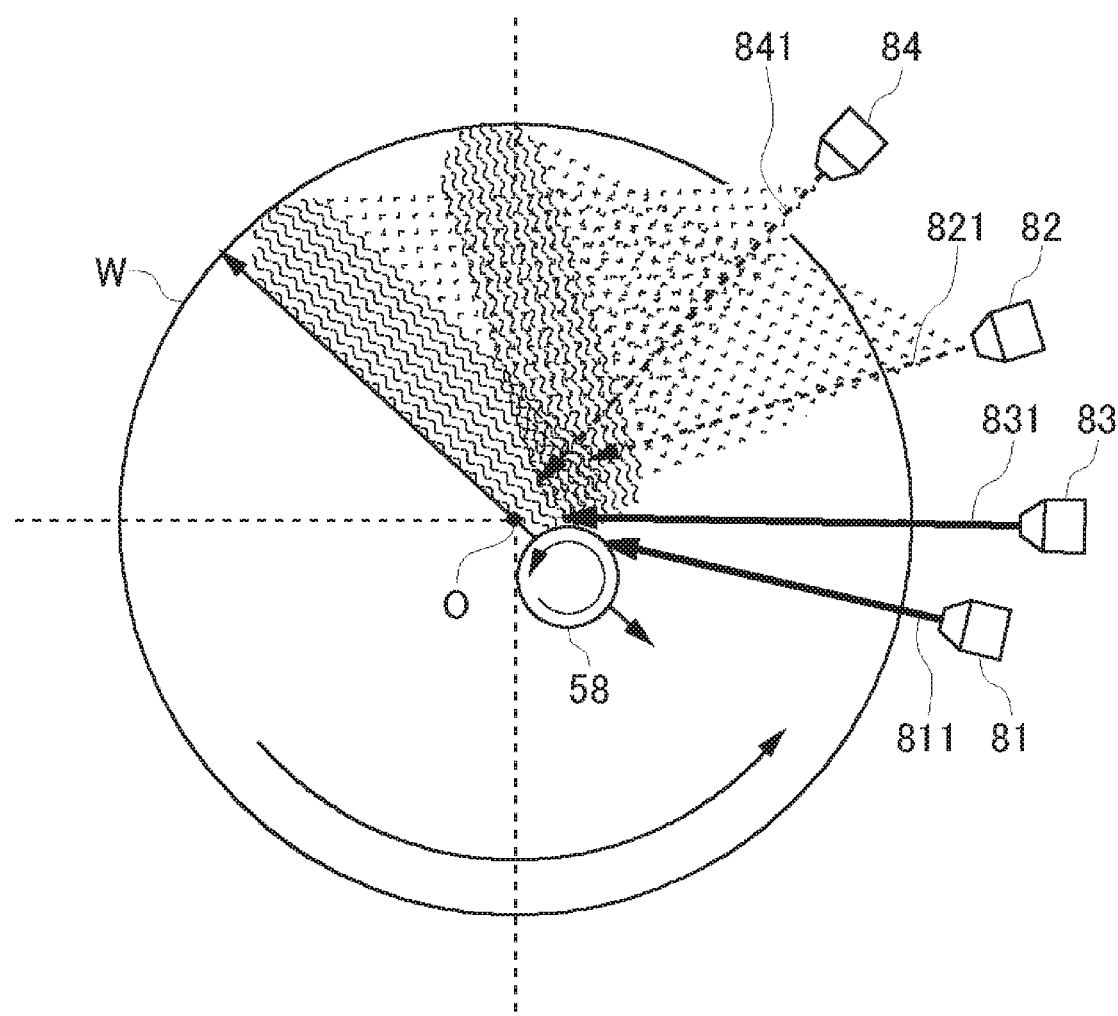
FIG. 26 is a plan view of a washing device in a tenth embodiment.

FIG. 26 is a plan view of a washing device in a tenth embodiment. In this embodiment, only arrangements of single tube nozzles 81 and 83 and a spray nozzle 82 in a plan view are different from those of the ninth embodiment, and other configurations are the same as those of the ninth embodiment. In this embodiment, the single tube nozzles 81 and 83 are provided on the upstream side in the rotational direction of the substrate W than the spray nozzles 82 and 84. The discharge directions 811 and 831 of the single tube nozzles 81 and 83 are directed to the center O of the substrate W in a plan view, similarly to the ninth embodiment. Also, a maximum spraying quantity direction 821 of the spray nozzle 82 is directed to the center O of the substrate W in a plan view.

In this embodiment, as compared with the ninth embodiment, an angle between the discharge directions 811 and 831 of the single tube nozzles 81 and 83, and an angle between the maximum spraying quantity directions 821 and 841 of the spray nozzles 82 and 84 are smaller than the case of the ninth embodiment, respectively. Thus, it is possible to avoid or reduce a situation in which the washing liquid discharged from the single tube nozzles 81 and 83 oppose each other on the surface of the substrate W and the flow of the washing liquid is disturbed, and similarly, it is possible to avoid or reduce a situation in which the washing liquid sprayed from the spray nozzles 82 and 84 oppose each other on the surface of the substrate W, and the flow of the washing liquid is disturbed.

In the ninth and tenth embodiments, the washing liquid is supplied to the upstream side in the rotational direction of the substrate W than the pencil washing member 58, but not limited thereto, and the washing liquid may be supplied to the downstream side in the rotational direction of the substrate W than the pencil washing member 58.

Eleventh Embodiment

Figure 27:
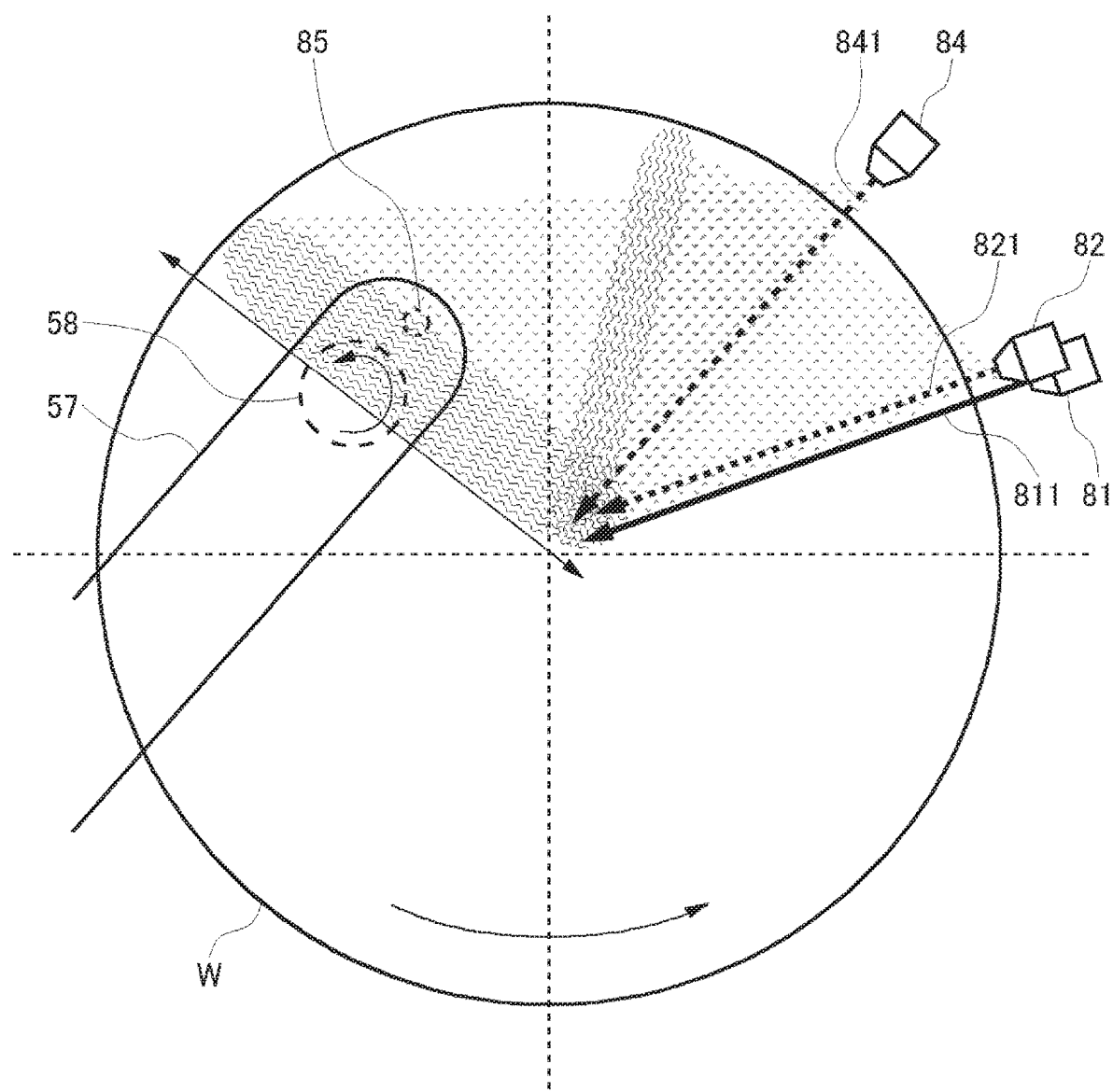
FIG. 27 is a plan view of a washing device in an eleventh embodiment.
Figure 28:
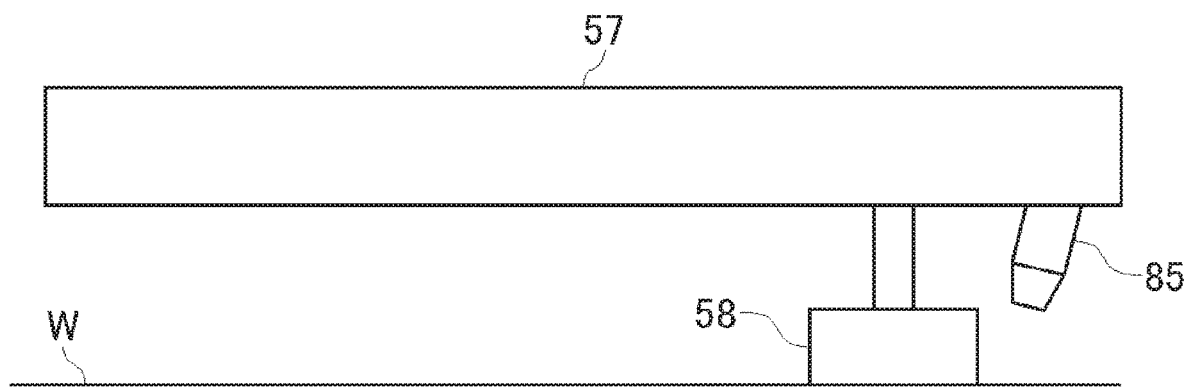
FIG. 28 is a diagram in which a longitudinal direction of an arm in the washing device of the eleventh embodiment is viewed from the side.

FIG. 27 is a plan view of a washing device in an eleventh embodiment, and FIG. 28 is a diagram in which the longitudinal direction of the arm 57 is viewed from the side. In the washing device of this embodiment, the pencil washing member 58 is supported on the leading end portion of the arm 57. The pencil washing member 58 washes the upper surface of the substrate W, by rotating about a central axis perpendicular to the substrate W and simultaneously by moving while sliding on the upper surface of the substrate W from the center of the substrate W to the outer circumference by the rotation of the arm 57. On the outer side of the outer circumference of the substrate W, a single tube nozzle 81 which discharges the rinse as the washing liquid, a spray nozzle 82 which sprays the rinse liquid as the washing liquid, and a spray nozzle 84 which sprays the chemical liquid as the washing liquid are provided by the arrangement similar to the ninth embodiment (see FIG. 25).

In this embodiment, the arm 57 is further provided with a spray nozzle 85 which sprays the chemical liquid as the washing liquid. In this way, the washing liquid supply nozzle, which is fixed to the arm 57 and oscillates by the rotation of the arm 57, is referred to as an on-arm washing liquid supply nozzle. The on-arm spray nozzle 85 is provided in the vicinity of the pencil washing member 58. Specifically, the spray nozzle 85 is provided adjacent to the pencil washing member 58, on the upstream side of the rotation of the substrate W with respect to the pencil washing member 58.

Figure 29:
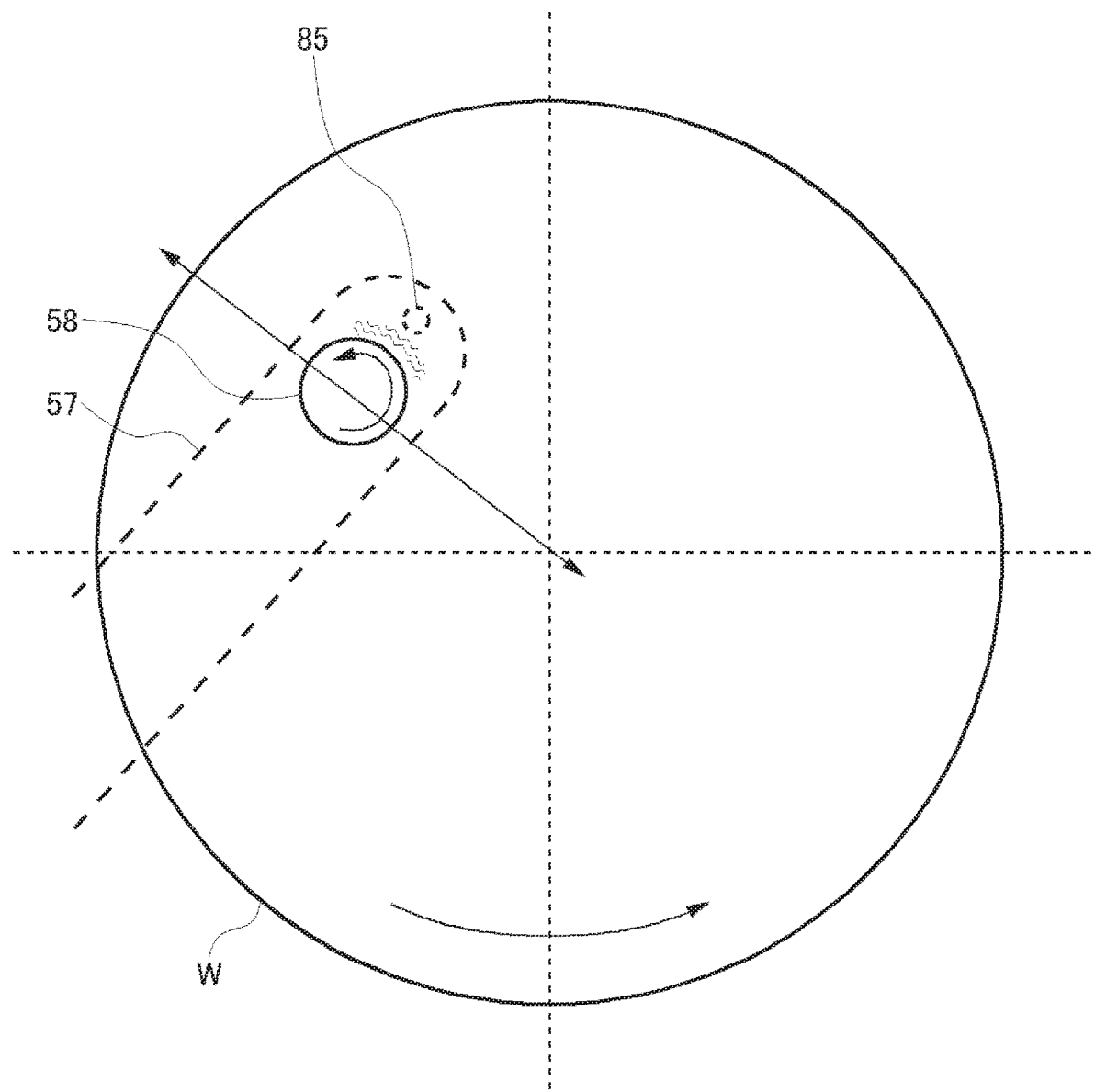
FIG. 29 is a diagram illustrating a liquid-landing area of the spray by a spray nozzle in the eleventh embodiment.

As illustrated in FIG. 28, the spray direction of the spray nozzle 85 is slightly inclined toward the pencil washing member 58. FIG. 29 is a diagram illustrating the liquid-landing area of the spraying using the spray nozzle 85. As illustrated in FIG. 29, the spray nozzle 85 is a nozzle which sprays the washing liquid in a fan shape, and, as described above, since its spray direction is slightly inclined toward the pencil washing member 58, the washing liquid sprayed from the spray nozzle 85 spreads in the radial direction of the pencil washing member 58 and lands between the spray nozzle 85 and the pencil washing member 58.

As the on-arm washing liquid supply nozzle, it is also possible to adopt a single tube nozzle, but in the case of the single tube nozzle, when discharging the washing liquid toward the pencil washing member 58, the washing liquid becomes a lump and is locally supplied to the pencil washing member 58. Then, the washing liquid is repelled by the pencil washing member 58, and the washing liquid supplied to the lower surface (washing surface) of the pencil washing member 58 as a washing location decreases. In comparison, when the spray nozzle 85 is used as a washing liquid supply nozzle provided to be inclined in a direction toward the pencil washing member 58 in the vicinity of the pencil washing member 58, since the washing liquid is supplied in a relatively wide range around the pencil washing member 58, such problems are reduced.

Further, in this embodiment, since the on-arm spray nozzle 85 is provided on the upstream side in the rotational direction of the substrate W with respect to the pencil washing member 58 to spray the washing liquid toward the pencil washing member 58, it is possible to provide the just sprayed and land fresh washing liquid to a sliding-contact position (washing location) between the pencil washing member 58 and the substrate W.

In this embodiment, although the washing liquid is supplied to a region including the center of the substrate W from the outside of the substrate W as well as the on-arm washing liquid supply nozzle, this is to prevent a situation in which the washing liquid is not supplied to the central portion of the substrate W and the upper surface of the substrate W is dried, only in the on-arm spray nozzle 85, when the pencil washing member 58 and the spray nozzles 85 moving integrally therewith are located on the outer circumferential side of the substrate W. Therefore, in the case of providing the on-arm washing nozzle in the pencil washing member 58, when the washing liquid is always supplied to the central portion of the substrate W by at least one washing nozzle which is fixedly provided, it is possible to prevent the drying of the entire surface of the substrate W. Thus, this case is desirable.

In addition, similarly to the embodiment described above, the chemical liquid may be supplied from the on-arm washing liquid supply nozzle, and the rinse liquid and/or the chemical liquid may be supplied from the outside of the substrate W. Further, the rinse liquid may be supplied from the on-arm washing nozzle, and the chemical liquid and/or the rinse liquid may be supplied from the outside of the substrate W. Also, the supply of the washing liquid from the outside of the substrate W may be provided by the spray nozzle, by the single tube nozzle, or by both of them similarly to the above-mentioned embodiments.

In addition, it is desirable that the pencil washing member 58 rotate so that the side (the upstream side in the rotational direction of the substrate W) supplied with the washing liquid by the on-arm washing liquid supply nozzle moves outward in the radial direction of the substrate, that is, rotate in the same direction as the substrate W in a plan view (counterclockwise direction in the case of FIG. 28). In the case of this rotational direction, in the chemical liquid supplied toward the pencil washing member 58 from the upstream side of the pencil washing member 58 by the spray nozzle 85, the washing liquid repelled on the side surface of the pencil washing member 58 is easily discharged toward the outer circumference of the substrate W by the rotation of the pencil washing member 58.

Twelfth Embodiment

Figure 30:
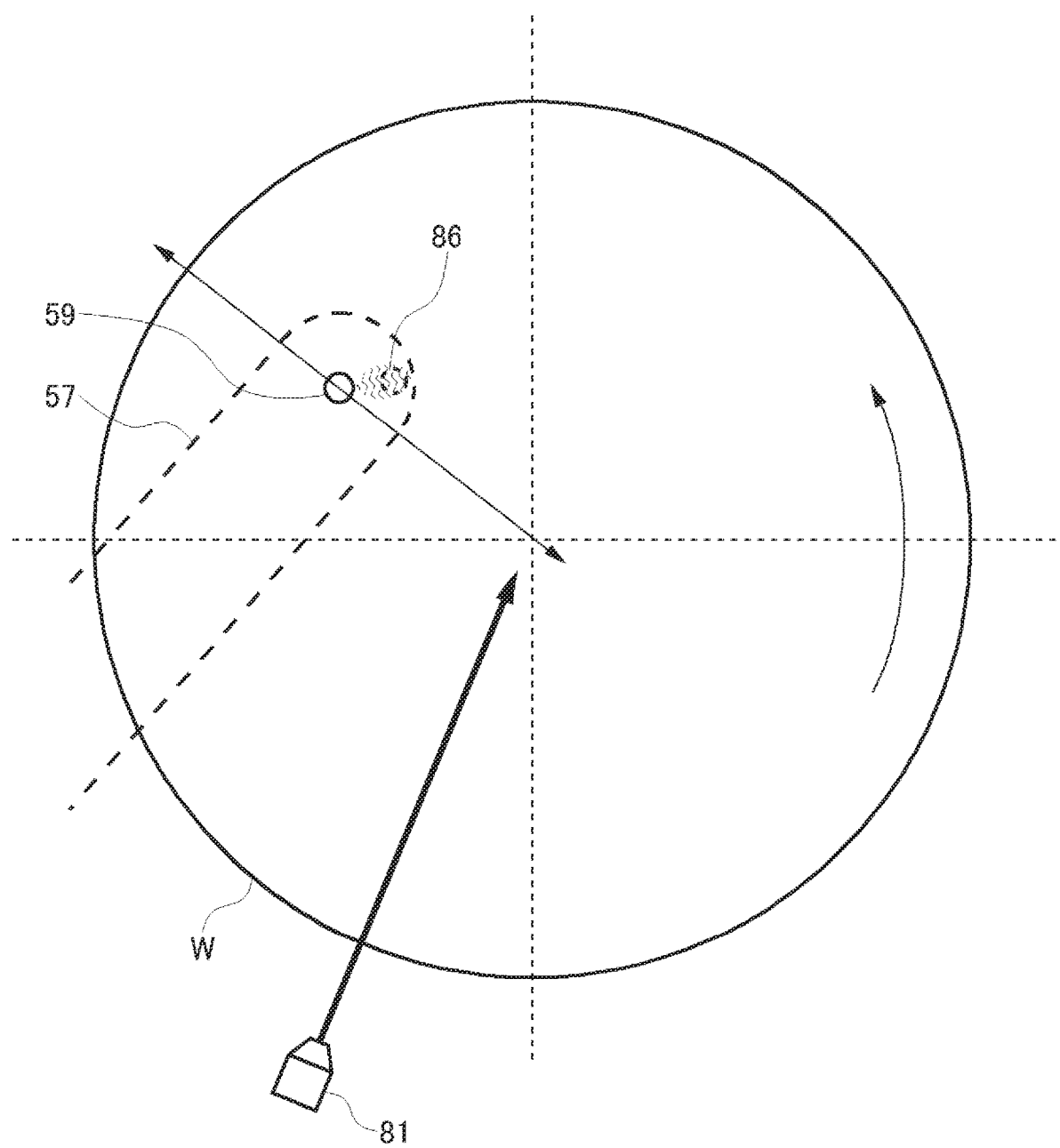
FIG. 30 is a plan view of a washing device in a twelfth embodiment.
Figure 31:
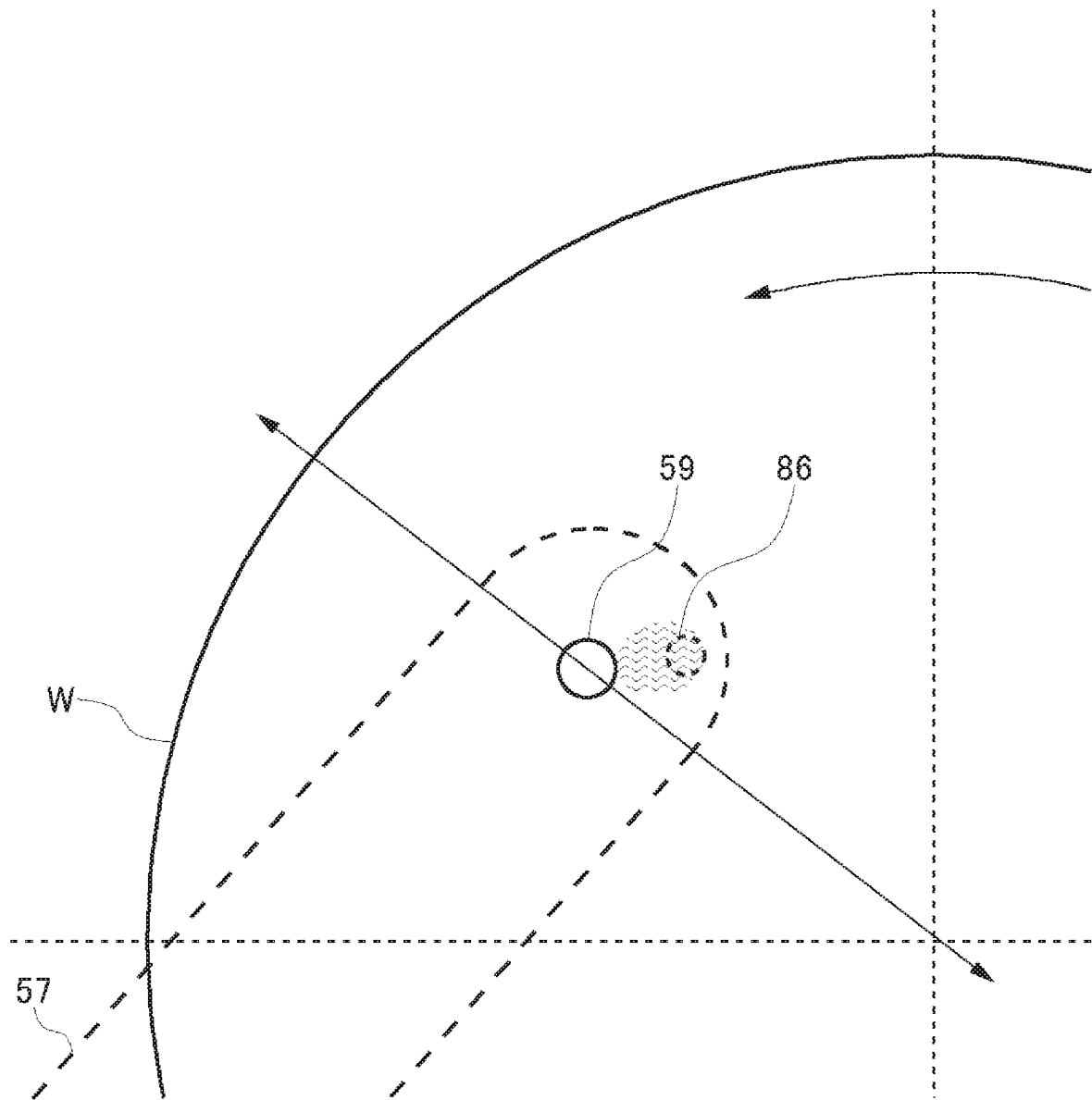
FIG. 31 is a partially enlarged view of the washing device in the twelfth embodiment.
Figure 32:
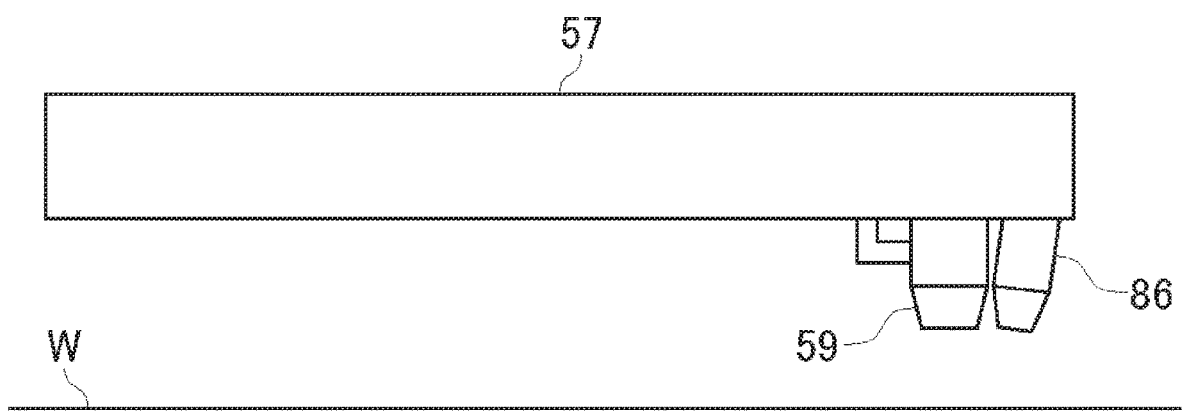
FIG. 32 is a diagram in which the longitudinal direction of the arm of the washing device in the twelfth embodiment is viewed from the side.

FIG. 30 is a plan view of a washing device in a twelfth embodiment, FIG. 31 is a partially enlarged view of FIG. 30, and FIG. 32 is a diagram in which the longitudinal direction of the arm 57 is viewed from the side. In the washing device of this embodiment, a two-fluid jet (2FJ) nozzle 59 is supported at the leading end portion of the arm 57. Also, in this embodiment, the arm 57 is also provided with an on-arm spray nozzle 86 which sprays the chemical liquid as the washing liquid.

Also, on the outer side of the substrate W, a single tube nozzle 81 is provided to discharge the rinse liquid as the washing liquid. Similarly to the above-described embodiments, the single tube nozzle 81 discharges the rinse liquid so that the rinse liquid lands in front of the center of the substrate W and the landed rinse liquid flows toward the center of the substrate W.

As clearly illustrated in FIG. 31, the spray nozzle 86 is provided in the vicinity of the 2FJ nozzle 59, and is provided to be closer to the center of the substrate W than the 2FJ nozzle 59 and on the upstream side in the rotational direction of the substrate W than the 2FJ nozzle 59. The spray nozzle 86 is a cone spray nozzle which sprays the chemical liquid in a conical shape. The chemical liquid injected from the spray nozzle 86 lands (contacts) on the upstream side of the rotation of the substrate W with respect to the position just below the 2FJ nozzle 59.

As illustrated in FIG. 32, the spray nozzle 86 is provided to be slightly inclined toward the 2FJ nozzle 59. As mentioned above, since the spray nozzles 86 is provided on the central side of the substrate W with respect to the 2FJ nozzle 59, and on the upstream side of the rotation of the substrate W, the chemical liquid is sprayed from the spray nozzle 86 to the outside of the substrate W and toward the downstream side of the rotation of the substrate W.

The meaning of providing the spray nozzle 86 in the vicinity of the 2FJ nozzle 59 to supply the chemical liquid will be described. One is that, by always supplying the fresh chemical liquid to the vicinity of the location at which the jet flow from the 2FJ nozzle 59 collides with the substrate W, particles lifted-up from the surface of the substrate W by the chemical liquid are rapidly removed by the flow of the jet flow, or the particles detached from the substrate W surface by the physical action of the jet flow are removed without adhering to the substrate W again by the action of the chemical liquid. Another meaning is the effect of preventing charging of the substrate W. In the 2FJ nozzle 59, the liquid is mixed with the gas to generate a jet flow, and the surface of the substrate W is washed by blowing it to the surface of the substrate W. However, when using ultrapure water (DIW) as a liquid at this time, by the jet flow colliding with the surface of the substrate W, the surface of the substrate W may be charged. Thus, in order to avoid such a charge, carbon dioxide water has been conventionally used as the liquid for generating the jet flow. However, cost of the carbon dioxide water is higher than that of the ultrapure water.

In this embodiment, the spray nozzle 86 is provided in the vicinity of the 2FJ nozzle 59 to supply the chemical liquid to the vicinity of the washing location at which the jet flow collides with the substrate surface. Since the chemical liquid itself has conductivity, when adopting such a chemical liquid, even if, for example, relatively cheap ultrapure water (DIW) rather than the carbon dioxide water is adopted as the liquid injected from the 2FJ nozzle 59, (since the chemical liquid has conductivity) the charge of the substrate W is not reduced.

Also, even in this embodiment, similarly to the eleventh embodiment, since the on-arm spray nozzle 86 is slightly inclined in the direction toward the washing location by the 2FJ nozzle 59 to perform the spraying, it is possible to sufficiently supply the chemical liquid to the washing location at which the jet flow collides with the substrate W. Further, in this embodiment, since the spray nozzle 86 is also inclined outward in the radial direction of the substrate W, it is possible to smoothly discharge the chemical liquid sprayed from the spray nozzle 86 toward the outer edge of the substrate W by the centrifugal force due to the rotation of the substrate W.

Figure 33:
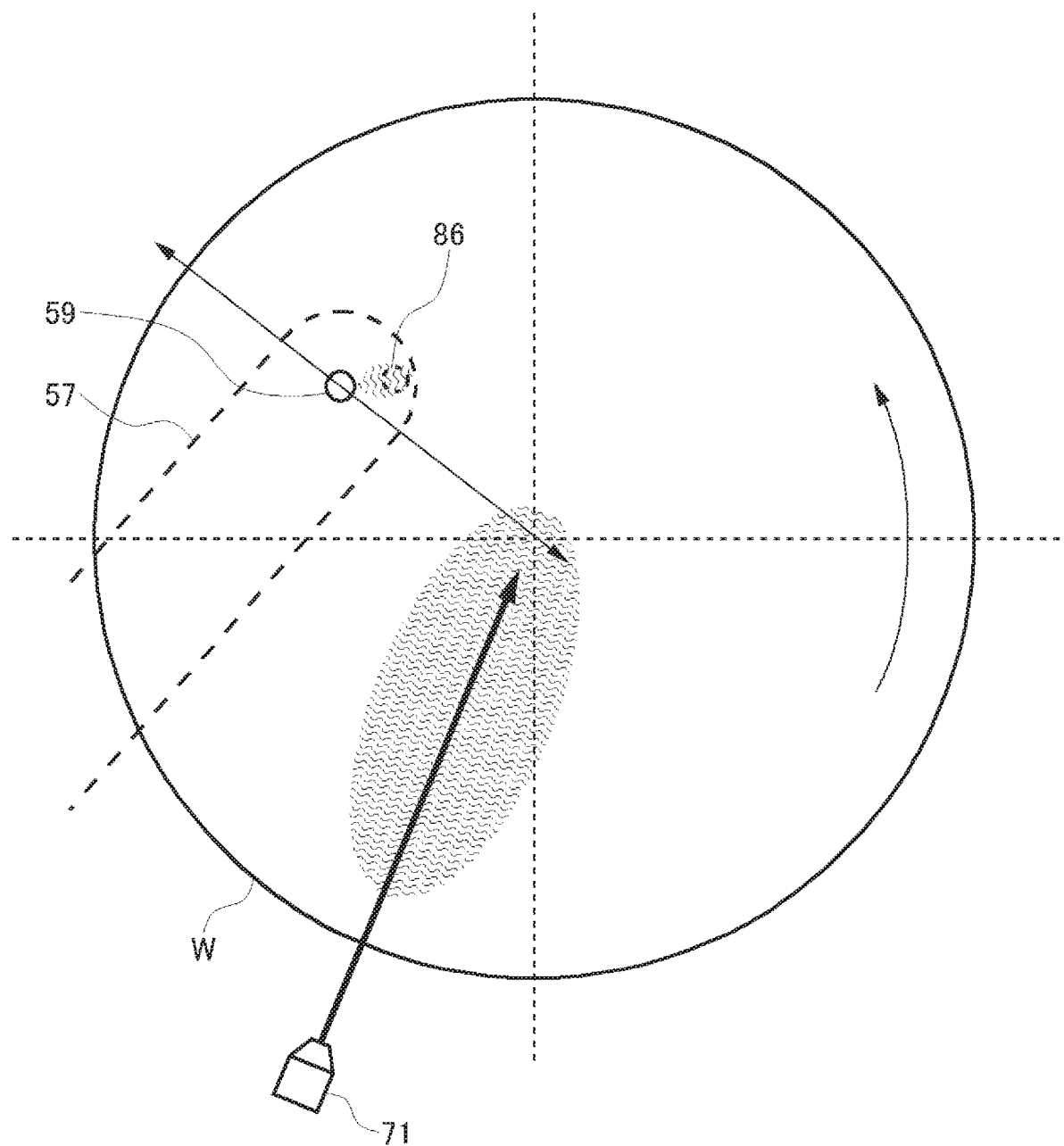
FIG. 33 is a plan view of the washing device in a modified example of the twelfth embodiment.

FIG. 33 is a plan view of a washing device in a modified example of the twelfth embodiment. In this modified example, a spray nozzle 71 rather than the single tube nozzle is provided outside the substrate W. The spray nozzle 71 is provided to spray the rinse liquid toward the center of the substrate W, so that the liquid-landing area is applied to the center from the front of the center of the substrate W and the landed rinse liquid flows toward the center of the substrate W.

In addition, the single tube nozzle 81 is provided outside the substrate W in the above-described embodiment, and the spray nozzle 71 is provided outside the substrate W in the modified example thereof. However, since the liquid injected from the 2FJ nozzle 59 spreads in all directions from the injection position, in a case where the liquid injected from the 2FJ nozzle 59 reaches the center of the substrate W even when the 2FJ nozzle 59 moves to the outer edge of the substrate W, it is possible to prevent the drying from the vicinity of the center of the substrate W even if the washing liquid supply nozzle is not provided outside the substrate W. Thus, in this case, a configuration in which the washing liquid supply nozzle is not provided outside the outer circumference of the substrate W apart from the on-arm spray nozzle 86 may be adopted.

Thirteenth Embodiment

Figure 34:
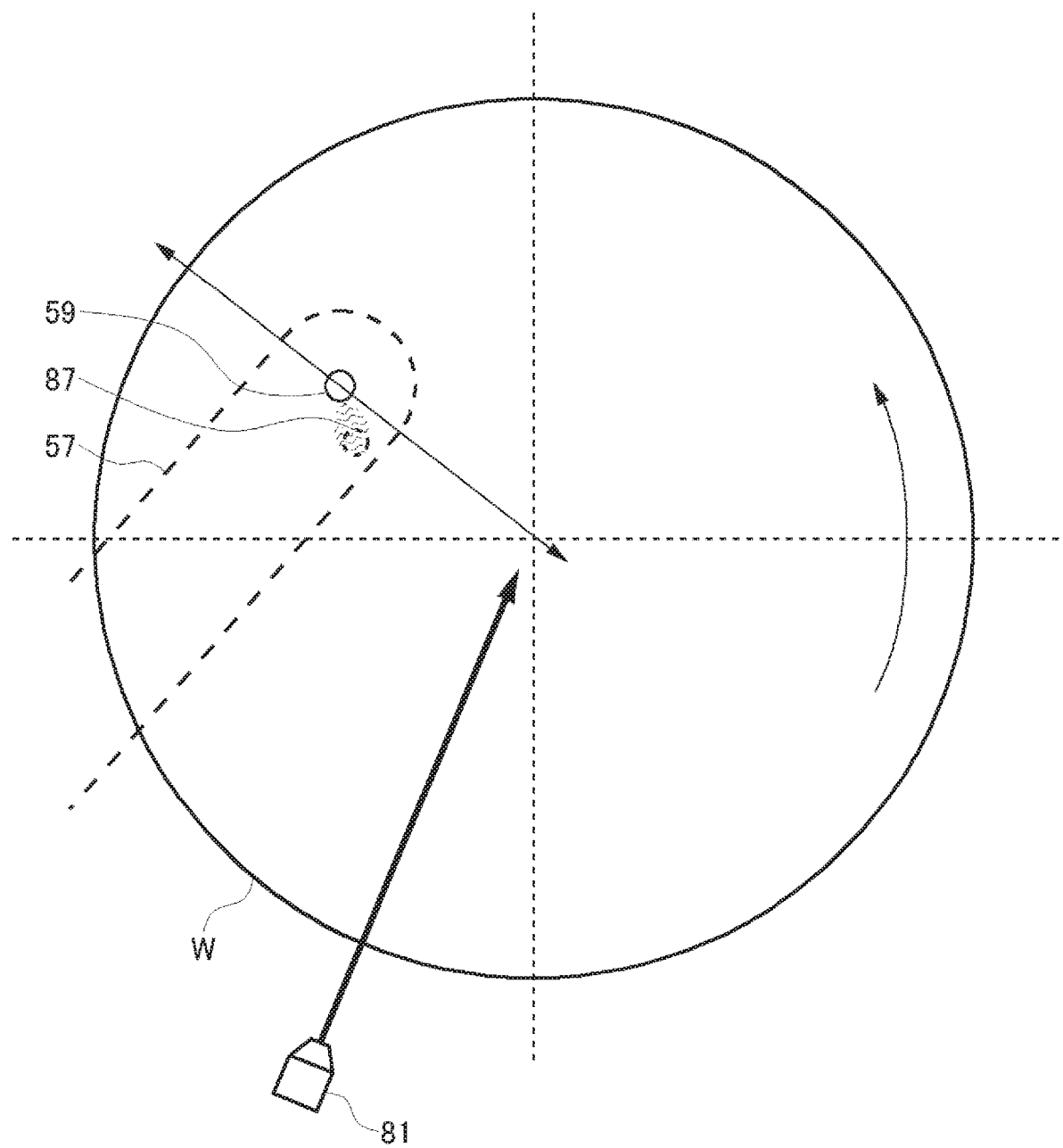
FIG. 34 is a plan view of a washing device in a thirteenth embodiment.
Figure 35:
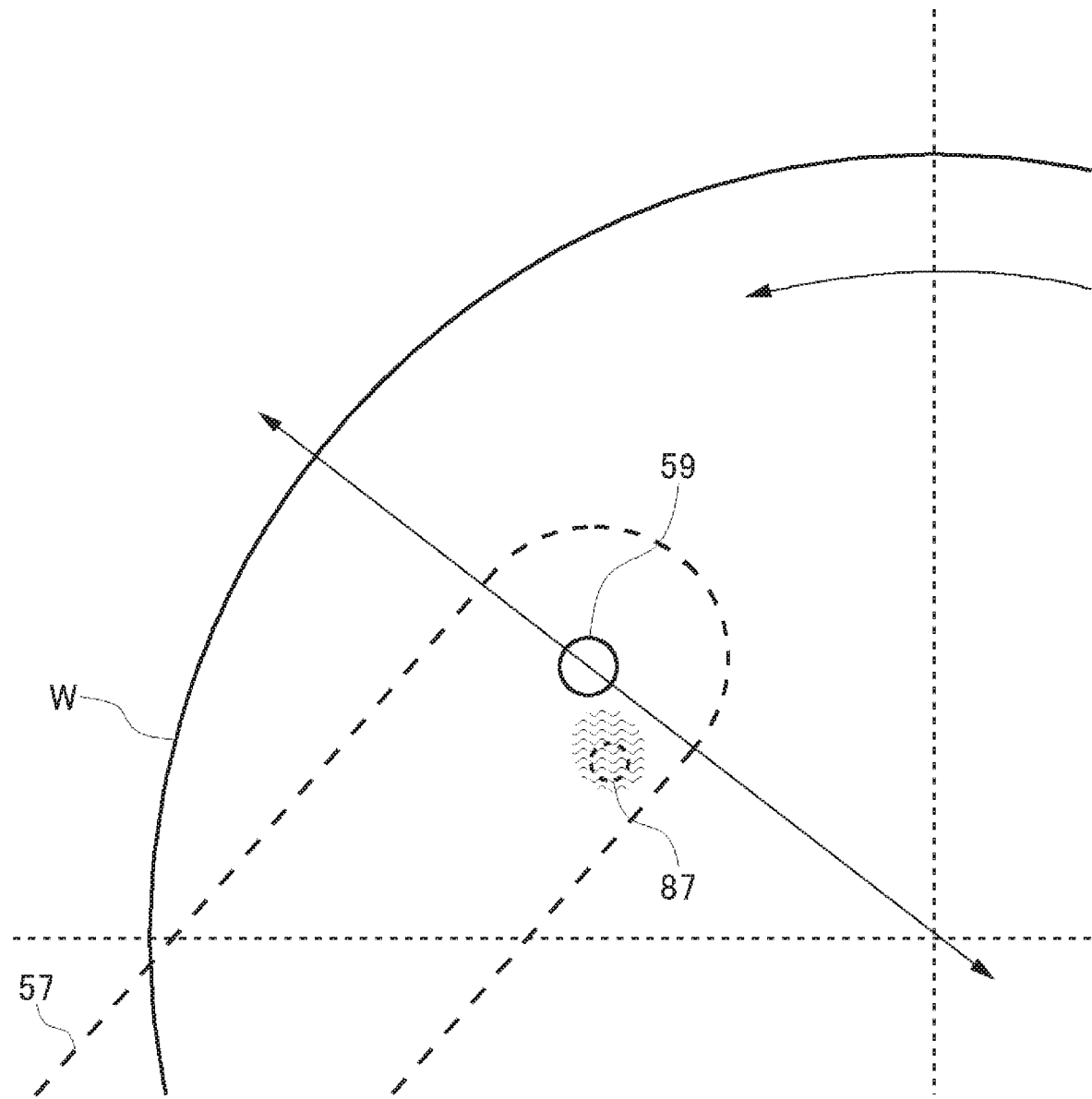
FIG. 35 is a partially enlarged view of the washing device in the thirteenth embodiment.
Figure 36:
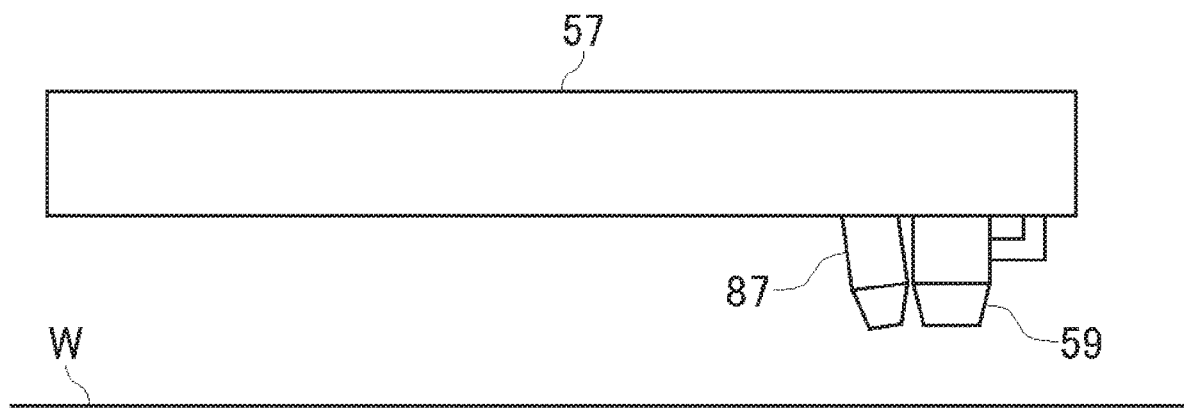
FIG. 36 is a diagram in which the longitudinal direction of the arm of the washing device in the thirteenth embodiment is viewed from the side.

FIG. 34 is a plan view of a washing device in a thirteenth embodiment, FIG. 35 is a partially enlarged view of FIG. 34, and FIG. 36 is a diagram in which the longitudinal direction of the arm 57 is viewed from the side. In the washing device of this embodiment, similarly to the twelfth embodiment, the 2FJ nozzle 59 is also provided at the leading end portion of the arm 57. Also, in this embodiment, similarly to twelfth embodiment, the arm 57 is also provided with an on-arm spray nozzle 87 which sprays the chemical liquid as the washing liquid.

Also, on the outer side of the substrate W, the single tube nozzle 81 which discharges the rinse liquid as the washing liquid is provided. Similarly to the above-mentioned embodiments, the single tube nozzle 81 discharges the rinse liquid so that the rinse liquid lands in front of the center of the substrate W and the landed rinse liquid flows toward the center of the substrate W.

As clearly illustrated in FIG. 35, the spray nozzle 87 is provided in the vicinity of the 2FJ nozzle 59, and is provided to be closer to the center of the substrate W than the 2FJ nozzle 59 and on the downstream side in the rotational direction of the substrate W than the 2FJ nozzle 59. The spray nozzle 87 is a cone spray nozzle which sprays the chemical liquid in a conical shape. The chemical liquid injected from the spray nozzle 87 lands (contacts) on the downstream side of the rotation of the substrate W with respect to the position just below the 2FJ nozzle 59.

As illustrated in FIG. 36, the spray nozzle 87 is provided to be slightly inclined toward the 2FJ nozzle 59. As mentioned above, since the spray nozzle 87 is provided on the central side of the substrate W with respect to the 2FJ nozzle 59 and on the downstream side of the rotation of the substrate W, the chemical liquid is sprayed from the spray nozzle 87 toward the outer side of the substrate W and the upstream side of the rotation of the substrate W.

By providing the spray nozzle 87 near the 2FJ nozzle 59 to supply the chemical liquid, even when using the ultrapure water (DIW) as the liquid to be injected with gas from the 2FJ nozzle 59, similarly to the twelfth embodiment, it is possible to reduce or prevent the charging of the substrate W. In this embodiment, by further providing the spray nozzle 87 on the downstream side in the rotational direction of the substrate W than the 2FJ nozzles 59, the following advantageous effects are obtained.

As mentioned above, the spray nozzle 87 is provided in the vicinity of the 2FJ nozzle 59, and the chemical liquid is supplied from the spray nozzle 87 to the vicinity of the washing location at which the jet flow of gas and liquid injected from the 2FJ nozzle 59 collides with the upper surface of the substrate W. However, when the layer of the chemical liquid supplied from the spray nozzle 87 is too thick at the washing location, the layer of the chemical liquid becomes a cushion, and the washing of the upper surface of the substrate W by the jet flow becomes insufficient.

Therefore, in this embodiment, the liquid-landing area by the spray nozzle 87 is disposed on the downstream side in the rotational direction of the substrate W than the washing location by the jet flow of the 2FJ nozzle 59. Thus, the chemical liquid supplied to the upper surface of the substrate W from the spray nozzle 87 is conveyed in a direction away from the washing location by the rotation of the substrate W. Thus, it is possible to reduce or avoid the insufficient washing due to the cushion effect of the layer of the chemical liquid, without the layer of the chemical liquid becoming too thick at the washing location.

Also, even in this embodiment, similarly to the twelfth embodiment, since the spray nozzle 87 is inclined outward in the radial direction of the substrate W, the chemical liquid sprayed from the spray nozzle 87 can be smoothly discharged toward the outer edge of the substrate W by the centrifugal force due to rotation of the substrate W. In addition, in the twelfth and thirteenth embodiments, although the arm 57 is provided with the on-arm spray nozzle 86 or 87 which sprays the chemical liquid as a washing liquid, the single tube nozzle which supplies the chemical liquid in place of the spray nozzle may be provided.

Figure 37:
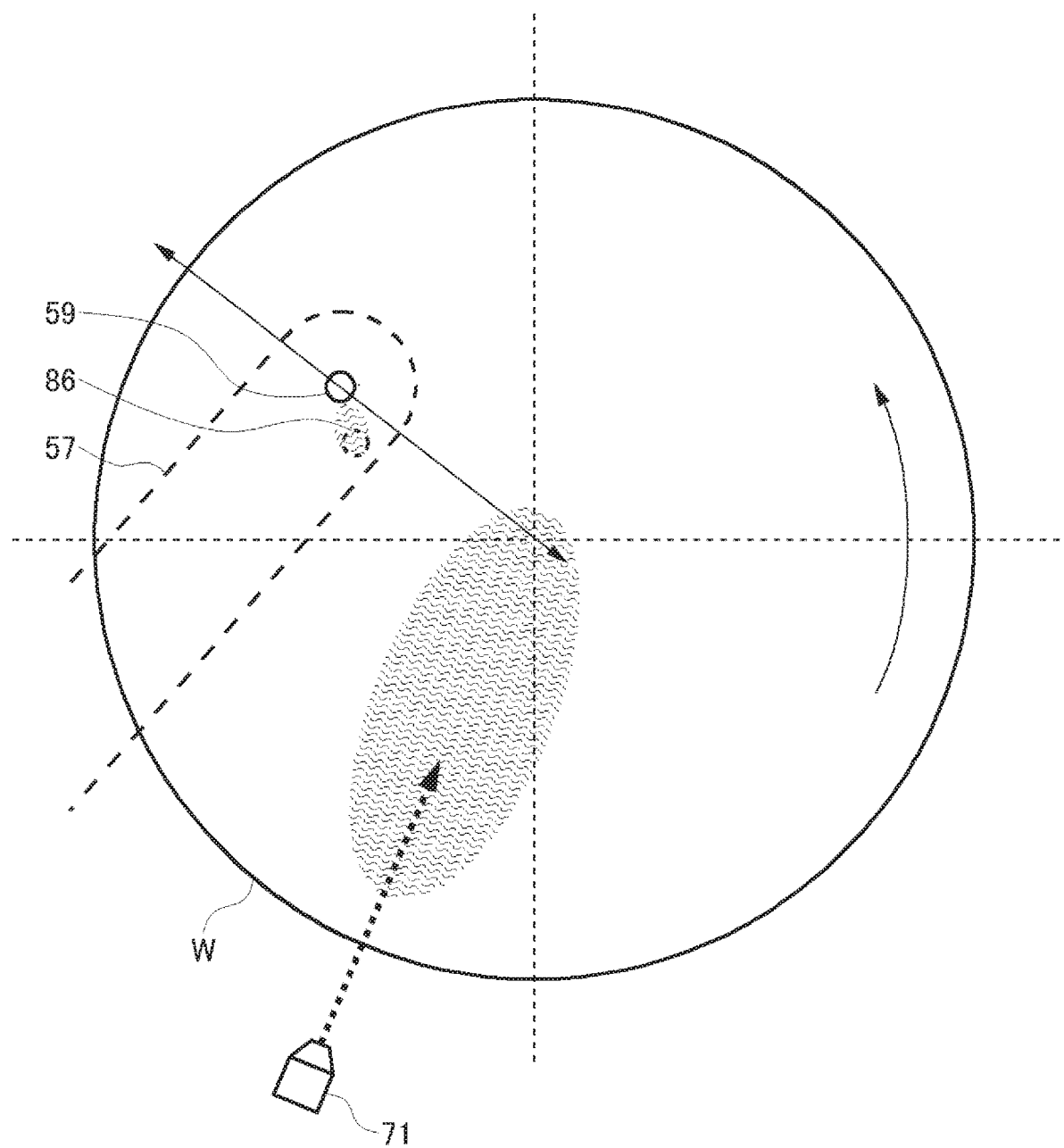
FIG. 37 is a plan view of a washing device in a modified example of the thirteenth embodiment.

FIG. 37 is a plan view of a washing device in a modified example of the thirteenth embodiment. In this modified example, a spray nozzle 71 rather than a single tube nozzle is provided outside the substrate W. The spray nozzle 71 is provided to spray the rinse liquid toward the center of the substrate W so that the liquid-landing area is applied to the center from the front of the center of the substrate W and the landed rinse liquid flows toward the center of the substrate W. Other configurations are the same as those of the above embodiments.

Also, even in this embodiment, similarly to the twelfth embodiment, when the liquid injected from the 2FJ nozzle 59 reaches the center of the substrate W, apart from the on-arm spray nozzle 87, a washing liquid supply nozzle may not be provided outside the substrate W.

Fourteenth Embodiment

Figure 38:
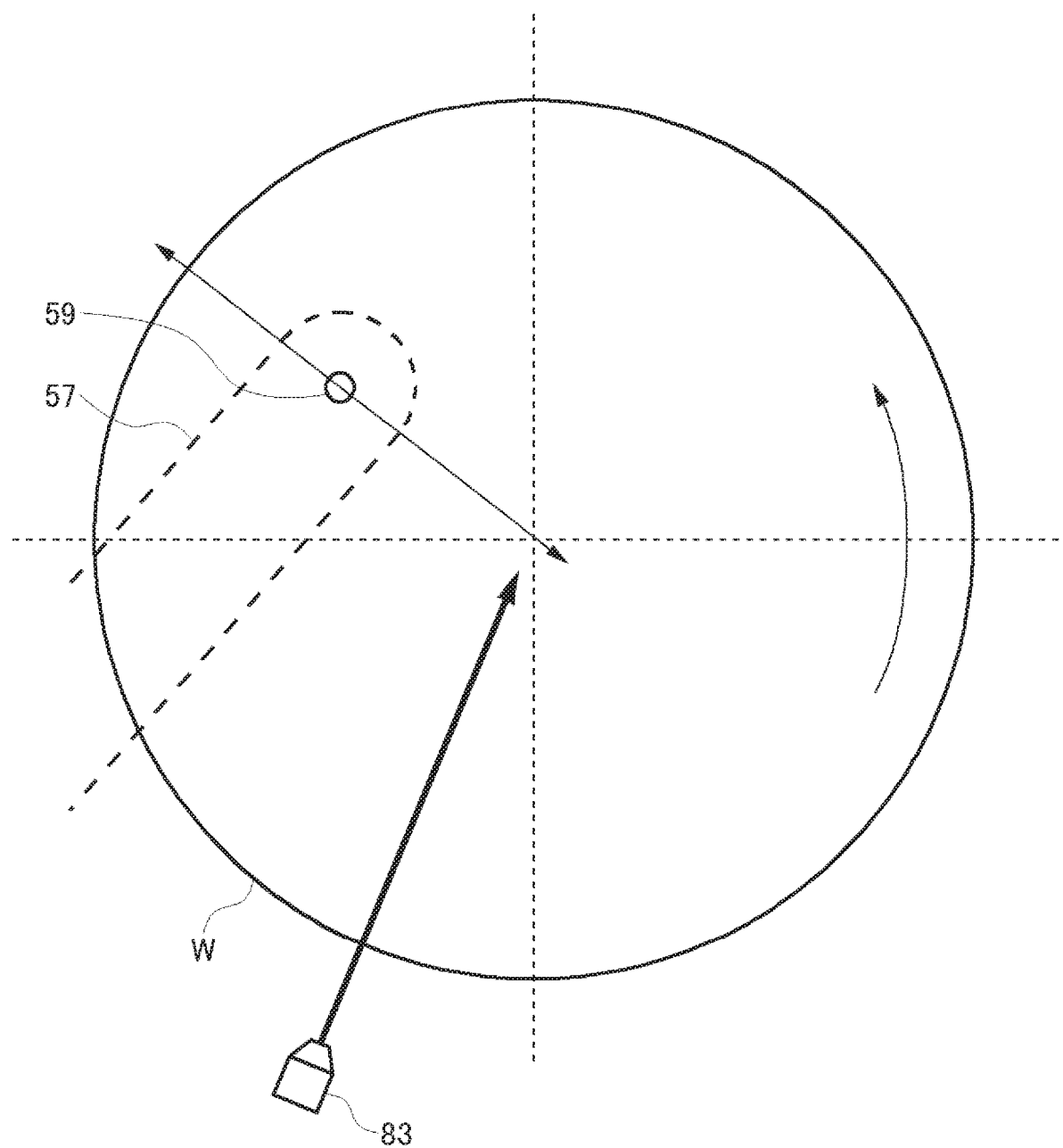
FIG. 38 is a plan view of a washing device in a fourteenth embodiment.

FIG. 38 is a plan view of a washing device in a fourteenth embodiment. In the washing device of the present embodiment, although the 2FJ nozzle 59 is provided at the leading end portion of the arm 57, the on-arm washing nozzle is not provided. On the outer side of the substrate W, a single tube nozzle 83 which discharges the chemical liquid as the washing liquid is provided. Similarly to the above-mentioned embodiments, the single tube nozzle 83 discharges the chemical liquid so that the chemical liquid lands in front of the center of the substrate W and the landed chemical liquid flows toward the center of the substrate W. Thus, the liquid flow of the chemical liquid is formed in the vicinity of the center of the substrate W, and the chemical liquid does not stagnate in the vicinity of the center of the substrate W.

Figure 39:
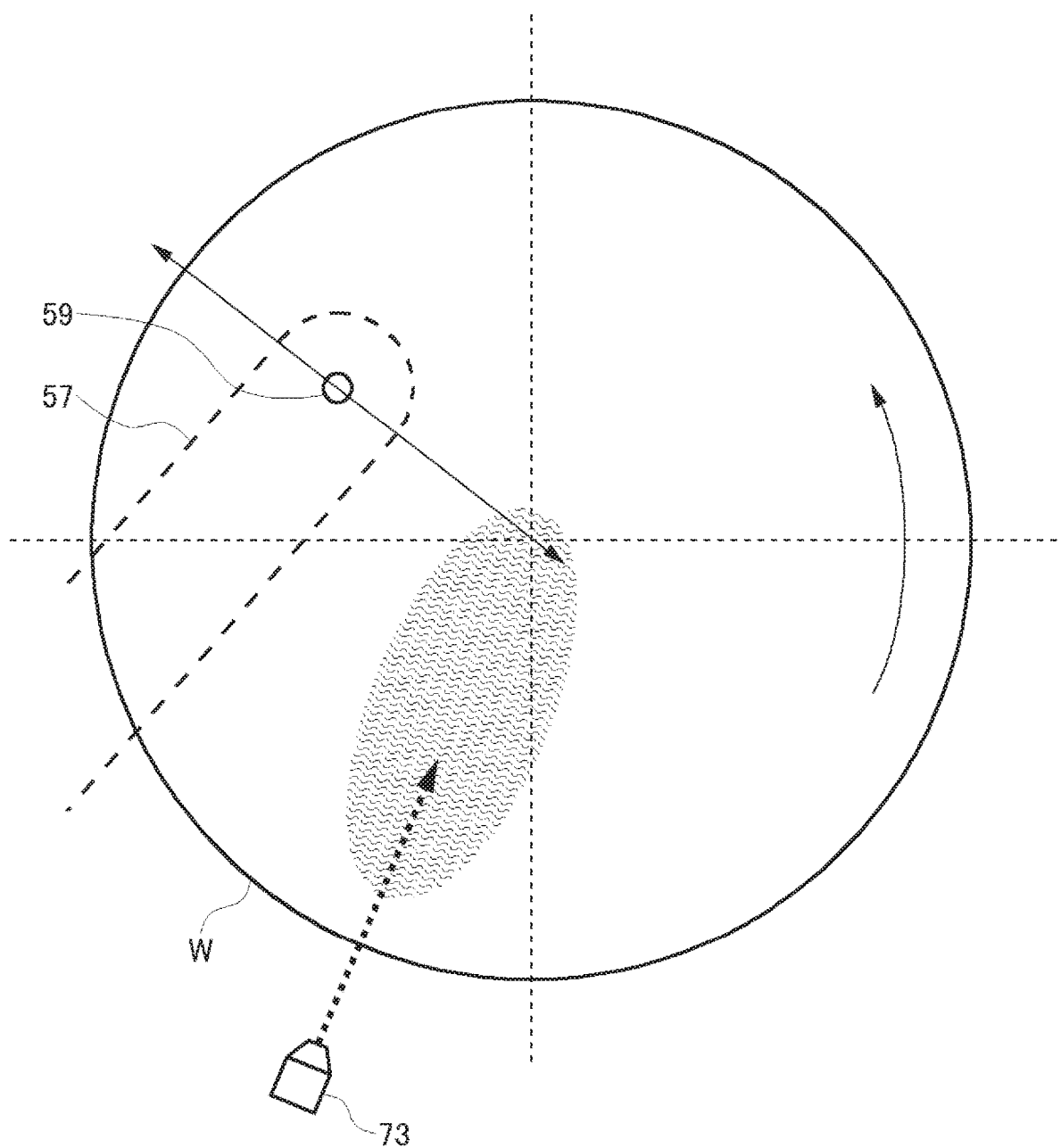
FIG. 39 is a plan view of a washing device in a modified example of the fourteenth embodiment.

FIG. 39 is a plan view of a washing device in a modified example of the fourteenth embodiment. In this modified example, instead of the single tube nozzle 83, the spray nozzle 73 is used which sprays the chemical liquid as the washing liquid. The spray nozzle 73 is provided to spray the chemical liquid toward the center of the substrate W so that the liquid-landing area is applied to the center from the front of the center of the substrate W and the landed chemical liquid flows toward the center of the substrate W. Even when using such a spray nozzle 73, the chemical liquid is prevented from stagnating in the vicinity of the center of the substrate W.

Fifteenth Embodiment

Figure 40:
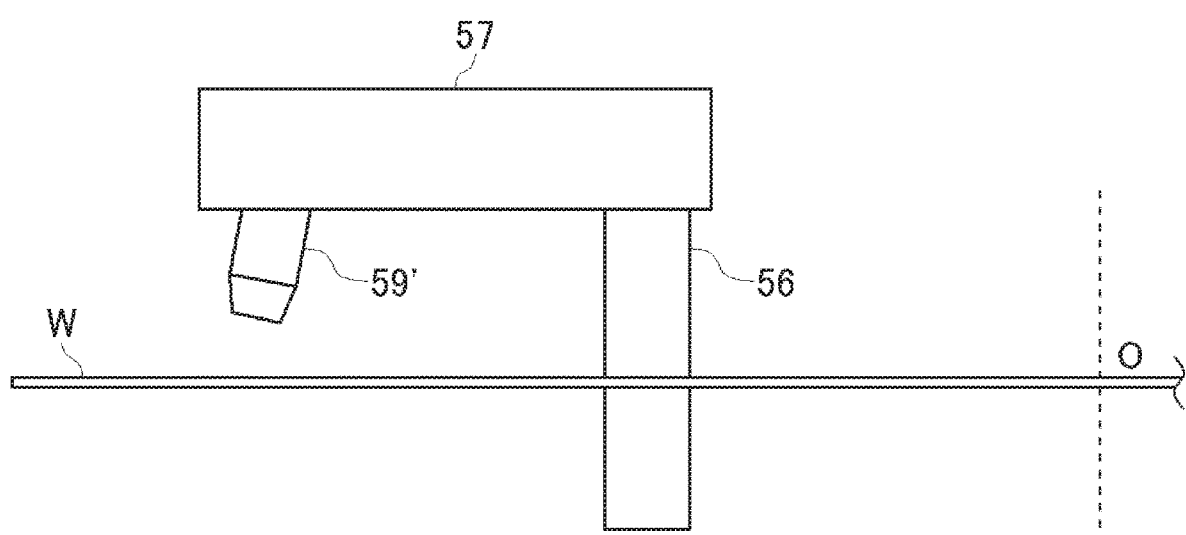
FIG. 40 is a side view of a washing device in a fifteenth embodiment.

FIG. 40 is a side view of a washing device in a fifteenth embodiment. In the present embodiment, a 2FJ nozzle 59' is also provided on the other end side (leading end portion) of the arm 57, one end of which is rotatably supported on the column 56. The 2FJ nozzle 59' is provided to be inclined outward in the radial direction of the substrate W rather than being directed in the vertical direction similarly to the above-mentioned embodiments.

According to the washing device of this embodiment, since the liquid contained in the jet flow collides with the substrate W with the radially outward flow of the substrate W, the liquid after collision with the upper surface of the substrate W flows towards the outer edge of the substrate W, is also combined with the centrifugal force due to rotation of the substrate W, and is smoothly discharged from the outer edge of the substrate W.

In addition, similarly to the twelfth and thirteenth embodiments, together with the 2FJ nozzle 59' having the above-mentioned configuration, an on-arm washing nozzle may be provided. In addition, in the above, the description has given of a case where, when using the 2FJ nozzle and providing the on-arm washing nozzle, there is no need to provide a nozzle which supplies the washing liquid toward the center of the substrate W from the outside of the substrate W. However, as in this embodiment, when the 2FJ nozzle 59' is inclined outward in the radial direction of the substrate W, since the flow of the liquid injected from the 2FJ nozzle 59' toward the center of the substrate W weakens, similarly to the above-described embodiments, it is desirable to provide one or more of the single tube nozzle 81 and/or the spray nozzle 71 on the outer side of the substrate W.

Sixteenth Embodiment

Figure 41:
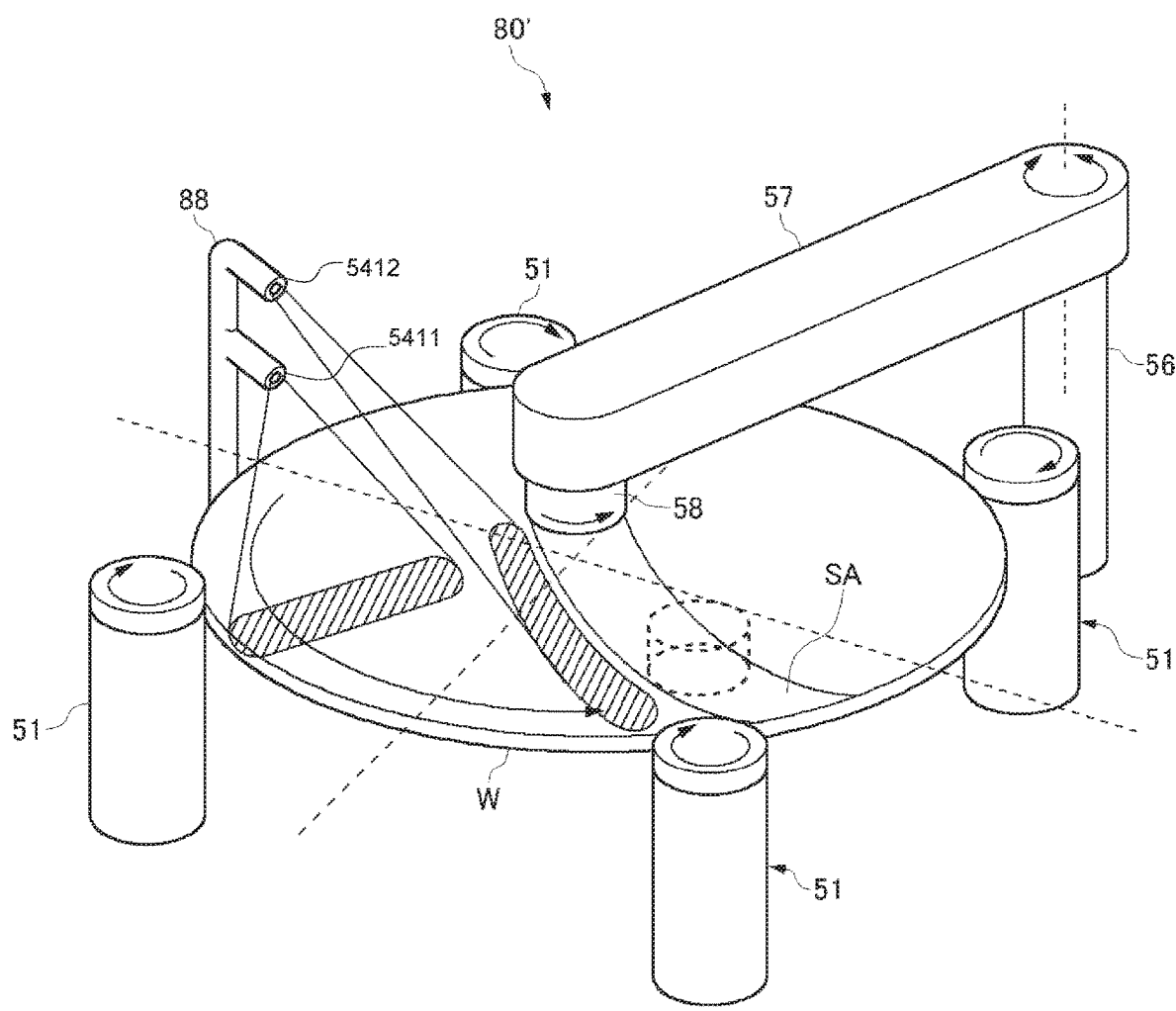
FIG. 41 is a perspective view of a washing device of a sixteenth embodiment.

FIG. 41 is a perspective view of a washing device of a sixteenth embodiment. Similarly to the pencil washing device 80 described above with reference to FIG. 24, a pencil washing device 80' of this embodiment includes four spindles 51 as substrate rotation mechanisms, a column 56 which is movable up and down and vertically extends, an arm 57 which is rotatably attached to the leading end portion of the column 56 at one end and horizontally extends, and a cylindrical pencil washing member 58 which is rotatably mounted on the lower surface of the other end of the arm 57.

In the pencil washing device 80' of this embodiment, a washing liquid supply nozzle 88 is disposed which is located above the substrate W rotated by being supported on the spindles 51 to supply the washing liquid to the surface of the substrate W. However, the washing liquid supply nozzle 88 has upper and lower supply ports of two stages. The washing liquid supply nozzle 88 of this embodiment is a spray nozzle in which both two supply ports 5411 and 5412 spray the washing liquid in a fan shape.

As illustrated in FIG. 41, the washing liquid supplied from the upper supply port 5412 lands on the upstream side of the scan area SA along the scan area SA of the pencil washing member 58. The washing liquid supplied from the lower supply port 5411 lands on the upstream side of the liquid-landing area of the upper supply port 5412 and in a region extending in a radial direction of the substrate W. The liquid-landing area of the lower supply port 5411 reaches the periphery of the substrate W, without reaching the center of the substrate W.

In some embodiments, although an example in which the two washing liquid supply nozzles are provided adjacent to each other has been described, when providing the two washing liquid supply nozzles adjacent to each other as in this example, washing liquid each readily interfere with each other prior to landing on the upper surface of the substrate W, and it is not easy to perform the adjustment for avoiding the interference. In contrast, by using one washing liquid supply nozzle having the upper and lower supply ports of two stages as in this embodiment, it is possible to avoid the difficulty of such adjustment and to supply the washing liquid to the upper surface of the substrate W from the two locations so as not to interfere with each other.

In this embodiment, both the two supply ports 5411 and 5412 of the washing liquid supply nozzle 88 function as a spray nozzle which sprays the washing liquid in a fan shape, but not limited thereto, and one may be a single tube nozzle, the other may be a spray nozzle, and both may be a single tube nozzle. Although both the on-arm washing liquid supply nozzles are provided on the lower surface of the arm 57, the on-arm washing liquid supply nozzles may be externally attached to the lateral surface of the arm or the surface of the leading end side. Also, the washing liquid supply nozzle 88 may be another stage nozzle of three or more stages having three or more supply ports. Also, the same washing liquid may be each supplied from the plurality of the supply ports of the washing liquid supply nozzle 88, and the different types of liquid (for example, chemical liquid and rinse liquid) from each other may be supplied.

Further, in the first to sixteenth embodiments, although the washing device configured to perform washing in the CMP process has been described, the washing device is also applied to, for example, a manufacturing process of a flat panel, a manufacturing process of an image sensor such as CMOS or CCD, and a manufacturing process of an MRAM magnetic film.

Furthermore, in the first to sixteenth embodiments, although the substrate W rotates by being horizontally held, but, not limited thereto, in the washing device, the substrate may be rotated while the surface of the substrate W is inclined from the horizontal direction. Further, the substrate rotation mechanism is not also limited to that of a plurality of spindles, and may have a configuration in which a plurality of chuck members for holding the outer circumferential portion of the substrate is included and the chuck members rotate about the central axis of the substrate as the rotary axis, and may have a configuration in which a holding table for placing the substrate W is included and the holding table rotates about the central axis of the substrate as the rotary axis.

What is claimed is:

1. A substrate processing apparatus comprising:
   a polishing unit configured to polish a substrate;
   a first washing unit and a second washing unit configured to wash the polished substrate;
   a drying unit configured to dry the washed substrate;
   a control unit configured to control the polishing unit, the first washing unit, the second washing unit and the drying unit; and
   a housing inside which the polishing unit, the first washing unit, the second washing unit and the drying unit are housed, wherein
   the first washing unit includes a substrate washing device including:
      a substrate rotation mechanism configured to hold the substrate and to rotate the substrate about a central axis of the substrate as a rotary axis;
      a roll washing member configured to linearly extend over substantially the entire length of the diameter of the substrate and to come into slide-contact with the first surface of the substrate, while rotating about a central axis parallel to the substrate;
      a first single tube nozzle configured to discharge a first washing liquid from an area above the substrate held by the substrate rotation mechanism and on a roll winding side of the roll washing member so that the first washing liquid lands in front of the center of the substrate and on a roll winding side area of the roll washing member and the landed first washing liquid flows on the first surface of the substrate toward the center of the substrate; and
      a spray nozzle configured to discharge a second washing liquid toward a second area when a roll winding side area of the first surface of the substrate is divided into two areas, a first area being the side rotated in the opposite direction to the rotational direction of the substrate and the second area being the side rotated in the forward direction to the rotational direction of the substrate, based on a straight line orthogonal to the rotational axis of the roll washing member passing through the center of the substrate in a plan view, and
   the control unit is configured control the first washing unit to
   scrub and wash the substrate by bringing the roll washing member into contact with the substrate while supplying the first washing liquid from the single tube nozzle and the second washing liquid from the spray nozzle, respectively, onto the substrate, and
   rinse and wash the substrate using the first single tube nozzle with the roll washing member completely excluded from above the substrate horizontally rotated.

2. The substrate processing apparatus according to claim 1, wherein an angle formed between a discharge direction of the first single tube nozzle and an extension direction of the roll washing member is 90°±30° in a plan view.

3. The substrate processing apparatus according to claim 1, further comprising:
   a nozzle configured to supply washing liquid directly to a surface of the roll washing member located in a roll scraping side area of the roll washing member.

4. The substrate processing apparatus according to claim 2, further comprising:
   a nozzle configured to supply washing liquid directly to a surface of the roll washing member located in a roll scraping side area of the roll washing member.

* * * * *